United States Patent
Jeong et al.

(10) Patent No.: US 9,887,354 B2
(45) Date of Patent: Feb. 6, 2018

(54) MEMORY DEVICE AND METHOD OF MANUFACTURING THE SAME

(71) Applicant: SAMSUNG ELECTRONICS CO., LTD., Suwon-si, Gyeonggi-do (KR)

(72) Inventors: Ji-Hyun Jeong, Hwaseong-si (KR); Jin-Woo Lee, Seoul (KR); Gwan-Hyeob Koh, Seoul (KR); Dae-Hwan Kang, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/296,423

(22) Filed: Oct. 18, 2016

(65) Prior Publication Data

US 2017/0244031 A1    Aug. 24, 2017

(30) Foreign Application Priority Data

Feb. 22, 2016  (KR) .................. 10-2016-0020696

(51) Int. Cl.
  *H01L 45/00* (2006.01)
  *H01L 27/24* (2006.01)

(52) U.S. Cl.
  CPC ........ *H01L 45/144* (2013.01); *H01L 27/2463* (2013.01); *H01L 45/126* (2013.01); *H01L 45/16* (2013.01)

(58) Field of Classification Search
  CPC .................................................. H01L 45/144
  USPC .......................................................... 257/4
  See application file for complete search history.

(56) References Cited

U.S. PATENT DOCUMENTS

| 7,709,822 | B2 | 5/2010 | Karpov et al. |
| 7,906,773 | B2 | 3/2011 | Ko et al. |
| 8,000,129 | B2 | 8/2011 | Shepard |
| 8,349,636 | B2 | 1/2013 | Lee et al. |
| 9,136,307 | B2 | 9/2015 | Pellizzer |
| 2010/0227449 | A1* | 9/2010 | Kim ............... H01L 27/1021 438/382 |
| 2012/0009731 | A1 | 1/2012 | Lee et al. |
| 2013/0193402 | A1 | 8/2013 | Ryu |
| 2013/0240820 | A1 | 9/2013 | Shin et al. |
| 2015/0029775 | A1* | 1/2015 | Ravasio ............. H01L 45/1666 365/63 |
| 2015/0137061 | A1 | 5/2015 | Donghi et al. |
| 2015/0243885 | A1 | 8/2015 | Sciarrillo |
| 2015/0280118 | A1 | 10/2015 | Lee et al. |
| 2015/0325787 | A1 | 11/2015 | Ahn et al. |

FOREIGN PATENT DOCUMENTS

KR    1020110045167    5/2011

* cited by examiner

*Primary Examiner* — Marc Armand
*Assistant Examiner* — Warren H Kilpatrick
(74) *Attorney, Agent, or Firm* — F. Chau & Associates, LLC

(57) ABSTRACT

Provided are a memory device and a method of manufacturing the same. Memory cells of the memory device are formed separately from first electrode lines and second electrode lines, wherein the second electrode lines over the memory cells are formed by a damascene process, thereby avoiding complications associated with CMP being excessively or insufficiently performed on an insulation layer over the memory cells.

19 Claims, 51 Drawing Sheets

MEMORY DEVICE AND METHOD OF MANUFACTURING THE SAME

CROSS-REFERENCE TO RELATED APPLICATION

This application claims the benefit under 35 U.S.C. §119 of Korean Patent Application No. 10-2016-0020696, filed on Feb. 22, 2016, in the Korean Intellectual Property Office, the disclosure of which is incorporated by reference herein in its entirety.

TECHNICAL FIELD

The inventive concept relates to a memory device and a method of manufacturing the same, and more particularly, to a memory device having a cross-point stacked structure and a method of manufacturing the same.

DISCUSSION OF RELATED ART

With the lightening, thinning, shortening and miniaturizing trend of electronic products, there is a growing demand for highly-integrated semiconductor devices. To meet this demand, memory devices having a three-dimensional (3D) cross-point stacked structure in which a memory cell is disposed at a cross point between two electrodes crossing each other have been proposed. In addition, to meet the continuous requirement of down-scaling the memory devices having a cross-point stacked structure, sizes of all layers configured for each of the memory devices may have to be reduced. However, due to the miniaturization of the memory devices, various defects may occur in the process of manufacturing the memory devices, and the resulting defects may degrade the reliability of the memory devices and may reduce productivity.

SUMMARY

Embodiments of the inventive concept provides a memory device and a method of manufacturing the same, in which a defect caused by a process of patterning a memory cell is minimized, thereby enhancing the reliability of the memory device.

According to an aspect of the inventive concept, there is provided a memory device that includes a first electrode line layer disposed over a substrate, the first electrode line layer including a plurality of first electrode lines that extend in a first direction and are spaced apart from each other, a second electrode line layer disposed over the first electrode line layer, the second electrode line layer including a plurality of second electrode lines that extend in a second direction different from the first direction and are spaced apart from each other, and a first memory cell layer disposed between the first electrode line layer and the second electrode line layer, the first memory cell layer including a plurality of first memory cells respectively disposed in portions located where the plurality of first electrode lines intersect the plurality of second electrode lines, wherein the plurality of first memory cells each include a selection device layer, a middle electrode layer, and a variable resistance layer which are stacked in an up or down direction, a first insulation layer extending in the first direction is disposed between adjacent first electrode lines, a second insulation layer is disposed between adjacent first memory cells, a third insulation layer extending in the second direction is disposed between adjacent second electrode lines, and a top of the second insulation layer includes a recessed portion between adjacent second electrode lines.

According to another aspect of the inventive concept, there is provided a memory device that includes a first electrode line layer disposed over a substrate, the first electrode line layer including a plurality of first electrode lines that extend in a first direction and are spaced apart from each other, a second electrode line layer disposed over the first electrode line layer, the second electrode line layer including a plurality of second electrode lines that extend in a second direction different from the first direction and are spaced apart from each other, and a first memory cell layer disposed between the first electrode line layer and the second electrode line layer, the first memory cell layer including a plurality of first memory cells respectively disposed in portions located where the plurality of first electrode lines and the plurality of second electrode lines intersect, wherein the plurality of first memory cells each includes a selection device layer, a middle electrode layer, and a variable resistance layer which are stacked in an up or down direction, one of the selection device layer and the variable resistance layer is widened progressively from a lower portion to an upper portion, a cell insulation layer dividing unit memory cells is disposed between adjacent first memory cells, and a top insulation layer extending in the second direction is disposed between adjacent second electrode lines, and a top of the cell insulation layer includes a recessed portion between the adjacent second electrode lines.

According to still another aspect of the inventive concept, there is provided a method of manufacturing a memory device that includes forming a first electrode line layer over a substrate, the first electrode line layer including a plurality of first electrode lines that extend in a first direction and are spaced apart from each other in a second direction different from the first direction, and a first insulation layer being disposed between adjacent first electrode lines, forming a first stacked structure over the first electrode line layer and the first insulation layer, the first stacked structure including a preliminary selection device layer, a preliminary middle electrode layer, and a preliminary variable resistance layer in an up or down direction, patterning the first stacked structure to form a first memory cell layer over the plurality of first electrode lines, the first memory cell layer including a plurality of first memory cells which are spaced apart from each other in the first direction and the second direction, forming a second insulation layer which fills gaps between adjacent first memory cells and covers tops of the plurality of first memory cells, forming a third insulation layer over the second insulation layer and patterning the third insulation layer to form a plurality of trenches which extend in the second direction, are spaced apart from each other in the first direction, and respectively expose the tops of the plurality of first memory cells, and filling the plurality of trenches with a conductive material to form a second electrode line layer including a plurality of second electrode lines which extend in the second direction and are spaced apart from each other in the first direction, wherein the plurality of first memory cells are respectively disposed in portions located where the plurality of first electrode lines intersect the plurality of second electrode lines.

According to still another aspect of the inventive concept, there is provided a method of manufacturing a memory device that includes forming a first electrode line layer over a substrate, the first electrode line layer including a plurality of first electrode lines that extend in a first direction and are spaced apart from each other in a second direction different from the first direction, and a bottom insulation layer being disposed between adjacent first electrode lines, forming a first memory cell layer including a plurality of first memory cells which are disposed over the plurality of first electrode lines and each include a selection device layer, a middle electrode layer, and a variable resistance layer which are stacked in an up or down direction, forming a cell insulation layer which fills gaps between adjacent first memory cells and covers tops of the plurality of first memory cells, forming a top insulation layer over the cell insulation layer and patterning the top insulation layer to form a plurality of trenches which extend in the second direction, are spaced apart from each other in the first direction, and respectively expose the tops of the plurality of first memory cells, and filling the plurality of trenches with a conductive material to form a second electrode line layer including a plurality of second electrode lines which extend in the second direction and are spaced apart from each other in the first direction, wherein the plurality of first memory cells are respectively disposed in portions located where the plurality of first electrode lines intersect the plurality of second electrode lines, and one of the selection device layer and the variable resistance layer is formed through a damascene process.

According to still another aspect of the inventive concept, there is provided a memory device that includes a first electrode line layer provided on a substrate, the first electrode line layer including a plurality of first electrode lines which extend in a first direction and are spaced apart from each other, a second electrode line layer provided on the first electrode line layer, the second electrode line layer including a plurality of second electrode lines which extend in a second direction different from the first direction and are spaced apart from each other, a third electrode line layer provided on the second electrode line layer, the third electrode line layer including a plurality of third electrode lines which extend in the first direction and are spaced apart from each other, a first memory cell layer including a plurality of first memory cells respectively disposed in portions located between the first electrode line layer and the second electrode line layer, and where the plurality of first electrode lines and the plurality of second electrode lines intersect, and a second memory cell layer including a plurality of second memory cells respectively disposed in portions located between the second electrode line layer and the third electrode line layer, and where the plurality of second electrode lines and the plurality of third electrode lines intersect, wherein a width of an upper portion is larger than a width of a lower portion for each of the plurality of second electrode lines and each of the plurality of third electrode lines, respectively.

BRIEF DESCRIPTION OF THE DRAWINGS

Exemplary embodiments of the inventive concept will be more clearly understood from the following detailed description taken in conjunction with the accompanying drawings in which.

Figure 1:
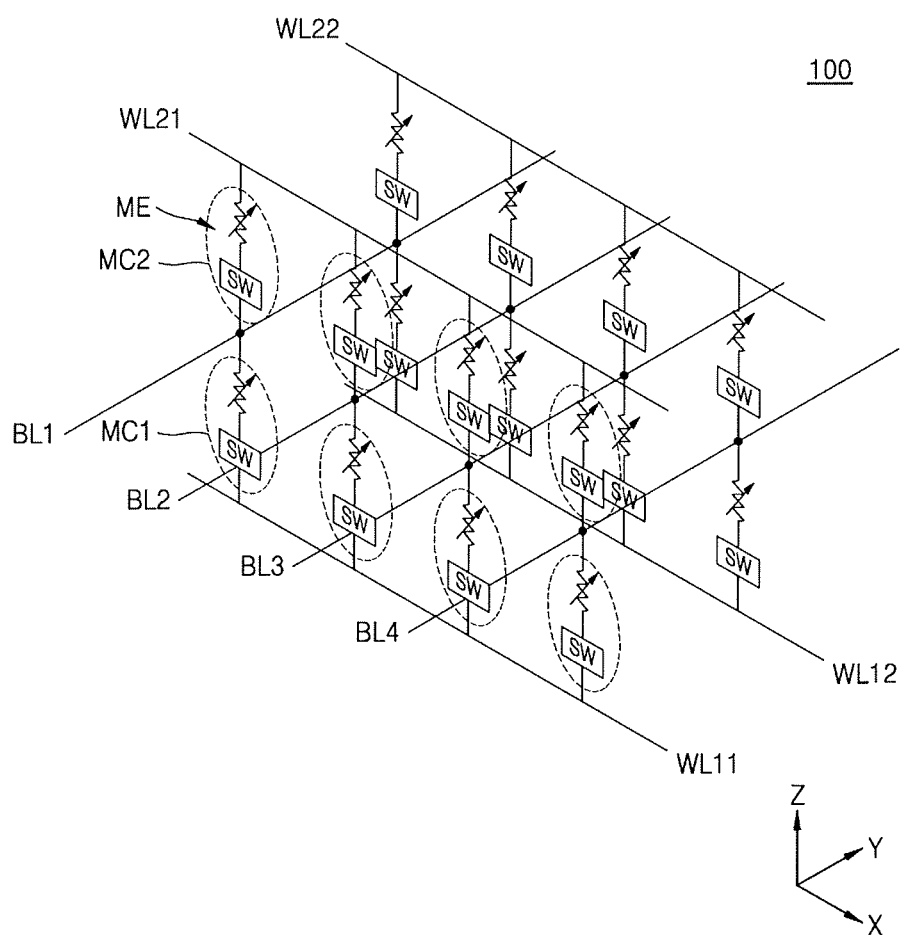
FIG. 1 is an equivalent circuit diagram of a memory device according to an exemplary embodiment of the inventive concept.

Since the drawings in FIGS. 1-25 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

FIG. 1 is an equivalent circuit diagram of a memory device 100 according to an exemplary embodiment of the inventive concept.

Referring to FIG. 1, the memory device 100 may include a plurality of bottom word lines WL11 and WL12, which extend along a first direction (an X direction) and are spaced apart from each other in a second direction (a Y direction) perpendicular to the first direction, and a plurality of top word lines WL21 and WL22 that are spaced apart from each other in the second direction, are spaced apart from the bottom word lines WL11 and WL12 in a third direction (a Z direction) perpendicular to the first direction and the second direction, and extend along the first direction. Also, the memory device 100 may include a plurality of common bit lines BL1 to BL4 that are spaced apart from the top word lines WL21 and WL22 and the bottom word lines WL11 and WL12 in the third direction and extend along the second direction.

A first memory cell MC1 and a second memory cell MC2 may be disposed between the common bit lines BL1 to BL4 and the bottom word lines WL11 and WL12 and between the common bit lines BL1 to BL4 and the top word lines WL21 and WL22, respectively. In detail, a plurality of first memory cells MC1 may be respectively disposed at cross points between the common bit lines BL1 to BL4 and the bottom word lines WL11 and WL12, and may each include a variable resistance layer ME for storing information and a selection device layer SW for selecting a memory cell, e.g., selecting the variable resistance layer ME. Also, a plurality of second memory cells MC1 may be respectively disposed at cross points between the common bit lines BL1 to BL4 and the top word lines WL21 and WL22, and may each include a variable resistance layer ME for storing information and a selection device layer SW for selecting a memory cell. Also, the selection device layer SW may be referred to as a switching device layer, isolation device layer, or an access device layer. The selection device layer SW may be used to access the variable resistance layer ME during programming or reading of the variable resistance layer ME.

The first memory cell MC1 and the second memory cell MC2 may have substantially the same structure, and may be disposed along the third direction. For example, in the first memory cell MC1 disposed between the bottom word line WL11 and the common bit line BL1, the selection device layer SW may be electrically connected to the bottom word line WL11, the variable resistance layer ME may be electrically connected to the common bit line BL1, and the variable resistance layer ME and the selection device layer SW may be serially connected to each other. Also, in the second memory cell MC2 disposed between the top word line WL21 and the common bit line BL1, the variable resistance layer ME may be electrically connected to the top word line WL21, the selection device layer SW may be electrically connected to the common bit line BL1, and the variable resistance layer ME and the selection device layer SW may be serially connected to each other.

The technical spirit of the inventive concept is not limited to the above example. In an exemplary embodiment of the inventive concept, unlike illustrated in FIG. 1, in each of the first memory cell MC1 and the second memory cell MC2, the selection device layer SW and the variable resistance layer ME may have their disposed positions switched with each other. Also, the first memory cell MC1 and the second memory cell MC2 may be disposed to form a symmetrical structure with respect to the common bit lines BL1 to BL4 along the third direction. For example, in the first memory cell MC1, the variable resistance layer ME may be connected to the bottom word line WL11 and the selection device layer SW may be connected to the common bit line BL1, and in the second memory cell MC2, the variable resistance layer ME may be connected to the top word line WL21 and the selection device layer SW may be connected to the common bit line BL1, whereby the first memory cell MC1 and the second memory cell MC2 may be disposed symmetrically about the common bit line BL1.

Hereinafter, a method of driving the memory device 100 will be briefly described. For example, a voltage may be applied to the variable resistance layer ME of the first memory cell MC1 or the second memory cell MC2 through the word lines WL11, WL12, WL21 and WL22 and the common bit lines BL1 to BL4, and thus, a current may flow in the variable resistance layer ME. For example, the variable resistance layer ME may include a phase change material (PCM) layer which is reversibly shifted (switched) between a first state and a second state. However, the variable resistance layer ME is not limited thereto. In an exemplary embodiment of the inventive concept, the variable resistance layer ME may include an arbitrary variable resistor whose resistance value varies according to a voltage applied thereto. For example, in the first and second memory cells MC1 and MC2 which are selected, a resistance of the variable resistance layer ME may be reversibly shifted between the first state and the second state according to a voltage applied to the variable resistance layer ME.

Based on a resistance change of the variable resistance layer ME, the first and second memory cells MC1 and MC2 may store digital information such as 0 or 1, and the digital information may be erased from the first and second memory cells MC1 and MC2. For example, data may be written as a high resistance state "0" and a low resistance state "1" in the first and second memory cells MC1 and MC2. Here, writing from the high resistance state "0" to the low resistance state "1" may be referred to as a set operation, and writing from the low resistance state "1" to the high resistance state "0" may be referred to as a reset operation. However, digital data stored in the first and second memory cells MC1 and MC2 according to an exemplary embodiment of the inventive concept are not limited to the high-resistance state "0" and the low-resistance state "1", but various resistance states may be stored in the first and second memory cells MC1 and MC2. For example, by applying voltage of different amplitudes to certain material, the electrical resistance may be switched to multiple values. These multiple resistance values instead of binary resistance states may be used to store data.

Arbitrary memory cells MC1 and MC2 may be addressed by selecting the word lines WL11, WL12, WL21 and WL22 and the common bit lines BL1 to BL4 and may be programmed by applying a certain signal between the word lines WL11, WL12, WL21 and WL22 and the common bit lines BL1 to BL4, and information based on a resistance value of a variable resistance layer ME of each of the arbitrary memory cells MC1 and MC2 may be read out by measuring a current value through the common bit lines BL1 to BL4.

Figure 2:
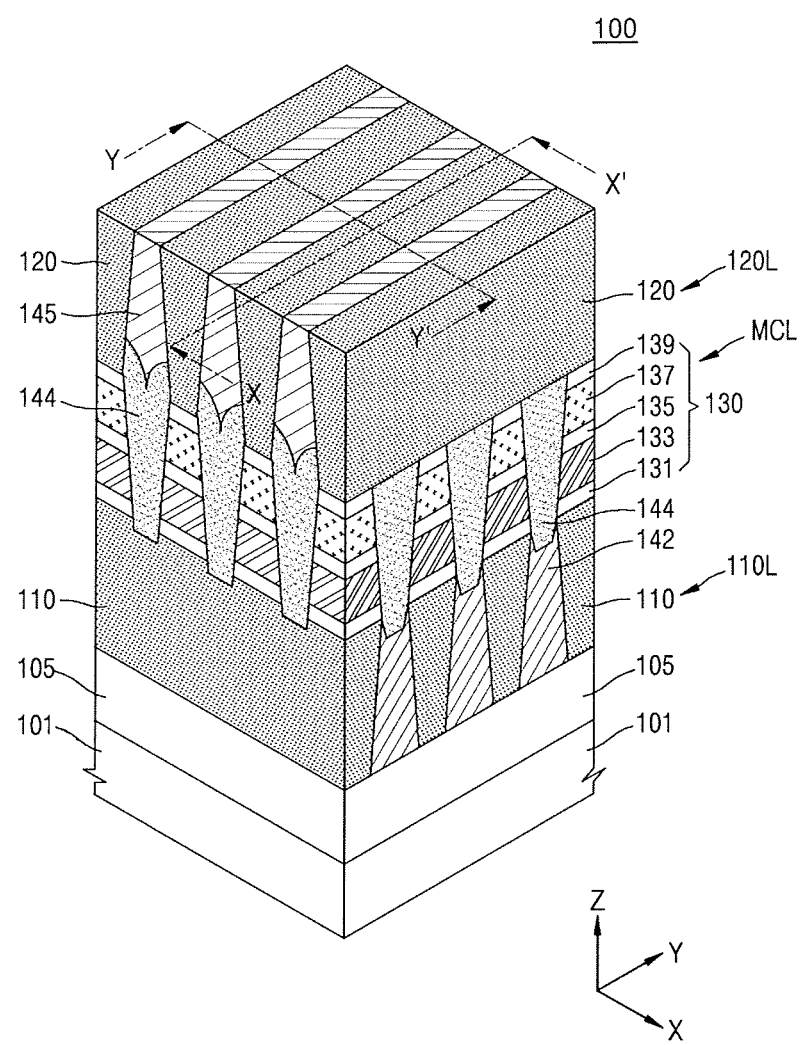
FIG. 2 is a perspective view of a memory device according to an exemplary embodiment of the inventive concept.
Figure 3:
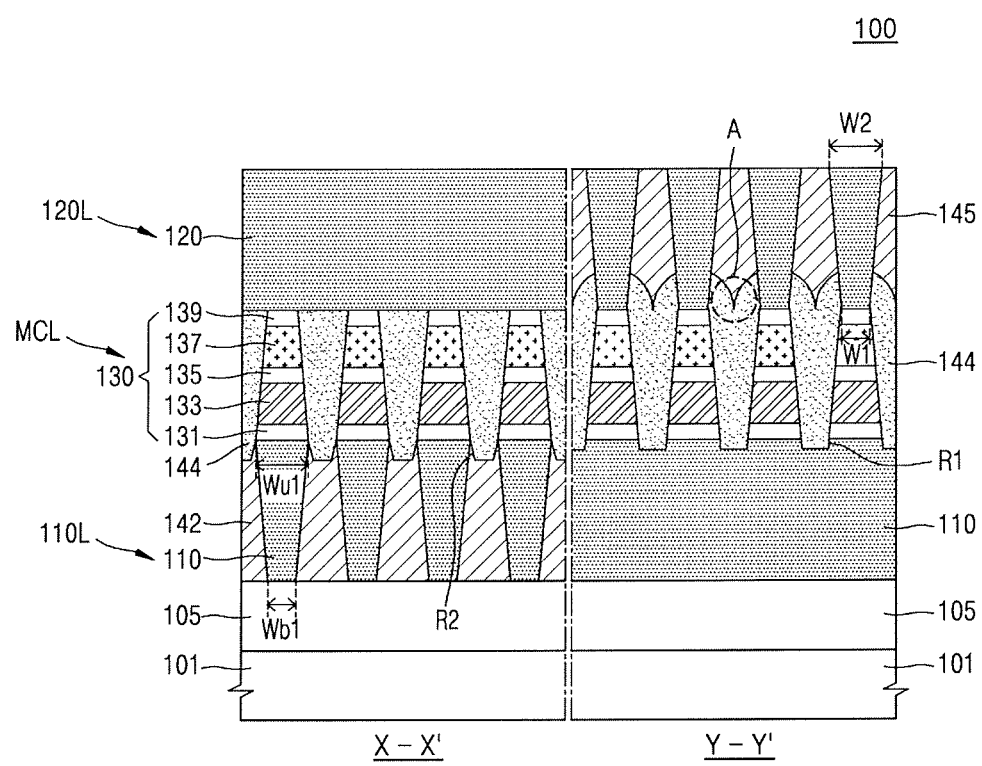
FIG. 3 is a cross-sectional view taken along line X-X' and line Y-Y' of FIG. 2.

FIG. 2 is a perspective view of a memory device 100 according to an exemplary embodiment of the inventive concept, and FIG. 3 is a cross-sectional view taken along line X-X' and line Y-Y' of FIG. 2. FIG. 3 illustrates insulation layers which are slightly enlarged in an X direction and a Y direction and shown in an outer portion.

Referring to FIGS. 2 and 3, the memory device 100 may include a first electrode line layer 110L, a second electrode line layer 120L, and a memory cell layer MCL, which are disposed on a substrate 101.

As illustrated, an interlayer insulation layer 105 may be disposed on the substrate 101. The interlayer insulation layer 105 may include, for example, oxide, such as silicon oxide or the like, or nitride such as silicon nitride or the like. The interlayer insulation layer 105 may electrically separate the first electrode line layer 110L from the substrate 101. In the memory device 100 according to the present embodiment, the interlayer insulation layer 105 may be disposed on the substrate 101, but this is merely an example. For example, in the memory device 100 according to the present embodiment, an integrated circuit layer may be disposed on the substrate 101, and a plurality of memory cells may be disposed on the integrated circuit layer. The integrated circuit layer may include, for example, a peripheral circuit for operations of the memory cells and/or a core circuit for an arithmetic operation and the like. For reference, a structure in which an integrated circuit layer including a peripheral circuit and/or a core circuit is disposed on a substrate and memory cells are disposed on the integrated circuit layer is referred to as a cell-on peri (COP) structure.

The first electrode line layer 110L may include a plurality of first electrode lines 110 that extend in parallel with each other in the first direction (the X direction) and are spaced apart from each other in the second direction (the Y direction) perpendicular to the first direction. The second electrode line layer 120L may include a plurality of second electrode lines 120 that extend in parallel with each other in the second direction (the Y direction) and are spaced apart from each other in the first direction (the X direction). In terms of driving of the memory device 100, the first electrode lines 110 may correspond to word lines, and the second electrode lines 120 may correspond to bit lines. On the other hand, the first electrode lines 110 may correspond to the bit lines, and the second electrode lines 120 may correspond to the word lines.

The first electrode lines 110 and the second electrode lines 120 may each be formed of, for example, metal, conductive metal nitride, conductive metal oxide, or a combination thereof. For example, the first electrode lines 110 and the second electrode lines 120 may each be formed of tungsten (W), tungsten nitride (WN), gold (Au), silver (Ag), copper (Cu), aluminium (Al), titanium aluminum nitride (TiAlN), iridium (Ir), platinum (Pt), palladium (Pd), ruthenium (Ru), zirconium (Zr), rhodium (Rh), nickel (Ni), cobalt (Co), chromium (Cr), tin (Sn), zinc (Zn), indium tin oxide (ITO), an alloy thereof, or a combination thereof. Also, the first electrode lines 110 and the second electrode lines 120 may each include a metal layer and a conductive barrier layer covering at least a portion of the metal layer. The conductive barrier layer may be formed of, for example, titanium (Ti), titanium nitride (TiN), tantalum (Ta), Tantalum nitride (TaN), or a combination thereof.

In the memory device 100 according to the present embodiment, the first electrode lines 110 and the second electrode lines 120 may have a damascene structure. Also, the first electrode lines 110 and the second electrode lines 120 may be formed through a process which differs from a process of forming a plurality of memory cells 130. Since the first electrode lines 110 and the second electrode lines 120 are formed in the damascene structure, as illustrated, the first electrode lines 110 and the second electrode lines 120 may have a structure in which a width is progressively narrowed in a direction toward a lower portion. For example, a lower portion of each of the first electrode lines 110 may have a first lower width Wb1, and an upper portion may have a first upper width Wu1. Also, a lower portion of each of the second electrode lines 120 may have a first width W1, and an upper portion may have a second width W2. As illustrated, the first lower width Wb1 may be smaller than the first upper width Wu1, and the first width W1 may be smaller than the second width W2.

In semiconductor devices, structures may be generally formed by an etching process or a damascene process. When a structure is formed by the etching process, a lower portion of the structure may be wider than an upper portion of the structure, and when a structure is formed by the damascene process, an upper portion of the structure may be wider than a lower portion of the structure. Also, when a structure is formed by the damascene process, the structure may be considered as having the damascene structure.

To provide a detailed description, in the etching process, a material layer to be configured for a desired structure may be first formed, and by dry-etching the material layer with a mask pattern, the desired structure may be formed. Since an upper portion is relatively more etched and a lower portion is relatively less etched are characteristics of an etching process, the structure formed through etching may generally have a structure with a lower portion being wider than an upper portion. On the other hand, in the damascene process, an insulation layer or a sacrificial layer may be formed prior to a material layer being configured as a desired structure, and a trench may be formed by etching the insulation layer or the sacrificial layer with a mask pattern. Subsequently, by filling the material layer into the trench, the structure may be formed. Any excess material deposited on the insulation layer or the sacrificial layer after filling the trench may need to be removed by means of chemical mechanical polishing (CMP) for forming the structure. In the damascene process, since the trench is formed in a portion removed by etching, the trench may have a structure in which an upper portion is wider than a lower portion. Therefore, the structure formed by filling the trench may also have a structure with an upper portion being wider than a lower portion.

In the etching process or the damascene process, by precisely controlling etching, the material layer may be etched in order for a side surface of the structure to be approximately perpendicular to a top of the substrate 101, for example, having an approximately vertical profile, and thus, there is hardly a difference between an upper portion and a lower portion of the structure. Therefore, in the memory device 100 according to the present embodiment, by precisely controlling etching in the damascene process, side surfaces of the first electrode lines 110 and the second electrode lines 120 may be formed approximately perpendicular to the top of the substrate 101. In FIGS. 2 and 3, a side slope is distinguishably illustrated for emphasizing that the first electrode lines 110 and the second electrode lines 120 are formed by the damascene process. A method of forming the first electrode lines 110 and the second electrode lines 120 will be described in detail with reference to FIGS. 20A to 24F.

A plurality of first recesses R1 may be formed in respective tops of the first electrode lines 110 and between the memory cells 130 disposed along the first direction (the X direction). As illustrated, the first recesses R1 may be respectively filled by lower portions of a plurality of second insulation layers 144 disposed between the memory cells 130. A portion of an upper portion of each of the first electrode lines 110 may be removed by over-etching when forming the memory cells 130 through an etching process, and thus, the first recesses R1 may be formed. Also, by precisely controlling etching, the first recesses R1 may hardly be formed.

A memory cell layer MCL may include the plurality of memory cells 130 (MC1 in FIG. 1) which are spaced apart from each other in the first direction and the second direction. As illustrated, the first electrode lines 110 and the second electrode lines 120 may intersect each other. The memory cells 130 may be respectively disposed in portions located between the first electrode line layer 110L and the second electrode line layer 120L, and where the first electrode lines 110 and the second electrode lines 120 intersect each other.

The memory cells 130 may be formed to have a pillar structure with a tetragonal pillar shape. However, a structure of each of the memory cells 130 is not limited to have the tetragonal pillar shape. For example, the memory cells 130 may have various pillar shapes such as, for example, a circular pillar, an elliptical pillar, a polygonal pillar, etc. Also, depending on a forming method, the memory cells 130 may have a structure with a lower portion being wider than an upper portion, or may have a structure with an upper portion being wider than a lower portion. In the memory device 100 according to the present embodiment, the memory cells 130 may mainly have a structure with a lower portion being wider than an upper portion. For example, the memory cells 130 may be formed through the etching process. By precisely controlling etching in the etching process, side surfaces of the memory cells 130 may be formed approximately perpendicular to the top of the substrate 101, e.g., having an approximately vertical profile. A method of forming the memory cells 130 will be described in detail with reference to FIGS. 20A to 24F.

The memory cells 130 may each include a bottom electrode layer 131, a selection device layer 133, a middle electrode layer 135, a variable resistance layer 137, and a top electrode layer 139.

In an exemplary embodiment of the inventive concept, the variable resistance layer 137 (ME in FIG. 1) may include a phase change material which is reversibly changed between a crystalline state and an amorphous state according to a heating duration. In general, phase-change materials may exist in an amorphous and one or sometimes several crystalline phases, and they can be rapidly and repeatedly switched between these phases. For example, the variable resistance layer 137 may include a material that has a phase, reversibly changed by Joule heat which is generated by a voltage applied across both ends of the variable resistance layer 137, and a resistance changed by the phase change. In detail, the phase change material may be put in a high resistance state in amorphous phase and may be put in a low resistance state in crystalline phase. The high resistance state may be defined as 0, and the low resistance state may be defined as 1, whereby data may be stored in the variable resistance layer 137.

In an exemplary embodiment of the inventive concept, the variable resistance layer 137 may include one or more elements (e.g., chalcogen elements) from periodic table Group VI and may optionally include one or more chemical modifiers from Group III, IV or V. For example, the variable resistance layer 137 may include Ge—Sb—Te (germanium-antimony-tellurium, GST). Here, a chemical composition mark including hyphens (–) may represent a certain compound or an element included in a compound and may represent all chemical formula structures including the represented element and/or the certain compound. For example, Ge—Sb—Te may represent a material such as $Ge_2Sb_2Te_5$, $Ge_2Sb_2Te_7$, $Ge_1Sb_2Te_4$, $Ge_1Sb_4Te_7$, or the like.

The variable resistance layer 137 may include various phase change materials in addition to the above material Ge—Sb—Te. Compositions of the phase-change materials for the variable resistance layer 137 may contain mixtures of various elements which include, but are not limited to: germanium (Ge), antimony (Sb), tellurium (Te), indium (In), selenium (Se), Gallium (Ga), arsenic (As), aluminum (Al), bismuth (Bi), Tin (Sn), oxygen (O), sulfur (S), nitrogen (N), gold (Au), palladium (Pd), titanium (Ti), cobalt (Co), silver (Ag), and nickel (Ni). For example, the variable resistance layer 137 may include at least one of Ge—Te, Sb—Te, In—Se, Ga—Sb, GeSb, In—Sb, As—Te, Al—Te, Bi—Sb—Te (BST), In—Sb—Te (IST), Ge—Sb—Te (GST), Te—Ge—As, Te—Sn—Se, Ge—Se—Ga, Bi—Se—Sb, Ga—Se—Te, Sn—Sb—Te, In—Sb—Ge, In—Ge—Te, Ge—Sn—Te, Ge—Bi—Te, Ge—Te—Se, As—Sb—Te, Sn—Sb—Bi, Ge—Te—O, GeSbTeN, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, GeBiSbTe, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, GeInSbTe, In—Sn—Sb—Te, As—Ge—Sb—Te, and a combination thereof.

The phase change material included in the variable resistance layer 137 may have various stoichiometry ratios for its components. A crystallization temperature, a melting temperature, a phase change speed based on crystallization energy, and data retention characteristic of the variable resistance layer 137 may be adjusted based on the stoichiometry ratio of the elements included in the variable resistance layer 137.

The variable resistance layer 137 may further include, for example, at least one impurity of carbon (C), nitrogen (N), silicon (Si), oxygen (O), bismuth (Bi), boron (B), indium (In), and tin (Sn). A driving current of the memory device 100 may be changed by the included at least one impurity. Also, the variable resistance layer 137 may further include metal. For example, the variable resistance layer 137 may include at least one of aluminium (Al), gallium (Ga), tin (Sn), titanium (Ti), chromium (Cr), manganese (Mn), iron (Fe), cobalt (Co), nickel (Ni), molybdenum (Mo), ruthenium (Ru), palladium (Pd), hafnium (Hf), lanthanum (LA), tantalum (Ta), iridium (Ir), platinum (Pt), zirconium (Zr), thallium (Tl), plumbum (Pb), titanium (Ti), palladium (Pd), and polonium (Po). Such metal materials may increase the electrical conductivity and thermal conductivity of the variable resistance layer 137 to increase a crystallization speed, thereby increasing a set speed. Also, the metal materials may enhance the data retention characteristic of the variable resistance layer 137.

The variable resistance layer 137 may have a multilayer structure in which two or more layers having different physical properties are stacked. The number or thicknesses of the layers may be purposively selected. A barrier layer may be further formed between the layers. The barrier layer prevents materials from being diffused between the layers. That is, the barrier layer decreases diffusion of a material of a preceding layer into a subsequent layer when forming the subsequent layer among the layers. The barrier layer may include, but is not limited to: SiN, TiN, $Ta_2O_5$, WN, TaN, TiSiN, TaSiN, highly nitrogen doped GST, or a combination thereof.

The variable resistance layer 137 may have a super-lattice structure in which a plurality of layers including materials different from each other are alternately stacked. For example, the variable resistance layer 137 may include a structure in which a first layer including Ge—Te and a second layer including Sb—Te are alternately stacked. However, a material of the first layer is not limited to Ge—Te, and a material of the second layer is not limited to Sb—Te. The first and second layers may each include the above-described various materials.

Hereinabove, the variable resistance layer 137 has been described above as including a phase change material, but the technical spirit of the inventive concept is not limited thereto. In an exemplary embodiment of the inventive concept, the variable resistance layer 137 of the memory device 100 may include various materials having resistance-changing characteristic.

In an exemplary embodiment of the inventive concept, when the variable resistance layer 137 includes transition metal oxide, the memory device 100 may be a resistive random access memory (ReRAM). In the variable resistance layer 137 including transition metal oxide, at least one electrical path may be formed or destroyed in the variable resistance layer 137 through a program operation. When the electrical path is formed, the variable resistance layer 137 may have a low resistance value, and when the electrical path is destroyed, the variable resistance layer 137 may have a high resistance value. The memory device 100 may store data by using a resistance value difference of the variable resistance layer 137.

When the variable resistance layer 137 includes transition metal oxide, the transition metal oxide may include at least one metal of Ta, Zr, Ti, Hf, Mn, yttrium (Y), Ni, Co, Zn, niobium (Nb), Cu, Fe, and Cr. For example, the transition metal oxide may be formed of a single layer or a multilayer including at least one material of $Ta_2O_{5-x}$, $ZrO_{2-x}$, $TiO_{2-x}$, $HfO_{2-x}$, $MnO_{2-x}$, $Y_2O_{3-x}$, $NiO_{1-y}$, $Nb_2O_{5-x}$, $CuO_{1-y}$, and $Fe_2O_{3-x}$. In the above-described materials, x may be selected within a range of $0 \leq x \leq 1.5$, and y may be selected within a range of $0 \leq y \leq 0.5$. However, the present embodiment is not limited thereto.

In an exemplary embodiment of the inventive concept, when the variable resistance layer 137 has a magnetic tunnel junction (MJT) structure which includes two electrodes including a magnetic material and a dielectric disposed between the two magnetic electrodes, the memory device 100 may be a magnetic random access memory (MRAM).

The two electrodes described above may respectively be a magnetization fixed layer and a magnetization free layer, and the dielectric disposed therebetween may be a tunnel barrier layer. The magnetization fixed layer may have a magnetization direction which is fixed in one direction, and the magnetization free layer may have a magnetization direction which is changeable to be parallel or antiparallel to the magnetization direction of the magnetization fixed layer. The magnetization directions of the magnetization fixed layer and the magnetization free layer may be parallel to one surface of the tunnel barrier layer, but are not limited thereto. In an exemplary embodiment of the inventive concept, the magnetization directions of the magnetization fixed layer and the magnetization free layer may be perpendicular to the one surface of the tunnel barrier layer.

When the magnetization direction of the magnetization free layer is parallel to the magnetization direction of the magnetization fixed layer, the variable resistance layer 137 may have a first resistance value. When the magnetization direction of the magnetization free layer is antiparallel to the magnetization direction of the magnetization fixed layer, the variable resistance layer 137 may have a second resistance value. By using such a resistance value difference, the memory device 100 may store data. The magnetization direction of the magnetization free layer may be changed by a spin torque of electrons included in a program current.

The magnetization fixed layer and the magnetization free layer may each include a magnetic material. In this case, the magnetization fixed layer may further include an antiferromagnetic material that fixes a magnetization direction of a ferromagnetic material included in the magnetization fixed layer. The tunnel barrier layer may be formed of oxide of at least one material of Mg, Ti, Al, MgZn, and MgB, but is not limited to the above-described example. Examples of ferromagnetic material may include, but are not limited to: Fe, Ni, Co, and many of their alloys. Examples of antiferromagnetic may include, but are not limited to: MnO, FeO, CoO, NiO, Cr, Mn, $MnO_4$, MnS, $FeCl_3$, and $MnF_2$.

The selection device layer 133 (SW in FIG. 1) may be a current control layer for controlling a flow of a current. The selection device layer 133 may include a material layer having a resistance which varies according to a level of a voltage applied across both ends of the selection device layer 133. For example, the selection device layer 133 may include a material layer having OTS characteristic. To briefly describe a function of the selection device layer 133 based on an OTS material layer, when a voltage lower than a threshold voltage $V_T$ is applied to the selection device layer 133, the selection device layer 133 may be in the high resistance state in which a current hardly flows, and when a voltage higher than the threshold voltage $V_T$ is applied to the selection device layer 133, the selection device layer 133 may be in the low resistance state and thus a current may start to flow. Also, when the current flowing through the selection device layer 133 becomes lower than a holding current, the selection device layer 133 may be changed to the high resistance state. The OTS characteristic of the selection device layer 133 will be described below in detail with reference to FIG. 4.

The selection device layer 133 may include a chalcogenide material as an OTS material layer. The OTS materials and phase-change materials (PCM) may be in the same class, but the OTS materials are usually frozen in the amorphous phase. In other words, the OTS materials do not undergo a crystallization transformation during switching and remain amorphous upon removing the applied voltage after switching. A representative example of the chalcogenide material may include one or more elements (e.g., an chalcogen element) from periodic table Group VI and may optionally include one or more chemical modifiers from Group III, IV or V. The most general examples of chalcogen elements capable of being included in the selection device layer 133 may include sulphur (S), selenium (Se), and tellurium (Te). The chalcogen elements are characterized by including a divalent bonding and lone pair electrons. The divalent bonding leads to forming of a chain structure and a ring structure by bonding chalcogen elements for forming a chalcogenide material, and the lone pair electrons may serve as an electron source for forming a conductive filament. For example, trivalent and tetravalent modifiers such as Al, Ga, In, Ge, Sn, Si, P, As, and Sb may be added into a chain and ring structure of a chalcogen element to determine a structural rigidity of a chalcogenide material and may classify the chalcogenide material into a switching material and a phase change material, based on a capability to perform crystallization or other structural rearrangement. In an exemplary embodiment of the inventive concept, the OTS material may include at least two or at least three of Si, Ge, Sb, Te, Se, In, Sn, and As. Within the elements included in the OTS material, Se, Te or As may have the highest atomic percentage in the composition.

In an exemplary embodiment of the inventive concept, the selection device layer 133 may include Si, Te, As, Ge, In, or a combination thereof. For example, a composition of the selection device layer 133 may include about 14% Si, about 39% Te, about 37% As, about 9% Ge, and about 1% In. Here, a percentage ratio denotes an atomic percentage ratio where an atomic element is a total of 100%, and the same hereinafter.

In an exemplary embodiment of the inventive concept, the selection device layer 133 may include Si, Te, As, Ge, S, Se, or a combination thereof. For example, a composition of the selection device layer 133 may include about 5% Si, about 34% Te, about 28% As, about 11% Ge, about 21% S, and about 1% Se.

In an exemplary embodiment of the inventive concept, the selection device layer 133 may include Te, As, Ge, S, Se, Sb, or a combination thereof. For example, a composition of the selection device layer 133 may include about 21% Te, about 10% As, about 15% Ge, about 2% S, about 50% Se, and about 2% Sb.

In the memory device 100 according to an exemplary embodiment of the inventive concept, the selection device layer 133 is not limited to the OTS material layer. For example, the selection device layer 133 may include various material layers having a function of selecting devices without being limited to the OTS material layer. For example, the selection device layer 133 may include a diode, tunnel junction, a PNP diode or a bipolar junction transistor (BJT), mixed ionic-electronic conduction (MIEC), etc.

The bottom electrode layer 131, the middle electrode layer 135, and the top electrode layer 139 may each be a layer that functions as a current path, and may each include a conductive material. For example, at least one of the bottom electrode layer 131, the middle electrode layer 135, and the top electrode layer 139 may include metal, conductive metal nitride, conductive metal oxide, or a combination thereof. For example, at least one of the bottom electrode layer 131, the middle electrode layer 135, and the top electrode layer 139 may include a TiN layer, but is not limited thereto. In an exemplary embodiment of the inventive concept, at least one of the bottom electrode layer 131, the middle electrode layer 135, and the top electrode layer 139 may include a conductive layer which is formed of metals or conductive metal nitrides, and at least one conductive barrier layer which covers at least a portion of the conductive layer. The conductive barrier layer may include, for example, metal oxide, metal nitride, or a combination thereof, but is not limited thereto.

At least one of the middle electrode layer 135 and the top electrode layer 139 may include a heating unit that contacts the variable resistance layer 137. The heating unit may be configured in the middle electrode layer 135 and/or the top electrode layer 139. When the heating unit is configured in the middle electrode layer 135 and/or the top electrode layer 139, the heating unit may be configured as a portion or all of the middle electrode layer 135 and/or the top electrode layer 139. For example, impurities (for example, carbon) may be doped on a portion of the middle electrode layer 135 and/or the top electrode layer 139 contacting the variable resistance layer 137 in forming the middle electrode layer 135 and/or the top electrode layer 139, thereby allowing a portion of the middle electrode layer 135 and/or the top electrode layer 139 to function as the heating unit.

The heating unit may be added into the middle electrode layer 135 and/or the top electrode layer 139 to form a structure in which the heating unit is stacked on an electrode unit having an electrode function as a separate layer. A structure, in which the middle electrode layer 135 or the top electrode layer 139 includes the heating unit and the electrode unit, will be described in detail with reference to FIGS. 5 to 7.

In the memory device 100 according to the present embodiment, the heating unit included in the middle electrode layer 135 and/or the top electrode layer 139 may heat the variable resistance layer 137 in the set operation or the reset operation. The heating unit may include a conductive material that generates heat sufficient to phase-change the variable resistance layer 137 without reacting with the variable resistance layer 137. In an exemplary embodiment of the inventive concept, the heating unit may be formed of or include, for example, TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, TaON, carbon (C), silicon carbide (SiC), silicon carbon nitride (SiCN), carbon nitride (CN), titanium carbon nitride (TiCN), tantalum carbon nitride (TaCN), high melting point metals containing combinations thereof, or nitrides thereof. However, a material of the heating unit is not limited thereto.

In an exemplary embodiment of the inventive concept, the heating unit may be formed of carbon-based materials which include, but are not limited to: amorphous carbon (C), graphene, graphite, carbon nanotube (CNT), amorphous diamond-like carbon (DLC), silicon carbide (SiC), boron carbide (BC), silicon carbon nitride (SiCN), carbon nitride (CN), titanium carbon nitride (TiCN), tantalum carbon nitride (TaCN), and other similar carbon-based materials.

Although not shown, a spacer surrounding a side surface of each of the memory cells 130 may be formed. Since the spacer surrounds the side surface of each of the memory cells 130, the spacer protects the memory cells 130, and particularly, protects the variable resistance layer 137 and/or the selection device layer 133. For example, the spacer prevents the memory cells 130 from being unnecessarily contaminated in a subsequent process, for example, a cleaning process or a metal layer patterning process. For example, the spacer may have etch resistance toward the etchants used in the subsequent patterning process, or chemical resistance toward the chemicals used in the subsequent cleaning process. The spacer may include materials (for example, oxide such as silicon oxide ($SiO_2$) or aluminium oxide ($Al_2O_3$), nitride such as silicon nitride ($Si_3N_4$), or oxynitride such as silicon oxynitride) which are capable of protecting the memory cells 130. Also, the spacer may be formed by methods in conformal deposition technology such as atomic layer deposition (ALD) and chemical vapor deposition (CVD) including thermal and plasma deposition technology.

A first insulation layer 142 may be disposed between the first electrode lines 110, and the second insulation layer 144 may be disposed between the memory cells 130 of the memory cell layer MCL. Also, a third insulation layer 145 may be disposed between the second electrode lines 120.

The first insulation layer 142 may be formed in a structure which extends in the first direction (the X direction) between the first electrode lines 110, and may be provided in plurality in correspondence with the first electrode lines 110. A second recess R2 may be formed in a top of each of the first insulation layers 142 and between the memory cells 130 disposed along the second direction (the Y direction). The second recess R2 may be filled by a lower portion of the second insulation layer 144 disposed between the memory cells 130. A portion of an upper portion of the first insulation layer 142 may be removed by over-etching when forming the memory cells 130 through an etching process, and thus, the second recess R2 may be formed. Accordingly, the second recess R2 which is formed in the first insulation layer 142 may be formed deeper than the first recess R1 which is formed in each of the first electrode lines 110 (metal layers). The difference in depth between R1 and R2 may depend on the etch rate difference between the metal material of the first electrode lines 110 and the insulation material of the first insulation layer 142 when they are etched under the etching condition used in forming the memory cells 130.

Depending on the case, the first insulation layer 142 and the second insulation layer 144 may be formed of the same material. In this case, since the first insulation layer 142 and the second insulation layer 144 are not distinguished from each other, the second recess R2 may exist conceptually.

The second insulation layers 144 may be disposed between the memory cells 130 and may electrically disconnect the memory cells 130. As the second insulation layers 144 are disposed in order for the memory cells 130 to be spaced apart from each other in the first direction and the second direction, the second insulation layers 144 may have an integrated structure with all the second insulation layers 144 being connected as one body.

As illustrated, the second insulation layers 144 may have a structure which surrounds lower portions of both side surfaces of the second electrode lines 120. Since the second insulation layers 144 have the structure which surrounds the lower portions of the both side surfaces of the second electrode lines 120, a recessed portion A may be formed in a top of the second insulation layer 144 between the second electrode lines 120. The recessed portion A may extend in the second direction (the Y direction) in which the second electrode lines 120 extend. Also, although not shown, the recessed portion A may have a structure which extends between the second electrode lines 120. To provide a detailed description, the recessed portion A may have a structure which is deepest recessed in a middle portion between four adjacent memory cells 130.

A top structure of the second insulation layer 144 having the recessed portion A may be based on a damascene structure in which the second electrode lines 120 are formed. This is because as the second electrode lines 120 are formed in the damascene structure, a planarization process such as a CMP process and/or the like is not necessary for the second insulation layer 144, and thus, the second insulation layer 144 maintains an initial shape except a portion where the second electrode lines 120 are formed. If the second electrode lines 120 are formed through an etching process, the excess second insulation layer 144 deposited above the top of the memory cells 130 need to be removed through CMP planarization process before depositing conducting material and etching the conducting material to form the second electrode lines 120. A process of forming the top structure of the second insulation layer 144 will be described in detail with reference to FIGS. 20A to 20F.

The third insulation layer 145 may be formed to have a structure which extends in the second direction (the Y direction) between the second electrode lines 120, and may be provided in plurality in correspondence with the second electrode lines 120. Since the third insulation layer 145 is formed on the second insulation layer 144, the recessed portion A of the second insulation layer 144 may be filled by a lower portion of the third insulation layer 145.

The first to third insulation layers 142, 144 and 145 may be formed as insulation layers including the same material, or at least one thereof may be formed as an insulation layer including a different material. The first to third insulation layers 142, 144 and 145 may include, for example, a dielectric material such as oxide or nitride and may electrically disconnect devices of respective layers. A plurality of air gaps, instead of the second insulation layers 144, may be formed between the memory cells 130. If the air gaps are formed, an insulation liner having a certain thickness may be formed between the air gaps and the memory cells 130. Also, a recessed portion corresponding to an upper structure of the second insulation layer 144 may be formed in an upper structure of the insulation liner.

In the memory device 100 according to the present embodiment, since the first electrode lines 110 and the second electrode lines 120 are formed through a process which differs from a process of forming the memory cells 130, the memory cells 130 with a defect or contamination being minimized may be formed. Also, in the memory device 100 according to the present embodiment, since the second electrode lines 120 are formed in the damascene structure, the second insulation layer 144 may be maintained on the memory cells 130, thereby protecting the memory cells 130 and solving a problem which occurs when CMP is excessively performed or insufficiently performed on the second insulation layer 144. With the second electrode lines 120 formed by damascene process, the third insulation layer 145 is formed on the second insulation layer 144, and then both the second and third insulation layers 144 and 145 are etched to form trenches for the second electrode lines 120. There is no CMP process carried out on the second insulation layer 144. As a result, in the memory device 100 according to the present embodiment, defects or contaminations of the memory cells 130 are prevented, and a problem which occurs when the CMP is excessively performed or insufficiently performed on the second insulation layer 144 is solved, thereby implementing a memory device which has a 3D cross-point stacked structure, a high degree of integration, and enhanced reliability.

Figure 4:
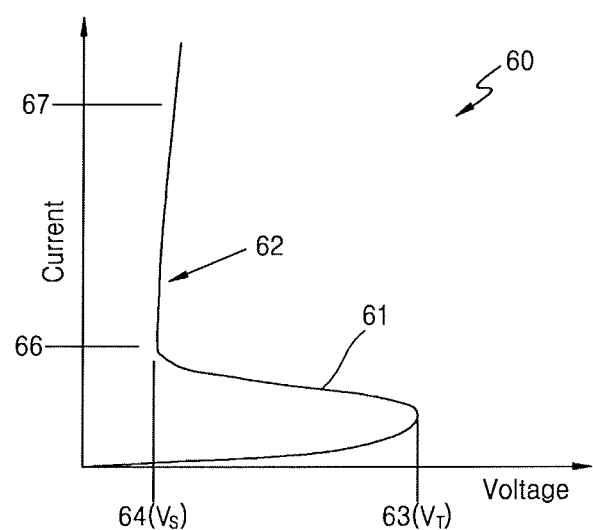
FIG. 4 is a graph schematically showing a voltage-current curve of a selection device layer having ovonic threshold switching (OTS) characteristic.

FIG. 4 is a graph schematically showing a voltage-current curve of a selection device layer having OTS characteristic.

Referring to FIG. 4, a first curve 61 represents a voltage-current relationship in a state where a current does not flow in the selection device layer. Here, the selection device layer may act as a switching device having a threshold voltage $V_T$ which is at a first voltage level 63. When a voltage gradually increases from a state where the voltage and the current are 0, the current hardly flows in the selection device layer before the voltage reaches the threshold voltage $V_T$ (i.e., the first voltage level 63). However, as soon as the voltage exceeds the threshold voltage $V_T$, the current flowing in the selection device layer may rapidly increase, and the voltage applied to the selection device layer may decrease to a second voltage level 64 (or a saturation voltage $V_S$).

A second curve 62 represents a voltage-current relationship in a state where a current flows in the selection device layer. As the current flowing in the selection device layer has a level higher than a first current level 66, a voltage applied to the selection device layer may increase slightly further than the second voltage level 64. For example, while the current flowing in the selection device layer increases considerably from the first current level 66 to a second current level 67, the voltage applied to the selection device layer may increase slightly from the second voltage level 64. That is, once the current flows through the selection device layer, the voltage applied to the selection device layer may be maintained close to the saturation voltage $V_S$ (i.e., the second voltage level 64). For example, when the current decreases to a level less than a holding current level (i.e., the first current level 66), the selection device layer may be changed to a resistance state and effectively blocks the current flow until the voltage increases to the threshold voltage $V_T$.

FIGS. 5 to 14B are cross-sectional views of memory devices according to exemplary embodiments of the inventive concept and correspond to the cross-sectional view of FIG. 3. The details described above with reference to FIGS. 2 and 3 will be briefly described or are omitted hereinafter.

Figure 5:
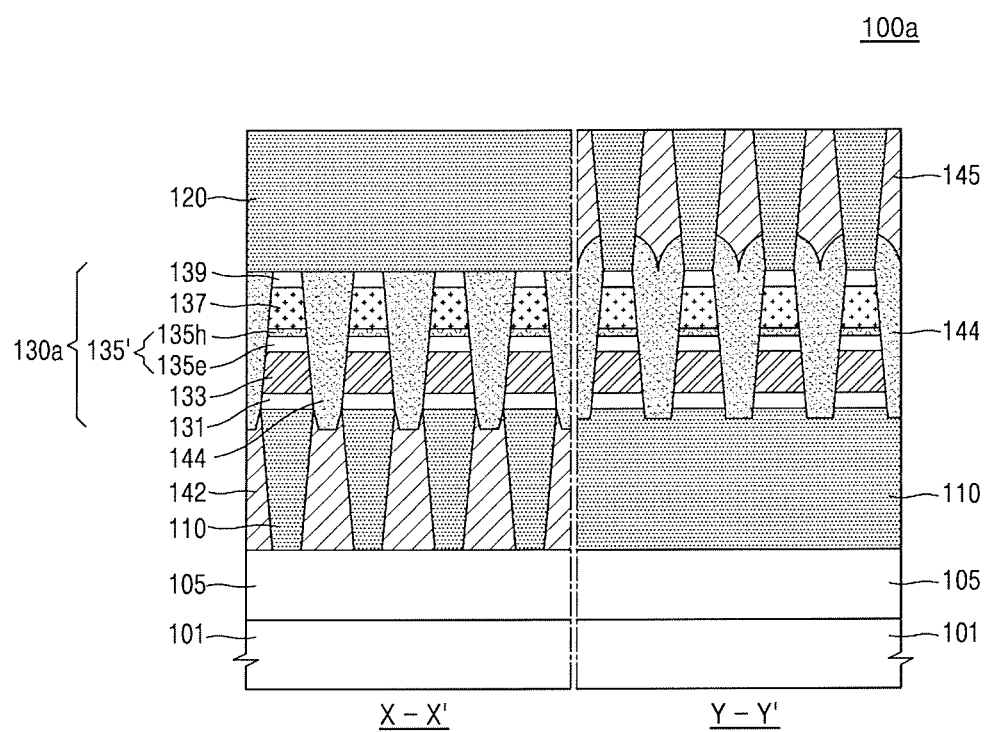
FIGS. 5 to 14B are cross-sectional views of memory devices according to exemplary embodiments of the inventive concept and correspond to the cross-sectional view of FIG. 3.

Referring to FIG. 5, in a memory device 100a according to an exemplary embodiment of the inventive concept, a middle electrode layer 135' of each of a plurality of memory cells 130a may include an electrode unit 135e and a heating unit 135h. For this reason, the memory device 100a may differ from the memory device 100 of FIG. 3. That is, in the memory device 100a according to the present embodiment, the middle electrode layer 135' may include a structure in which a thin layer of the heating unit 135h having a heating function is stacked on a thin layer of the electrode unit 135e having an electrode function. The heating unit 135h may contact the variable resistance layer 137, and the electrode unit 135e may be disposed between the heating unit 135h and the selection device layer 133. Materials or functions of the electrode unit 135e and the heating unit 135h are as described above with reference to FIGS. 2 and 3.

Generally, when the selection device layer 133 is based on OTS characteristic, the selection device layer 133 may include an amorphous chalcogenide material. However, with the down-scaling trend of the memory device 100 having the 3D cross-point stacked structure, thicknesses and widths of the variable resistance layer 137, the selection device layer 133, the bottom electrode layer 131, the middle electrode layer 135', and the top electrode layer 139 and a distance therebetween may be reduced. Therefore, in an operation of driving the memory device, when the heating unit 135h of the middle electrode layer 135' generates heat to phase-change the variable resistance layer 137, the heat may affect the selection device layer 133 disposed adjacent to the variable resistance layer 137. For example, due to the heat from the heating unit 135h of the middle electrode layer 135' adjacent to the selection device layer 133, the selection device layer 133 is deteriorated and damaged like the selection device layer 133 being partially crystallized. A partially crystallized selection device layer may not properly perform switches, because an OTS material do not undergo a crystallization transformation during switching and remain amorphous upon removing the applied voltage after switching.

In the memory device 100a according to the present embodiment, the middle electrode layer 135' may include the heating unit 135h contacting the variable resistance layer 137, and moreover, may include the electrode unit 135e disposed between the heating unit 135h and the selection device layer 133. The electrode unit 135e may be thickly formed in order for the heat from the heating unit 135h not to be transferred to the selection device layer 133. Therefore, unlike illustrated, the electrode unit 135e may be formed thicker than the bottom electrode layer 131 or the top electrode layer 139, for blocking the heat. For example, the electrode unit 135e may have a thickness in a range of about 10 nm to about 100 nm. However, a thickness of the electrode unit 135e is not limited to the above numerical values.

In the memory device 100a according to the present embodiment, the middle electrode layer 135' may include at least one thin thermal barrier layer for blocking heat. If the middle electrode layer 135' includes two or more thin thermal barrier layers, the middle electrode layer 135' may have a structure where the thin thermal barrier layer and the thin layer of the electrode unit 135e are stacked alternately under the heating unit 135h.

Figure 6:
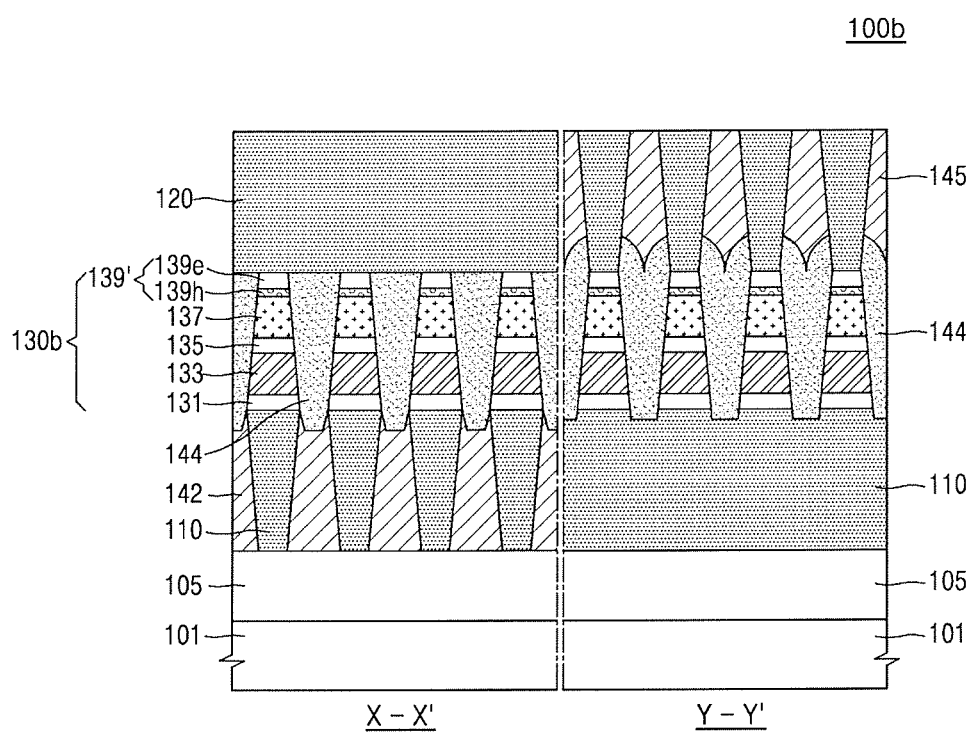

Referring to FIG. 6, in a memory device 100b according to an exemplary embodiment of the inventive concept, a top electrode layer 139' of each of a plurality of memory cells 130b may include an electrode unit 139e and a heating unit 139h. For this reason, the memory device 100b may differ from the memory device 100 of FIG. 3. That is, in the memory device 100b according to the present embodiment, the top electrode layer 139' may include the electrode 139e contacting a plurality of second electrode lines 120 and a heating unit 139h contacting a variable resistance layer 137.

As in the memory device 100b according to the present embodiment, if the top electrode layer 139' includes the heating unit 139h, a middle electrode layer 135 and the variable resistance layer 137 are disposed between the top electrode layer 139' and a selection device layer 133, an issue where heat is transferred from the heating unit 139h to the selection device layer is not significant. Therefore, in the memory device 100b according to the present invention, the electrode unit 139e may be omitted, and the heating unit 139h may be configured as the top electrode layer 139'. However, to prevent the heating unit 139h and/or the variable resistance layer 137 from being contaminated or unnecessarily etched in a subsequent process (for example, a cleaning process or a metal layer patterning process), the electrode unit 139e may be formed separately from the heating unit 139h and may be included in the top electrode layer 139'. The middle electrode layer 135 may be thickly formed or may include at least one thin thermal barrier layer, for blocking the transfer of heat.

Figure 7:
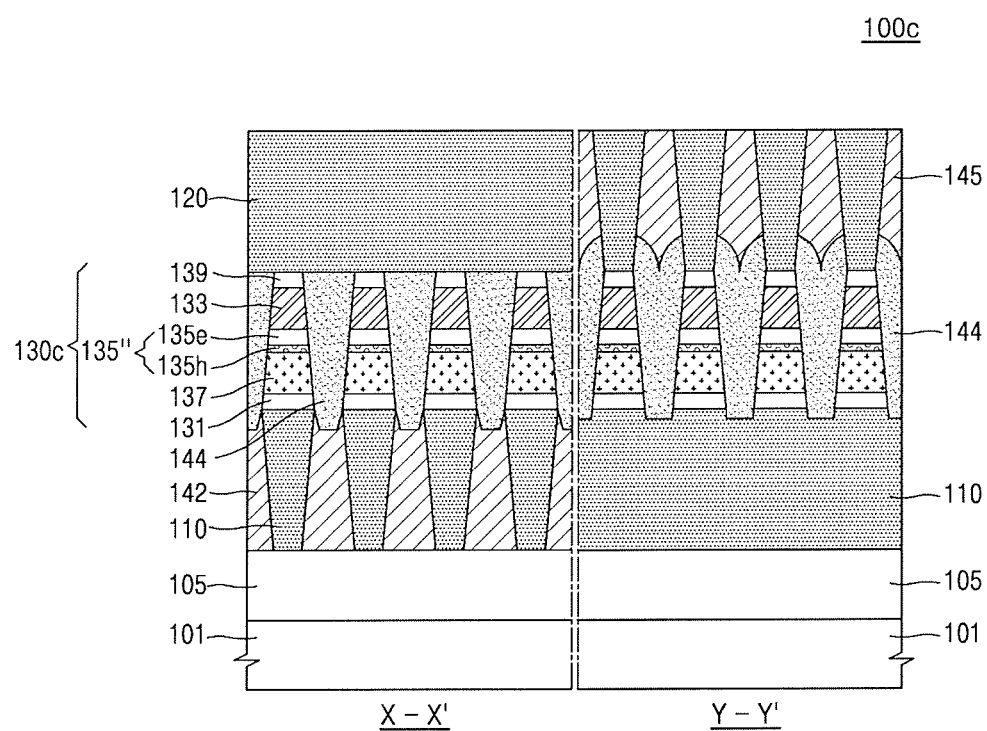

Referring to FIG. 7, in a plurality of memory cells 130c included in a memory device 100c according to an exemplary embodiment of the inventive concept, disposed positions of a selection device layer 133 and a variable resistance layer 137 may be switched with each other unlike the memory device 100a of FIG. 5. For this reason, the memory device 100c according to the present embodiment differs from the memory device 100a of FIG. 5. For example, in the memory cells 130c of the memory device 100c according to the present embodiment, the variable resistance layer 137, a middle electrode layer 135", the selection device layer 133, and a top electrode layer 139 may be sequentially stacked over a bottom electrode layer 131.

The middle electrode layer 135" may include an electrode unit 135e and a heating unit 135h similarly to the memory device 100a of FIG. 5. However, the variable resistance layer 137 may be disposed under the middle electrode layer 135", and thus, the middle electrode layer 135" may have a structure with the heating unit 135h being disposed in a lower portion and the electrode unit 135e being disposed in an upper portion.

In the memory device 100c according to the present embodiment, the middle electrode layer 135" may include the electrode unit 135e and the heating unit 135h, but a structure of each of the memory cells 130c is not limited thereto. For example, the memory cells 130c may have a structure in which a middle electrode layer is formed of a single layer and a bottom electrode layer includes an electrode unit and a heating unit. Also, as in the memory device of FIG. 3, at least one of the bottom electrode layer 131 and the middle electrode layer 135" may include a heating unit but may have a structure with a thin layer of the heating unit not separately provided. Furthermore, the middle electrode layer 135" or the electrode unit 135e may be thickly formed or may include at least one thin thermal barrier layer, for blocking the transfer of heat.

Figure 8:
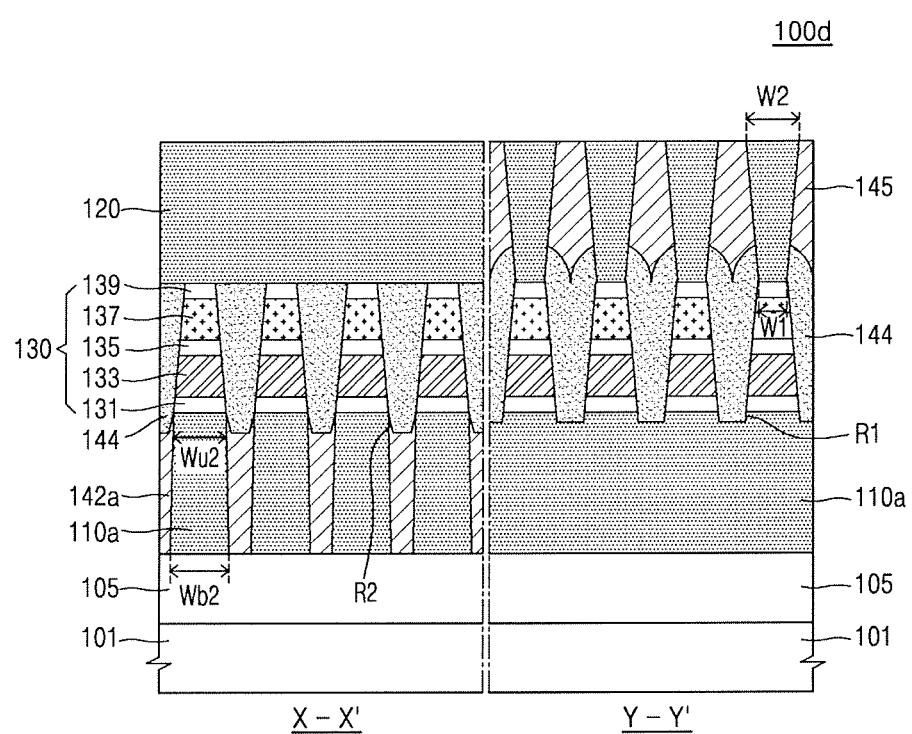

Referring to FIG. 8, in a memory device 100d according to an exemplary embodiment of the inventive concept, a plurality of first electrode lines 110a may be widened progressively from an upper portion to a lower portion, or the lower portion and the upper portion of each of the first electrode lines 110a may have approximately the same width. For this reason, the memory device 100d differs from the memory device 100 of FIG. 3. For example, in the memory device 100d according to the present embodiment, the first electrode lines 110a may be formed through an etching process, while the second electrode lines 120 may be formed through a damascene process.

To provide a detailed description, in the memory device 100 of FIG. 3, since the first electrode lines 110 are formed through the damascene process, the first electrode lines 110 may have a structure with an upper portion being wider than a lower portion. On the other hand, the first electrode lines 110a of the memory device 100d according to the present embodiment may be formed through the etching process, and thus may have a structure with an upper portion being narrower than a lower portion. For example, if the lower portion of each of the first electrode lines 110a has a second lower width Wb2, the upper portion of each of the first electrode lines 110a may have a second upper width Wu2 narrower than the second lower width Wb2. By precisely controlling etching in the etching process, a side surface of each of the first electrode lines 110a may be formed substantially perpendicular to a top of the substrate 101, for example, having an approximately vertical profile, and thus, the second upper width Wu2 and the second lower width Wb2 may be substantially the same.

A first insulation layer 142a extending in the first direction (the X direction) may be disposed between the first electrode lines 110a, and in this case, a side surface of the first insulation layer 142a may have a slope opposite to that of the first electrode lines 110a. Therefore, the first insulation layer 142a may have a structure which is narrowed progressively from an upper portion to a lower portion. Also, a first recess R1 may be formed in a top of each of the first electrode lines 110a, and a second recess R2 may be formed in a top of the first insulation layer 142a.

Figure 9:
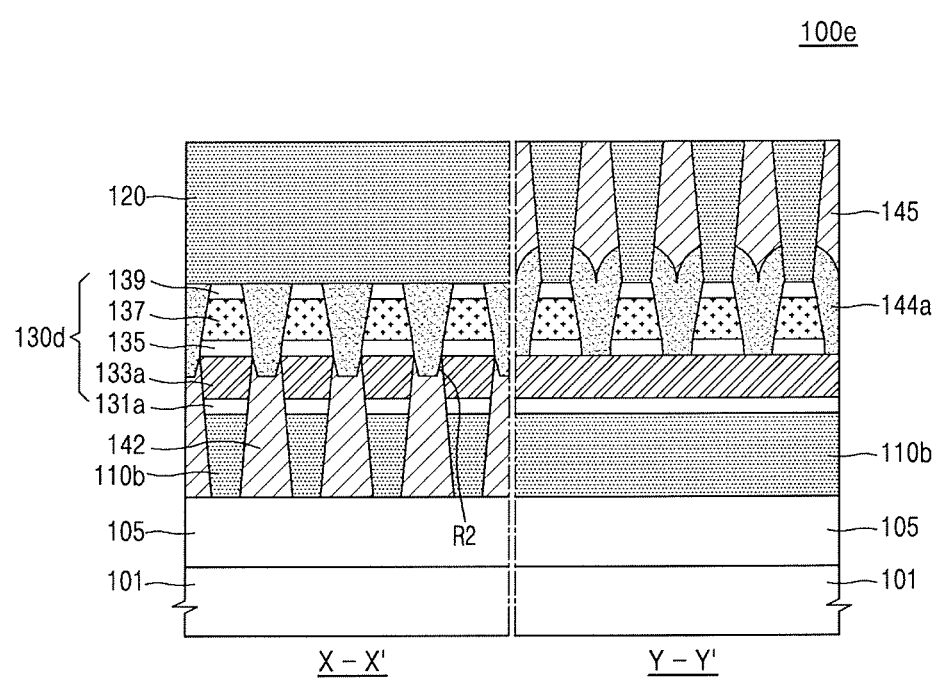

Referring to FIG. 9, in a memory device 100e according to an exemplary embodiment of the inventive concept, a plurality of memory cells 130d may have a structure in which a lower portion of each of the memory cells 130d is widened progressively toward an upper portion thereof, and an upper portion of each of the memory cells 130d is narrowed progressively toward a top portion thereof. For this reason, the memory device 100e differs from the memory devices 100 and 100a to 100d according to the preceding embodiments. In detail, in the memory cells 130d of the memory device 100e according to the present embodiment, a bottom electrode layer 131a and a selection device layer 133a may have a structure which is widened progressively toward an upper portion, and a middle electrode layer 135, a variable resistance layer 137, and a top electrode layer 139 may have a structure which is narrowed progressively toward a top portion. The structure of each of the memory cells 130d may be based on that the bottom electrode layer 131a and the selection device layer 133a may be formed through a damascene process, and the middle electrode layer 135, the variable resistance layer 137, and the top electrode layer 139 may be formed through an etching process. Similar to the memory devices 100 and 100a to 100d, the second electrode lines 120 of the memory device 100e may be formed through a damascene process.

Unlike the memory devices 100 and 100a to 100d according to the preceding embodiments, in the memory device 100e according to the present embodiment, the bottom electrode layer 131a and the selection device layer 133a may be disposed between adjacent first insulation layers 142. Therefore, only the middle electrode layer 135, the variable resistance layer 137, and the top electrode layer 139 may be disposed between adjacent second insulation layers 144a. Accordingly, a thickness of the second insulation layer 144a may be reduced by a thickness of the bottom electrode layer 131a and the selection device layer 133a. As a result, in comparison with the memory devices 100 and 100a to 100d according to the preceding embodiments, a height of the memory device 100e according to the present embodiment may be reduced by the thickness of the bottom electrode layer 131a and the selection device layer 133a. Therefore, in implementing a memory device having the 3D cross-point stacked structure, the memory device 100e according to the present embodiment may provide a good structure in terms of a degree of integration.

The memory device 100e according to the present embodiment may have a structure in which a plurality of the bottom electrode layers 131a extend in the first direction (the X direction) and are spaced apart from each other in the second direction (the Y direction), and a plurality of the selection device layers 133a extend in the first direction (the X direction) and are spaced apart from each other in the second direction (the Y direction), similarly to the first electrode lines 110b. The structure may be based on that the bottom electrode layer 131a and the selection device layer 133a are formed in a trench which is formed by removing a portion of an upper portion of each of the first electrode lines 110b. For this reason, each of the first electrode lines 110b may have a structure which is recessed with respect to a top of the first insulation layer 142. In addition, even though the bottom electrode layer 131a and the selection device layer 133a have a structure which extends in one direction like the first electrode lines 110b which also extends in the first direction, operations of the memory cells 130d are not affected at all. In other words, if a plurality of the variable resistance layers 137 are spaced apart from each other, each of the memory cells 130d does not have any problem in functioning as a memory device.

Since the bottom electrode layer 131a and the selection device layer 133a are formed through the damascene process, a recess may not be formed in a top of each of the first electrode lines 110b. Also, since the middle electrode layer 135, the variable resistance layer 137, and the top electrode layer 139 are formed through the etching process, a second recess R2 may be formed in a top of the first insulation layer 142. In addition, a recess may occur in a top of the selection device layer 133a in etching the middle electrode layer 135, the variable resistance layer 137, and the top electrode layer 139. A degree to which the recess occurs in the top of the selection device layer 133a is minimized by precisely controlling an etching process. Also, a uniform thickness of the selection device layer 133a contributes to making the electrical characteristic (for example, threshold voltage (Vt) characteristic) of the selection device layer 133a uniform. Accordingly, the selection device layer 133a with uniform thickness contributes to reducing a variation of the memory device 100e.

A method of manufacturing the memory device 100e according to the present embodiment will be described in detail with reference to FIGS. 23A to 23F.

Figure 10:
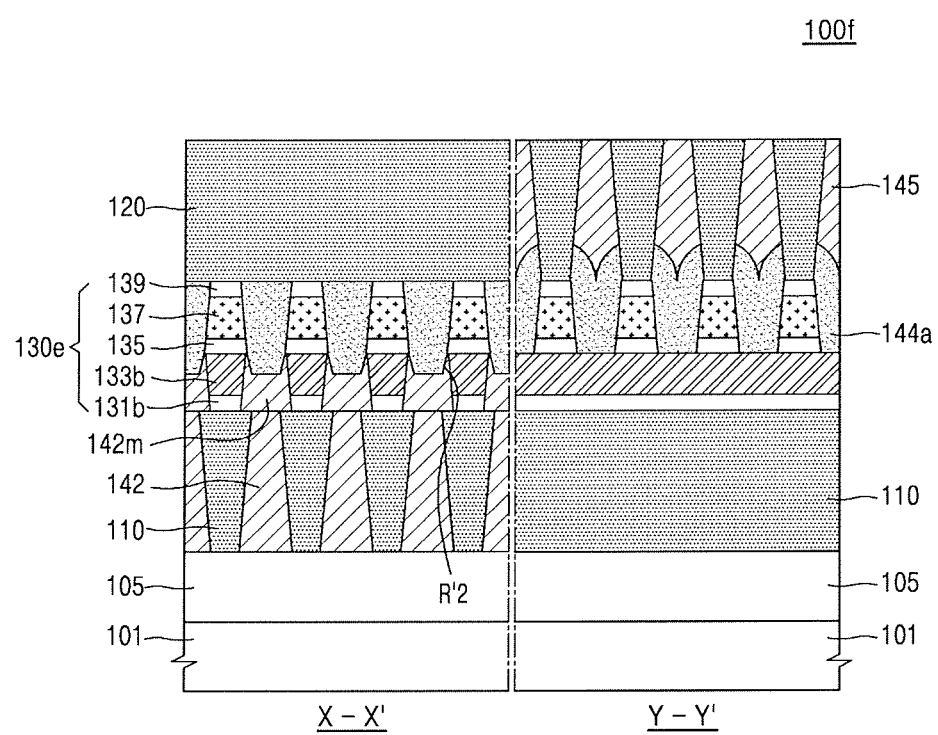

Referring to FIG. 10, in a memory device 100f according to an exemplary embodiment of the inventive concept, a plurality of memory cells 130e may have a structure in which a lower portion of each of the memory cells 130e is widened progressively toward an upper portion thereof, and an upper portion of each of the memory cells 130e is narrowed progressively toward a top portion thereof. For this reason, the memory device 100f is similar to the memory device 100e of FIG. 9. However, in the memory device 100f according to the present embodiment, a bottom electrode layer 131b and a selection device layer 133b may not be formed between adjacent first insulation layers 142, but may be formed between adjacent mold insulation layers 142m. For this reason, the memory device 100f according to the present embodiment differs from the memory device 100e of FIG. 9.

In the memory cells 130e of the memory device 100f according to the present embodiment, the bottom electrode layer 131b and the selection device layer 133b may have a structure which is widened progressively toward an upper portion, and a middle electrode layer 135, a variable resistance layer 137, and a top electrode layer 139 may have a structure which is narrowed progressively toward a top portion. The bottom electrode layer 131b and the selection device layer 133b may be formed through a damascene process, and the middle electrode layer 135, the variable resistance layer 137, and the top electrode layer 139 may be formed through an etching process. Similar to the memory devices 100 and 100a to 100e, the second electrode lines 120 of the memory device 100f may be formed through a damascene process. Since the bottom electrode layer 131b and the selection device layer 133b are formed between the adjacent mold insulation layers 142m, a height of the memory device 100f according to the present embodiment may be greater than that of the memory device 100e of FIG. 9. For example, the height of the memory device 100f according to the present embodiment may be substantially the same as that of each of the memory devices 100 and 100a to 100d according to the preceding embodiments where the memory cells 130 and 130a to 130c are all formed through etching.

A second recess R'2 may be formed in a top of the mold insulation layer 142m. The second recess R'2 may be formed in etching the middle electrode layer 135, the variable resistance layer 137, and the top electrode layer 139. Since the bottom electrode layer 131b and the selection device layer 133b are formed in the mold insulation layer 142m, a recess may not be formed in a plurality of first electrode lines 110 and a first insulation layer 142. A portion of a top of each of the first electrode lines 110, which is exposed when a trench is formed in the mold insulation layer 142m, may be etched, and thus, a fine recess may be formed. In addition, the first insulation layer 142 and the mold insulation layer 142m may include the same material. In this case, the first insulation layer 142 and the mold insulation layer 142m are not distinguished from each other, and thus may be regarded as one insulation layer.

A method of manufacturing the memory device 100f according to the present embodiment will be described in detail with reference to FIGS. 24A to 24c.

Figure 11:
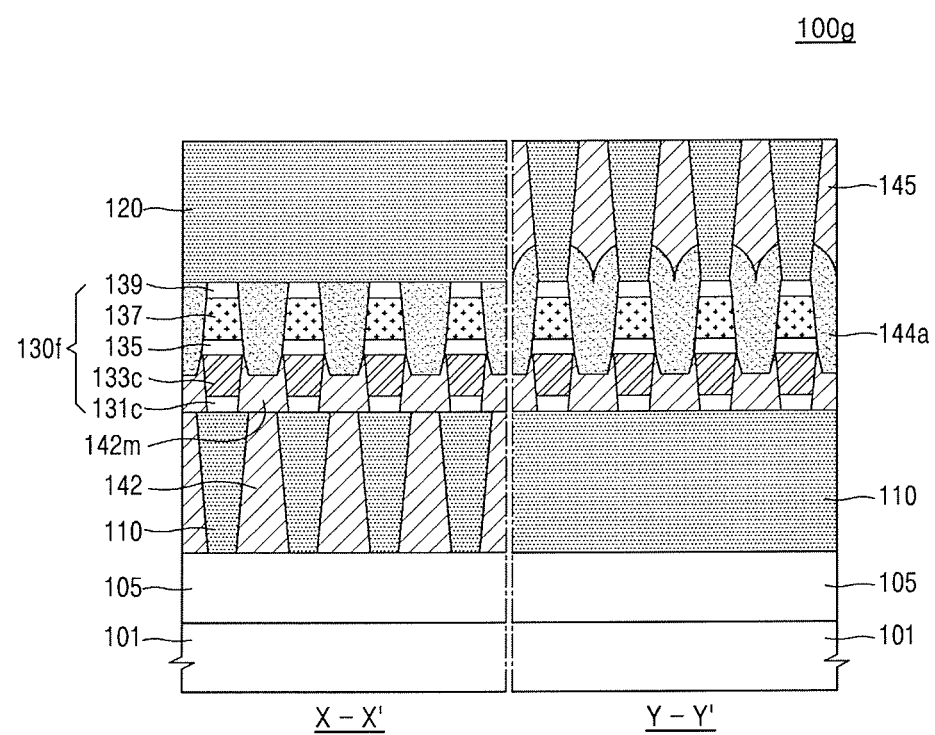

Referring to FIG. 11, in a memory device 100g according to an exemplary embodiment of the inventive concept, a plurality of memory cells 130f may have a structure in which a lower portion of each of the memory cells 130f is widened progressively toward an upper portion thereof, and an upper portion of each of the memory cells 130f is narrowed progressively toward a top portion thereof, and moreover, a mold insulation layer 142m may be used. For this reason, the memory device 100g according to the present embodiment is similar to the memory device 100f of FIG. 10. However, in the memory device 100g according to the present embodiment, a bottom electrode layer 131c and a selection device layer 133c may be spaced apart from each other in the first direction (the X direction) as well as the second direction (the Y direction). For this reason, the memory device 100g according to the present embodiment differs from the memory device 100f of FIG. 10.

For example, the memory device 100f of FIG. 10 may have the structure in which the bottom electrode layers 131b extend in the first direction (the X direction) and are spaced apart from each other in the second direction (the Y direction), and the selection device layers 133b extend in the first direction (the X direction) and are spaced apart from each other in the second direction (the Y direction), like the first electrode lines 110 which also extend in the first direction and are spaced apart from each other in the second direction. On the other hand, the memory device 100g according to the present embodiment may have a structure in which a plurality of the bottom electrode layers 131c are spaced apart from each other in the first direction and the second direction, and a plurality of the selection device layers 133c are spaced apart from each other in the first direction and the second direction. Such a structure difference may be based on a shape which is formed when being patterned in the mold insulation layer 142m. For example, when a trench may be formed in the mold insulation layer 142m in a line type like the first electrode lines 110, and a bottom electrode layer and a selection device layer are formed by filling the line-type trench, the structure of each of the memory cells 130e included in the memory device 100f of FIG. 10 may be formed. On the other hand, when a plurality of holes may be formed in an island type in which the holes are spaced apart from each other in the first direction and the second direction, and a bottom electrode layer and a selection device layer are formed by filling the island-type holes, the structure of each of the memory cells 130f included in the memory device 100g according to the present embodiment may be formed. Similar to the memory devices 100 and 100a to 100f, the second electrode lines 120 of the memory device 100g may be formed through a damascene process.

Figure 12:
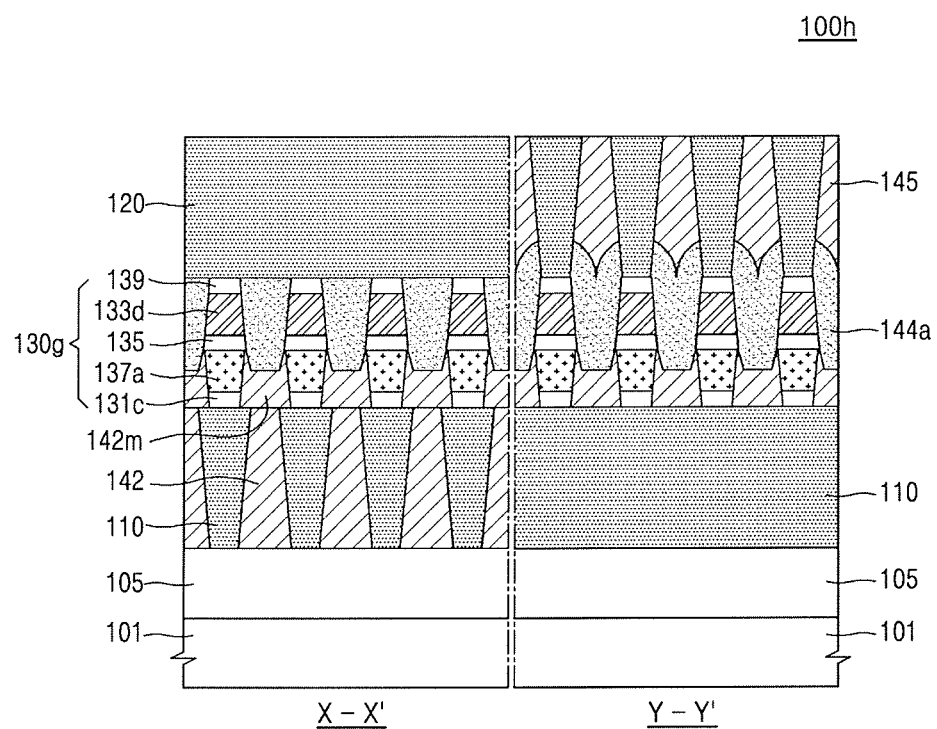

Referring to FIG. 12, in a memory device 100h according to an exemplary embodiment of the inventive concept, a plurality of memory cells 130g may have a structure in which a lower portion of each of the memory cells 130g is widened progressively toward an upper portion thereof, and an upper portion of each of the memory cells 130g is narrowed progressively toward a top portion thereof, and moreover, a mold insulation layer 142m may be used. For this reason, the memory device 100h according to the present embodiment is similar to the memory device 100g of FIG. 11. However, in the memory device 100h according to the present embodiment, disposed positions of a variable resistance layer 137a and a selection device layer 133d may be switched with each other. For this reason, the memory device 100h according to the present embodiment differs from the memory device 100g of FIG. 11. For example, in the structure of each of the memory cells 130g included in the memory device 100h according to the present embodiment, a bottom electrode layer 131c and the variable resistance layer 137a may be formed through a damascene process and may be disposed in a lower portion, and a middle electrode layer 135, a selection device layer 133d, and a top electrode layer 139 may be formed through an etching process and may be disposed in an upper portion.

Each of the memory cells 130g included in the memory device 100h according to the present embodiment may have a structure in which a plurality of the bottom electrode layers 131c are spaced apart from each other in the first direction (the X direction) and the second direction (the Y direction), and a plurality of the variable resistance layer 137a are spaced apart from each other in the first direction and the second direction. As described above, in the memory device 100h, in order for the variable resistance layer 137a to be configured to form one unit memory cell, a plurality of the variable resistance layers 137a may be electrically insulated from each other. Except that the variable resistance layer 137a instead of the selection device layer 133d is formed through the damascene process, there is hardly any difference between a method of manufacturing the memory device 100h according to the present embodiment and a method of manufacturing the memory device 100g of FIG. 11. Similar to the memory devices 100 and 100a to 100g, the second electrode lines 120 of the memory device 100h may be formed through a damascene process.

Figure 13A:
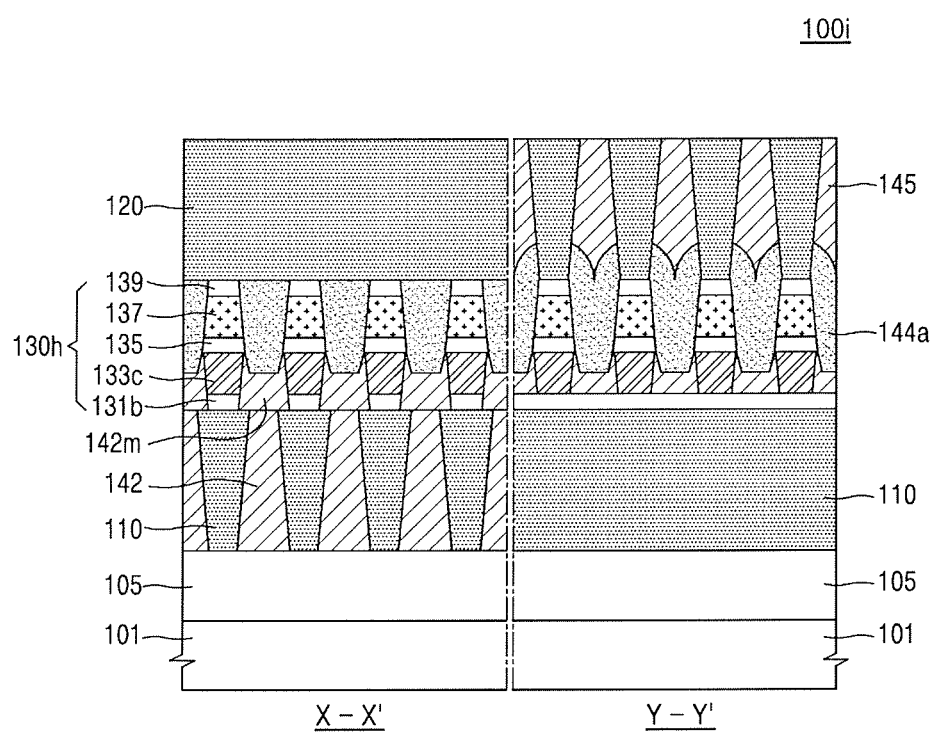

Referring to FIG. 13A, in a memory device 100i according to an exemplary embodiment of the inventive concept, a plurality of memory cells 130h may have a structure in which a lower portion of each of the memory cells 130h is widened progressively toward an upper portion thereof, and an upper portion of each of the memory cells 130h is narrowed progressively toward a top portion thereof, and moreover, a mold insulation layer 142m may be used. For this reason, the memory device 100i according to the present embodiment is similar to the memory device 100f of FIG. 10. However, in the memory device 100i according to the present embodiment, a plurality of selection device layers 133c may be spaced apart from each other in the first direction (the X direction) as well as the second direction (the Y direction). For this reason, the memory device 100i according to the present embodiment differs from the memory device 100f of FIG. 10. In other words, a bottom electrode layer 131b may be formed in a structure which extends in the first direction in a shape like a plurality of first electrode lines 110 which also extend in the first direction, but the selection device layers 133c may be formed in a structure in which the selection device layers 133c are spaced apart from each other in the first direction and the second direction.

In the memory cells 130h, since the selection device layers 133c are formed in a structure in which the selection device layers 133c are spaced apart from each other, the electrical characteristics of the memory cells 130h are uniform. The memory device 100i according to the present embodiment may be manufactured by using two mold insulation layers 142m. The bottom electrode layer 131b having a line type may be formed by using a first mold insulation layer, and the selection device layers 133c having an island type may be formed by using a second mold insulation layer. Also, in another method, the bottom electrode layer 131b may be formed through etching, and then, the selection device layers 133c having an island type may be formed by using one mold insulation layer. Similar to the memory devices 100 and 100a to 100h, the second electrode lines 120 of the memory device 100i may be formed through a damascene process.

Figure 13B:
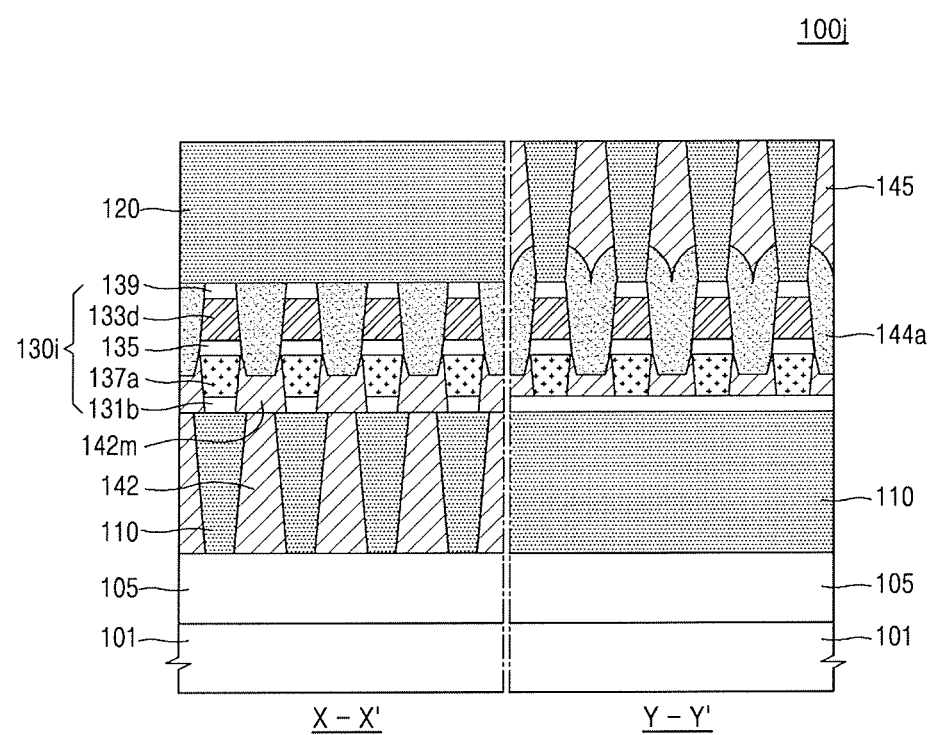

Referring to FIG. 13B, in a memory device 100j according to an exemplary embodiment of the inventive concept, a plurality of memory cells 130i may have a structure in which a lower portion of each of the memory cells 130i is widened progressively toward an upper portion thereof, and an upper portion of each of the memory cells 130i is narrowed progressively toward a top portion thereof, and moreover, a mold insulation layer 142m may be used. For this reason, the memory device 100j according to the present embodiment is similar to the memory device 100h of FIG. 12. However, in the memory device 100j according to the present embodiment, a plurality of bottom electrode layers 131b may have a structure in which the bottom electrode layers 131b extend in the first direction (the X direction) and are spaced apart from each other in the second direction (the Y direction). For this reason, the memory device 100j according to the present embodiment differs from the memory device 100h of FIG. 12. In other words, in the memory device 100h of FIG. 12, the bottom electrode layers 131c may be formed in a structure in which the bottom electrode layers 131c are spaced apart from each other in the first direction and the second direction, and the variable resistance layers 137a may be formed in a structure in which the variable resistance layers 137a are spaced apart from each other in the first direction and the second direction. However, in the memory device 100j according to the present embodiment, only a plurality of variable resistance layers 137a may be formed in a structure in which the variable resistance layers 137a are spaced apart from each other in the first direction and the second direction, and the bottom electrode layers 131b may be formed in a structure which extends in the first direction in a type like a plurality of first electrode lines 110 which also extend in the first direction.

Even in a case where the variable resistance layers 137a are disposed in a lower portion and the bottom electrode layers 131b have a structure which extends in one direction, if the variable resistance layers 137a are spaced apart from each other, each of the memory cells 130i does not have any problem in operation. Except that the variable resistance layers 137a instead of a selection device layer 133d are formed through a damascene process, there is hardly any difference between a method of manufacturing the memory device 100j according to the present embodiment and a method of manufacturing the memory device 100i of FIG. 13A. Similar to the memory devices 100 and 100a to 100i, the second electrode lines 120 of the memory device 100j may be formed through a damascene process.

The memory cells 130 and 130a to 130i of the memory devices 100 and 100a to 100j may be formed by an etching process or a combination of an etching process and a damascene process, thus at least one of the selection device layer and the variable resistance layer may be formed by etching process. Since the structure formed through an etching process may have a structure with a lower portion being wider than an upper portion, at least one of the selection device layer and the variable resistance layer of the memory devices 100 and 100a to 100j is narrowed progressively from a lower portion to an upper portion.

Figure 14A:
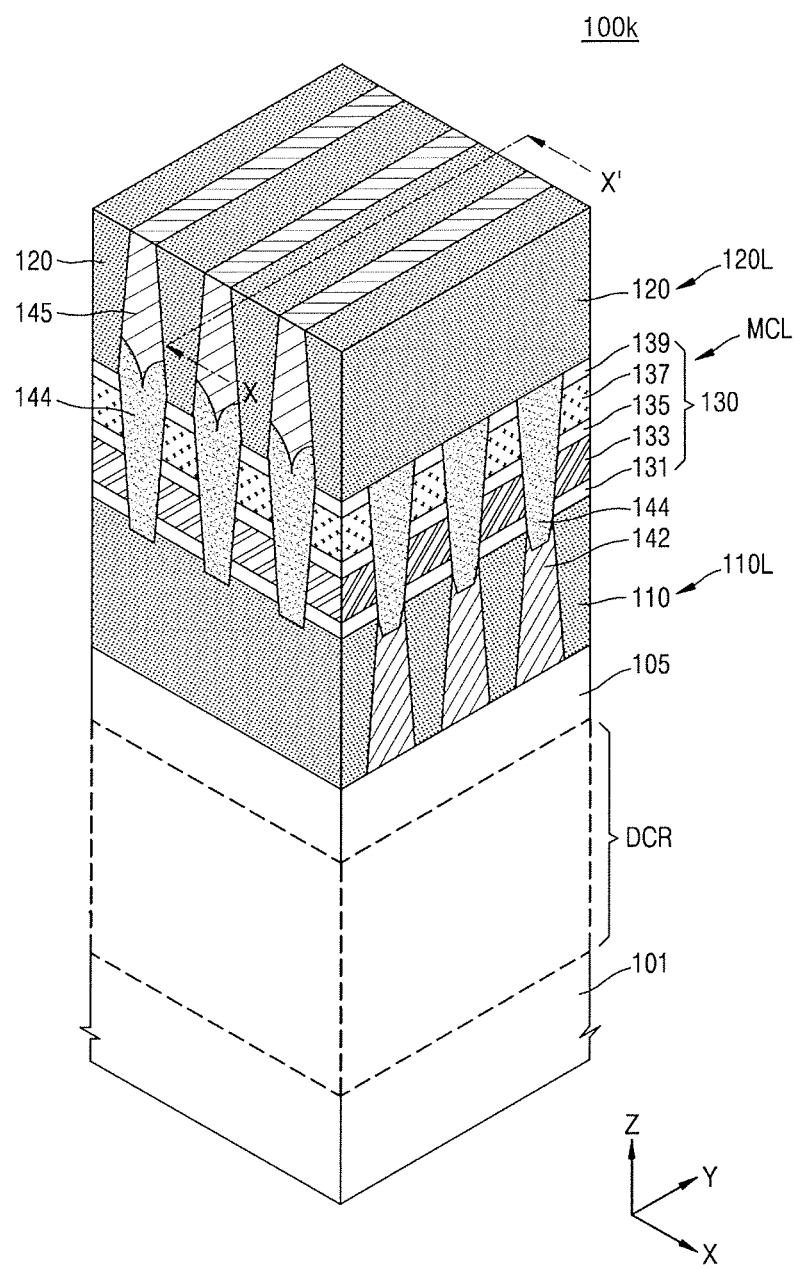
Figure 14B:
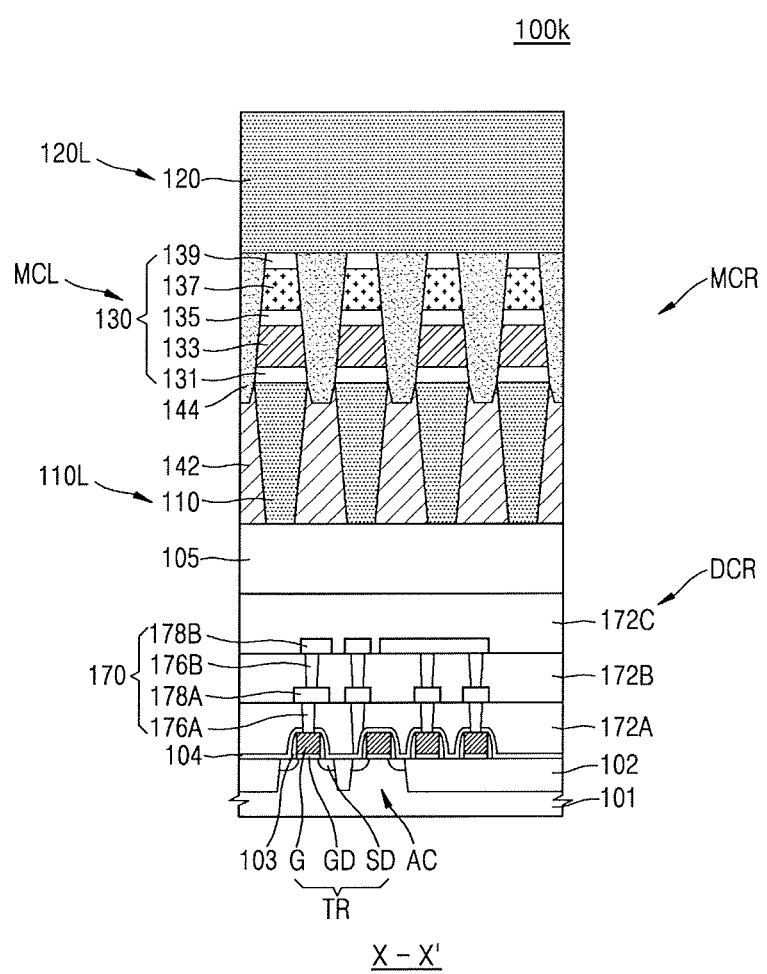

Referring to FIGS. 14A and 14B, a memory device 100k according to an exemplary embodiment of the inventive concept may include a driving circuit region DCR, provided in a first level on a substrate 101, and a memory cell region MCR provided in a second level on the substrate 101. Here, the term "level" denotes a height in a vertical direction (the Z direction in FIG. 2) from the substrate 101. The first level may be closer to the substrate 101 than the second level.

The driving circuit region DCR may be regions where peripheral circuits or driving circuits for driving memory cells in the memory cell region MCR are disposed, and may correspond to an integrated circuit layer described above with reference to FIGS. 2 and 3. For example, the peripheral circuits disposed in the driving circuit region DCR may be circuits for processing data input/output to/from the memory cell region MCR at a high speed. For example, the peripheral circuits may be a page buffer, a latch circuit, a cache circuit, a column decoder, a sense amplifier, a data in/out circuit, a row decoder, and/or the like.

An active area AC for driving circuits may be defined on the substrate 101 by an isolation layer 102. A plurality of transistors TR configured in the driving circuit region DCR may be formed in the active area AC of the substrate 101. The plurality of transistors TR may each include a gate G, a gate insulation layer GD, and a source/drain region SD. Both side walls of the gate G may be covered by an insulation spacer 103, and an etch stopper 104 may be formed on the gate G and the insulation spacer 103. The etch stopper 104 may include an insulating material such as, for example, silicon nitride, silicon oxynitride, or the like.

A plurality of bottom interlayer insulation layers 172A to 172C may be sequentially stacked on the etch stopper 104. The plurality of bottom interlayer insulation layers 172A to 172C may each include, for example, silicon oxide, silicon oxynitride, silicon nitride, and/or the like.

The driving circuit region DCR may include a multilayer wiring structure 170 electrically connected to the plurality of transistors TR. The multilayer wiring structure 170 may be insulated by the plurality of bottom interlayer insulation layers 172A to 172C.

The multilayer wiring structure 170 may include a first contact 176A, a first wiring layer 178A, a second contact 176B, and a second wiring layer 178B which are sequentially stacked on the substrate 101, and are electrically connected to each other. In an exemplary embodiment of the inventive concept, the first wiring layer 178A and the second wiring layer 178B may each include, for example, metal, conductive metal nitride, metal silicide, or a combination thereof. For example, the first wiring layer 178A and the second wiring layer 178B may each include a conductive material such as tungsten (W), molybdenum (Mo), titanium (Ti), cobalt (Co), tantalum (Ta), nickel (Ni), tungsten silicide, titanium silicide, cobalt silicide, nickel silicide, etc.

In the memory device 100k according to the present embodiment, the multilayer wiring structure 170 is exemplarily illustrated as having a two-layer wiring structure including the first wiring layer 178A and the second wiring layer 178B, but is not limited thereto. For example, the multilayer wiring structure 170 may have a multilayer wiring structure including three or more layers, based on a layout of the driving circuit region DCR and the kind of arrangement of the gate G.

An interlayer insulation layer 105 may be formed on the plurality of bottom interlayer insulation layers 172A to 172C. The memory cell region MCR may be disposed on the interlayer insulation layer 105. The interlayer insulation layer 105 and the memory cell region MCR are as described on the memory device 100 of FIGS. 2 and 3. For example, the memory cell region MCR may include a first electrode line layer 110L, a memory cell layer MCL, and a second electrode line layer 120L. The memory cell region MCR is not limited to the structure of the memory device 100 of FIGS. 2 and 3, and the structure of each of the memory devices 100a to 100j of FIGS. 5 to 13B may be applied to the memory cell region MCR.

A wiring structure connected between the memory cell region MCR and the driving circuit region DCR may be disposed to pass through the interlayer insulation layer 105. The memory device 100k according to the present embodiment may have a structure with the memory cell region MCR being disposed on the driving circuit region DCR, and thus, a degree of integration of a memory device is greatly enhanced.

Hereinabove, various memory devices having a crosspoint structure have been described, but the technical spirit of the inventive concept is not limited thereto. For example, the technical spirit of the inventive concept may be applied to all kinds of memory devices having a structure in which memory cells are patterned separately from electrode lines, electrode lines disposed on the memory cells are formed in a damascene structure, and an insulation layer between adjacent memory cells surrounds lower portions of both side surfaces of the electrode lines.

Figure 15:
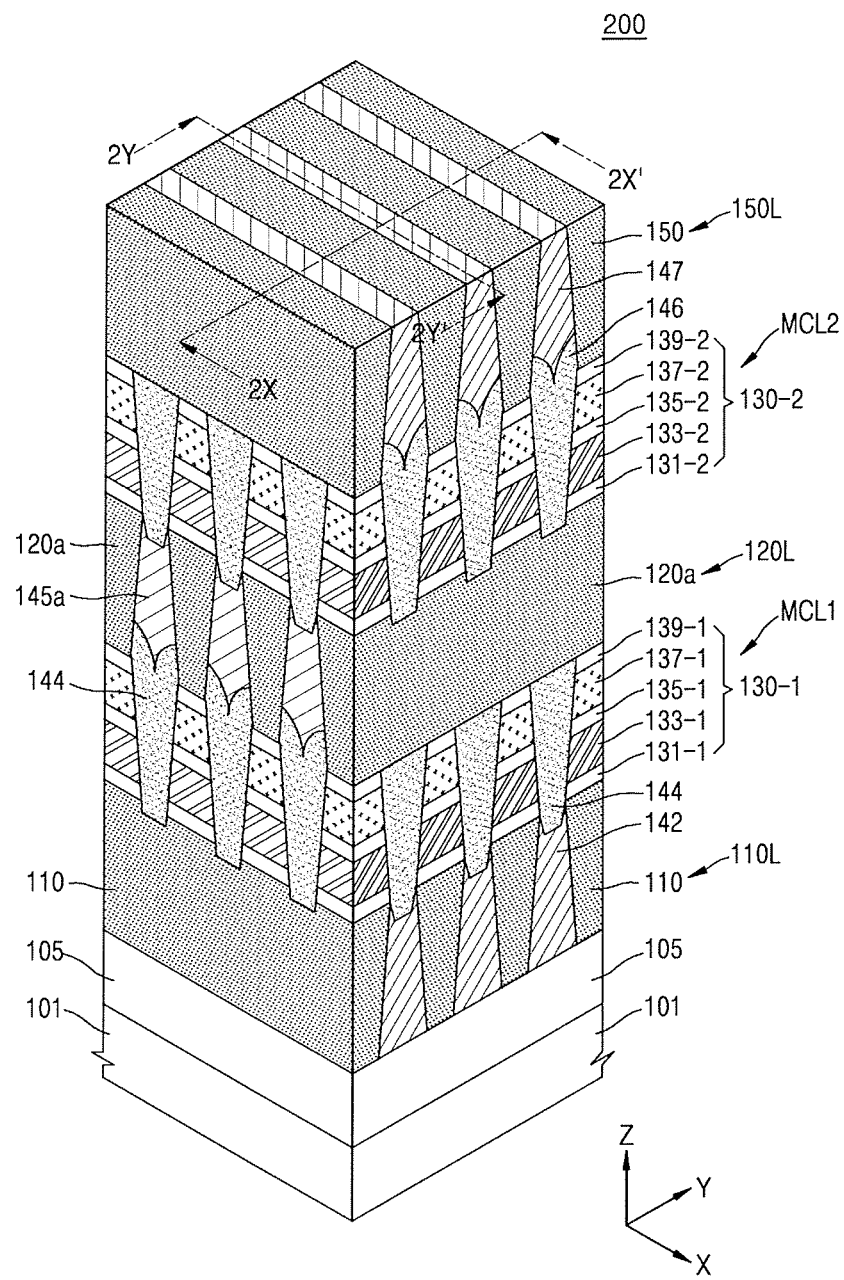
FIG. 15 is a perspective view of a memory device according to an exemplary embodiment of the inventive concept.
Figure 16:
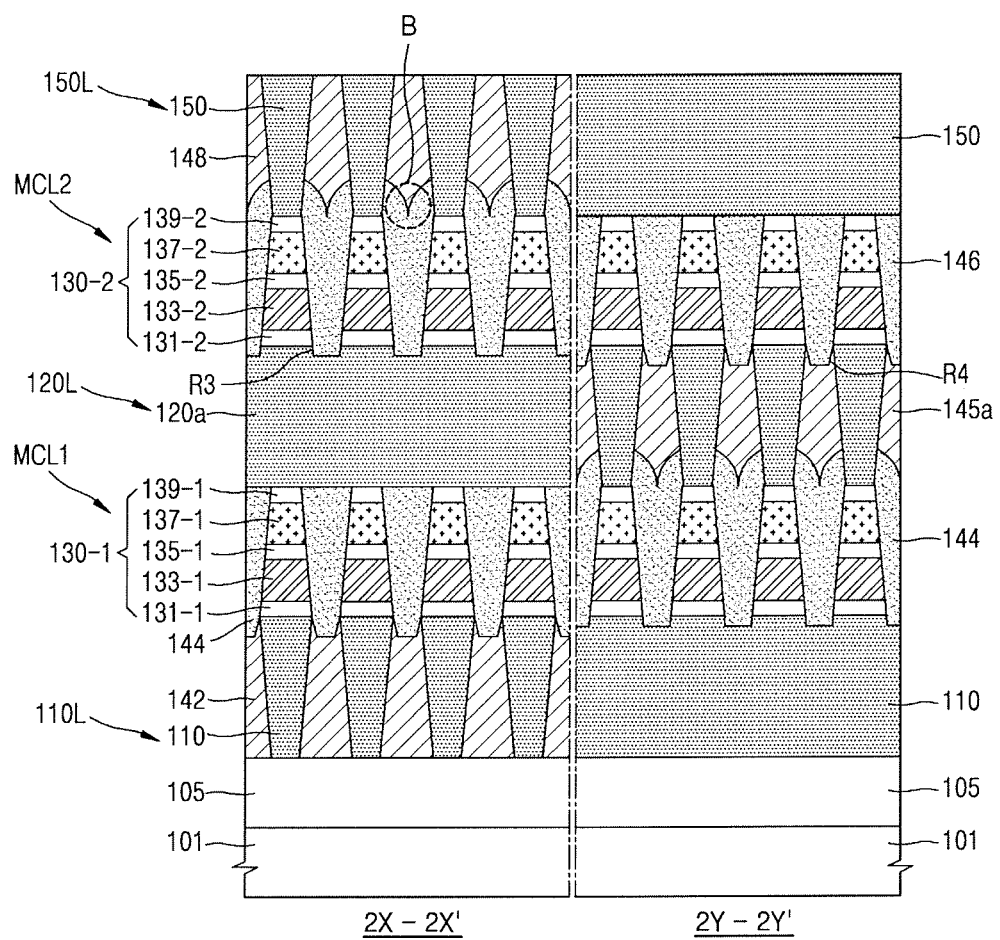
FIG. 16 is a cross-sectional view taken along line 2X-2X' and line 2Y-2Y' of FIG. 15.

FIG. 15 is a perspective view of a memory device 200 according to an exemplary embodiment of the inventive concept, and FIG. 16 is a cross-sectional view taken along line 2X-2X' and line 2Y-2Y' of FIG. 15. FIG. 16 illustrates insulation layers which are slightly enlarged in the X direction and the Y direction and shown in an outer portion. The details described above with reference to FIGS. 2 and 3 will be briefly described or are omitted hereinafter.

Referring to FIGS. 15 and 16, the memory device 200 according to the present embodiment may have a two-layer structure including two memory cell layers MCL1 and MCL2 which are stacked.

A first electrode line layer 110L may include a plurality of first electrode lines 110 that extend in parallel in the first direction (the X direction), and a second electrode line layer 120L may include a plurality of second electrode lines 120a that extend in parallel in the second direction (the Y direction) perpendicular to the first direction. Also, a third electrode line layer 150L may include a plurality of third electrode lines 150 that extend in parallel in the first direction (the X direction). The third electrode lines 150 merely differ from the first electrode lines 110 in position corresponding to the third direction (the Z direction), and may be substantially the same as the first electrode lines 110 in extension direction and/or disposition structure. Accordingly, the third electrode lines 150 may be referred to as first electrode lines of the third electrode line layer 150L.

In terms of driving of the memory device 200, the first electrode lines 110 and the third electrode lines 150 may correspond to word lines, and the second electrode lines 120a may correspond to bit lines. On the other hand, the first electrode lines 110 and the third electrode lines 150 may correspond to the bit lines, and the second electrode lines 120a may correspond to the word lines. If the first electrode lines 110 and the third electrode lines 150 correspond to the word lines, the first electrode lines 110 may correspond to bottom word lines, and the third electrode lines 150 may correspond to top word lines. In this case, since the second electrode lines 120a are shared by the bottom word lines and the top word lines, the second electrode lines 120a may correspond to common bit lines.

Materials of the first electrode lines 110 to the third electrode lines 150 are as described on the first electrode lines 110 and the second electrode lines 120 with reference to FIGS. 2 and 3. Also, a structure of the first electrode lines 110 is as described on the first electrode lines 110 with reference to FIGS. 2 and 3. A structure of the second electrode lines 120a is similar to that of the second electrode lines 120 of the memory device 100 illustrated in FIGS. 2 and 3, but since a plurality of second memory cells 130-2 are disposed in an upper portion, a third recess R3 may be formed in a top of each of the second electrode lines 120a and between the second memory cells 130-2 disposed in the second direction (the Y direction). The third recess R3 may be filled by a lower portion of a fourth insulation layer 146 disposed between the second memory cells 130-2.

The third electrode lines 150 may be formed in a damascene structure and may have a structure with a width being narrowed progressively from an upper portion to a lower portion. Also, similar to the second electrode lines 120a of which lower portions of both side surfaces may be covered by the second insulation layer 144, lower portions of both side surfaces of the third electrode lines 150 may be covered by the fourth insulation layer 146.

A first memory cell layer MCL1 may include a plurality of memory cells 130-1 (MC1 in FIG. 1) which are spaced apart from each other in the first direction (the X direction) and the second direction (the Y direction). A second memory cell layer MCL2 may include a plurality of memory cells 130-2 (MC2 in FIG. 1) which are spaced apart from each other in the first direction and the second direction. As illustrated, the first electrode lines 110 and the second electrode lines 120*a* may intersect each other, and the second electrode lines 120*a* and the third electrode lines 150 may intersect each other. The first memory cells 130-1 may be respectively disposed in portions located between the first electrode line layer 110L and the second electrode line layer 120L, and where the first electrode lines 110 and the second electrode lines 120*a* intersect each other. The second memory cells 130-2 may be respectively disposed in portions located between the second electrode line layer 120L and the third electrode line layer 150L, and where the second electrode lines 120*a* and the third electrode lines 150 intersect each other.

The first memory cells 130-1 and the second memory cells 130-2 may have a pillar structure having a tetragonal pillar shape like the memory cells 130 of the memory device 100 illustrated in FIGS. 2 and 3. The first memory cells 130-1 and the second memory cells 130-2 may have various pillar shapes such as, for example, a circular pillar, an elliptical pillar, a polygonal pillar, etc. without being limited to a tetragonal pillar. Also, as illustrated, the first memory cells 130-1 and the second memory cells 130-2 may have a structure with a lower portion being wider than an upper portion. For example, the first memory cells 130-1 and the second memory cells 130-2 may be formed through an etching process.

The first memory cells 130-1 may each include a bottom electrode layer 131-1, a selection device layer 133-1, a middle electrode layer 135-1, a variable resistance layer 137-1, and a top electrode layer 139-1. The second memory cells 130-2 may each include a bottom electrode layer 131-2, a selection device layer 133-2, a middle electrode layer 135-2, a variable resistance layer 137-2, and a top electrode layer 139-2. The bottom electrode layers 131-1 and 131-2, the selection device layers 133-1 and 133-2, the middle electrode layers 135-1 and 135-2, the variable resistance layers 137-1 and 137-2, and the top electrode layers 139-1 and 139-2 are as described on the bottom electrode layer 131, the selection device layer 133, the middle electrode layer 135, the variable resistance layer 137, and the top electrode layer 139 with reference to FIGS. 2 and 3.

A first insulation layer 142 may be disposed between the first electrode lines 110, and a second insulation layer 144 may be disposed between the first memory cells 130-1 of the first memory layer MCL1. Also, a third insulation layer 145*a* may be disposed between the second electrode lines 120*a*, and a fourth insulation layer 146 may be disposed between the second memory cells 130-2 of the second memory layer MCL2. A fifth insulation layer 148 may be disposed between the third electrode lines 150.

Materials or functions of the first to fifth insulation layers 142, 144, 145*a*, 146 and 148 are as described on the first to third insulation layers 142, 144 and 145 with reference to FIGS. 2 and 3. Also, structures of the first and second insulation layers 142 and 144 are as described on the first and second insulation layers 142 and 144 with reference to FIGS. 2 and 3. A structure of the third insulation layer 145*a* is similar to that of the third insulation layer 145 of the memory device 100 illustrated in FIGS. 2 and 3, but since the plurality of second memory cells 130-2 are disposed in the upper portion, a fourth recess R4 may be formed in a top of the third insulation layer 145*a* and between the second memory cells 130-2 disposed in the first direction (the X direction). The fourth recess R4 may be filled by the lower portion of the fourth insulation layer 146 disposed between the second memory cells 130-2.

Except that the fourth insulation layer 146 is disposed between the second memory cells 130-2, the fourth insulation layer 146 may have a structure similar to that of the second insulation layer 144. For example, the fourth insulation layer 146 may have a structure which surrounds lower portions of both side surfaces of the third electrode lines 150, and a recessed portion B may be formed in a top of the fourth insulation layer 146 between the third electrode lines 150. The recessed portion B may have a structure which extends in the first direction (the X direction), in which the third electrode lines 150 extend, and extends between the third electrode lines 150. Also, the recessed portion B may have a structure which is deepest recessed in a middle portion between four adjacent second memory cells 130-2. The reason that the recessed portion B is formed in the top of the fourth insulation layer 146 is as described on the recessed portion A of the second insulation layer 144 with reference to FIGS. 2 and 3.

The fifth insulation layer 148 may be formed in a structure which extends in the first direction (the X direction) between the third electrode lines 150, and may be provided in plurality in correspondence with the third electrode lines 150. Since the fifth insulation layer 148 is formed on the fourth insulation layer 146, a lower portion of the fifth insulation layer 148 may fill the recessed portion B of the fourth insulation layer 146.

A plurality of air gaps, instead of the second insulation layer 144 and/or the fourth insulation layer 146, may be formed between the first memory cells 130-1 and/or the second memory cells 130-2. If the air gaps are formed, an insulation liner having a certain thickness may be formed between the air gaps and the memory cells 130-1 and 130-2. Also, the recessed portions A and B corresponding to an upper structure of the second insulation layer 144 and/or the fourth insulation layer 146 may be formed in an upper structure of the insulation liner.

Hereinabove, the memory device 200 have been described as having a structure in which the memory cells 130 of the memory device 100 of FIGS. 2 and 3 are stacked in two layers, but a structure of the memory device 200 according to the present embodiment is not limited thereto. For example, the memory device 200 according to the present embodiment may be formed to have a structure in which the memory cells 130*a* to 130*c* of the memory devices 100*a* to 100*d* respectively illustrated in FIGS. 5 to 8 are stacked in two layers.

In the memory device 200 according to the present embodiment, since the first electrode lines 110 to the third electrode lines 150 are formed through a process which differs from a process of forming the memory cells 130-1 and 130-2, defects or contaminations of the memory cells 130-1 and 130-2 are prevented. Also, in the memory device 200 according to the present embodiment, since the second electrode lines 120*a* and the third electrode lines 150 are formed in the damascene structure, the second insulation layer 144 may be maintained on the first memory cells 130-1, and the fourth insulation layer 146 may be maintained on the second memory cells 130-2, thereby protecting the memory cells 130-1 and 130-2 and solving a problem which occurs when CMP is excessively performed or insufficiently performed on the second insulation layer 144 and the fourth insulation layer 146. With the second electrode lines 120*a* and the third electrode lines 150 formed by a damascene process, the third insulation layer 145*a* is formed on the second insulation layer 144, and then both the second and third insulation layers 144 and 145*a* are etched to form trenches for the second electrode lines 120*a*, similarly, the fifth insulation layer 147 is formed on the fourth insulation layer 146, and then both the fourth and fifth insulation layers 146 and 147 are etched to form trenches for the third electrode lines 150. There is no CMP process carried out on the second insulation layer 144 and the fourth insulation layer 146 during the damascene process. As a result, in the memory device 200 according to the present embodiment, defects or contaminations of the memory cells 130-1 and 130-2 are prevented, and a problem which occurs when the CMP is excessively performed or insufficiently performed on the second insulation layer 144 and the fourth insulation layer 146 is solved, thereby implementing a memory device which has a 3D cross-point stacked structure, a high degree of integration, and enhanced reliability.

Figure 17A:
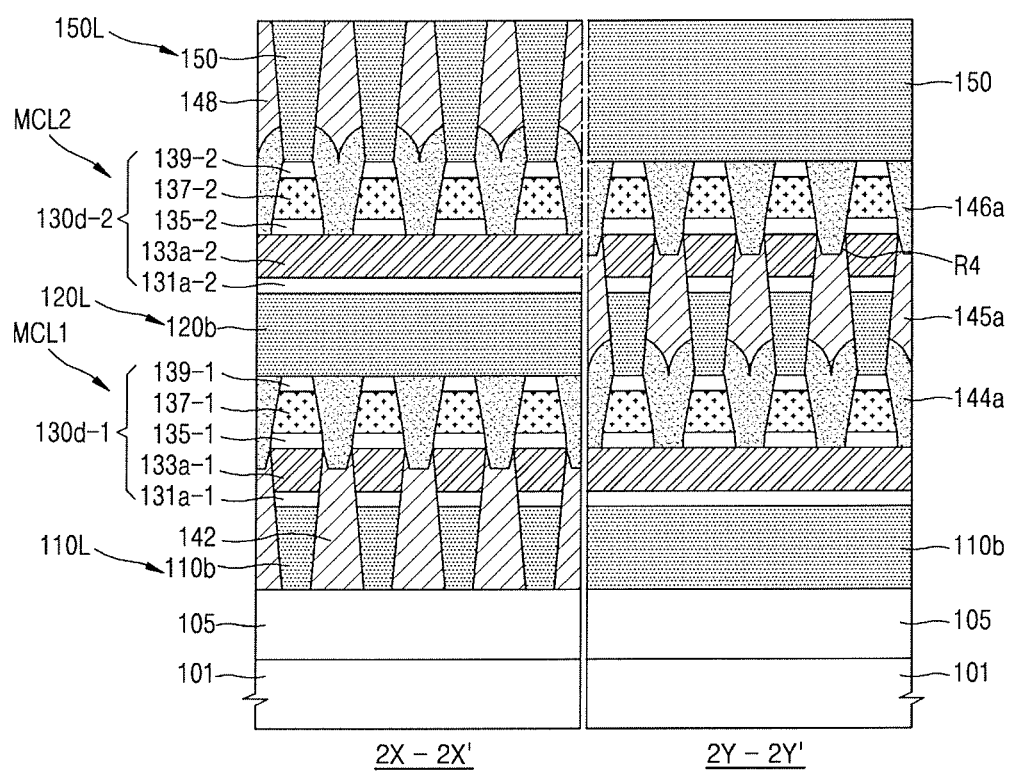
FIGS. 17A to 17B are cross-sectional views of memory devices according to exemplary embodiments of the inventive concept and correspond to the cross-sectional view of FIG. 16.
Figure 17B:
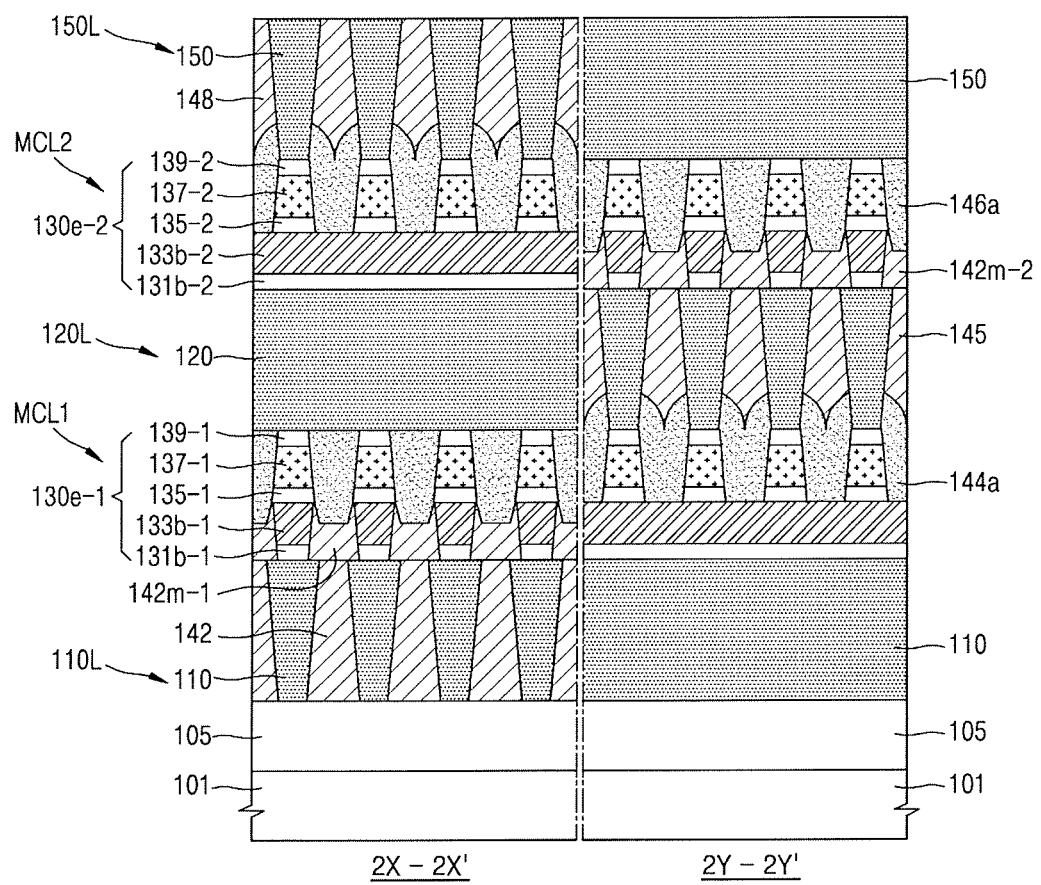

FIGS. 17A to 17B are cross-sectional views of memory devices according to exemplary embodiments of the inventive concept and correspond to the cross-sectional view of FIG. 16. The details described above with reference to FIGS. 2, 3, 15 and 16 will be briefly described or are omitted hereinafter.

Referring to FIG. 17A, a memory device 200a according to an exemplary embodiment of the inventive concept may have a two-layer structure including two memory cell layers MCL1 and MCL2 which are stacked, and for this reason, the memory device 200a is similar to the memory device 200 of FIG. 16. However, the memory cell 130d of the memory device 100e of FIG. 9 may be provided in a two-layer structure in the memory device 200a according to the present embodiment, and for this reason, the memory device 200a differs from the memory device 200 of FIG. 16.

To provide a detailed description, a plurality of first electrode lines 110b, a plurality of first memory cells 130d-1, and first to third insulation layers 142, 144a and 145a which are included in the memory device 200a according to the present embodiment may each have a structure which is substantially the same as that of the memory device 100e of FIG. 9. A fourth recess R4 may be formed in a top of the third insulation layer 145a.

A plurality of second electrode lines 120b may each have a thickness which is thinner than that of each of the second electrode lines 120 of the memory device 100e of FIG. 9. Also, a bottom electrode layer 131a-2 and a selection device layer 133a-2 which are included in each of the second memory cells 130d-2 may have a damascene structure and may be disposed on the second electrode lines 120b and between adjacent third insulation layers 145a. A middle electrode layer 135-2, a variable resistance layer 137-2, and a top electrode layer 139-2 which are included in each of the second memory cells 130d-2 may be disposed in a fourth insulation layer 146a. Since three layers are disposed in the fourth insulation layer 146a, the fourth insulation layer 146a may be thinner than the fourth insulation layer 146 of the memory device 200 of FIG. 16. A plurality of third electrode lines 150 may have a structure which is substantially the same as that of the third electrode lines 150 of the memory device 200 of FIG. 16, and a fifth insulation layer 148 may have a structure which is substantially the same as that of the fifth insulation layer 148 of the memory device 200 of FIG. 16.

In the memory device 200a according to the present embodiment, the bottom electrode layer 131a-1 and the selection device layer 133a-1 of each of the first memory cells 130d-1 and the bottom electrode layer 131a-2 and the selection device layer 133a-2 of each of the second memory cells 130d-2 may be formed in the damascene structure and may be disposed between the first insulation layer 142 and the third insulation layer 145a. In other word, the bottom electrode layers 131a-1 and 131a-2 and the selection device layers 133a-1 and 133a-2 may be respectively formed in trenches which are formed by removing a portion of an upper portion of each of the first electrode lines 110b and a portion of an upper portion of each of the second electrode lines 120b. Accordingly, a height of the memory device 200a according to the present embodiment may be reduced by a height corresponding to a thickness of the bottom electrode layers 131a-1 and 131a-2 and the selection device layers 133a-1 and 133a-2. As a result, in implementing a memory device having the 3D cross-point stacked structure, the memory device 200a according to the present embodiment may provide a good structure in terms of a degree of integration. Similar to the memory device 200, the second electrode lines 120b and the third electrode lines 150 of the memory device 200a may be formed through a damascene process.

Referring to FIG. 17B, a memory device 200b according to an exemplary embodiment of the inventive concept may have a two-layer structure including two memory cell layers MCL1 and MCL2 which are stacked, and a plurality of bottom electrode layers 131b-1 and 131b-2 and a plurality of selection device layers 133b-1 and 133b-2 may have the damascene structure. For this reason, the memory device 200b is similar to the memory device 200a of FIG. 17A. However, the memory cell 130e of the memory device 100f of FIG. 10 may be provided in the two-layer structure in the memory device 200b according to the present embodiment, and for this reason, the memory device 200b differs from the memory device 200a of FIG. 17A.

A plurality of first electrode lines 110 and second electrode lines 120, a plurality of first memory cells 130e-1, first to third insulation layers 142, 144a and 145, and a first mold insulation layer 142m-1 may each have a structure which is substantially the same as that of the memory device 100f of FIG. 10. Also, a second mold insulation layer 142m-2 may be disposed on the second electrode lines 120 and the third insulation layer 145, and the bottom electrode layer 131b-2 and the selection device layer 133b-2 of each of the second memory cells 130e-2 may be disposed in the damascene structure in the second mold insulation layer 142m-2. Also, a middle electrode layer 135-2, a variable resistance layer 137-2, and a top electrode layer 139-2 which are included in each of the second memory cells 130e-2 may be disposed in a fourth insulation layer 146a. Since three layers are disposed in the fourth insulation layer 146a, the fourth insulation layer 146a may be thinner than the fourth insulation layer 146 of the memory device 200 of FIG. 16. A plurality of third electrode lines 150 have a structure which is substantially the same as that of the third electrode lines 150 of the memory device 200 of FIG. 16, and a fifth insulation layer 148 may have a structure which is substantially the same as that of the fifth insulation layer 148 of the memory device 200 of FIG. 16. Similar to the memory device 200, the second electrode lines 120 and the third electrode lines 150 of the memory device 200b may be formed through a damascene process.

In the memory device 200b according to the present embodiment, the second insulation layer 144a and the fourth insulation layer 146a may be thinly formed, but the first mold insulation layer 142m-1 and the second mold insulation layer 142m-2 may be additionally disposed. Accordingly, a height of the memory device 200b according to the present embodiment may be substantially the same as that of the memory device 200 of FIG. 16.

Hereinabove, the memory devices 200a and 200b have been described as having a structure in which the memory cells 130*d* of the memory device 100*e* of FIG. 9 or the memory cells 130*e* of the memory device 100*f* of FIG. 10 are stacked in two layers, but structures of the memory devices 200*a* and 200*b* according to the present embodiment are not limited thereto. For example, the memory devices 200*a* and 200*b* according to the present embodiment may be formed in a structure in which the memory cells 130*f* to 130*i* of the memory devices 100*g* to 100*k* respectively illustrated in FIGS. 11 to 14B are stacked in two layers.

The technical spirit of the inventive concept is not limited to the above-described memory devices 200, 200*a* and 200*b*. For example, the technical spirit of the inventive concept may be applied to all kinds of memory devices including a two-layer cross-point stacked structure and a structure in which memory cells are patterned separately from electrode lines, electrode lines disposed on the memory cells are formed in a damascene structure, and an insulation layer between adjacent memory cells surrounds lower portions of both side surfaces of the electrode lines.

Figure 18:
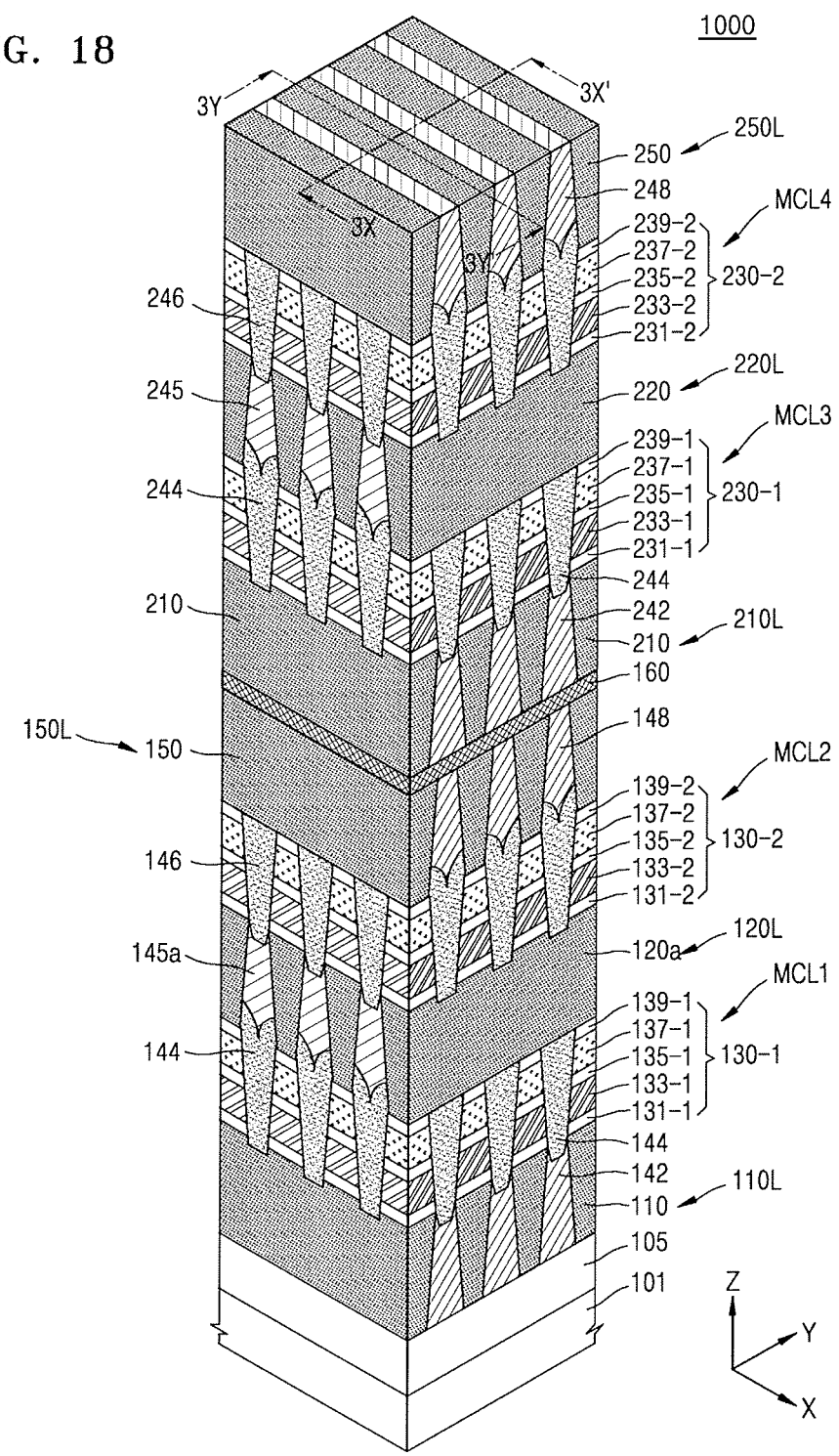
FIG. 18 is a perspective view of a memory device according to an exemplary embodiment of the inventive concept.
Figure 19:
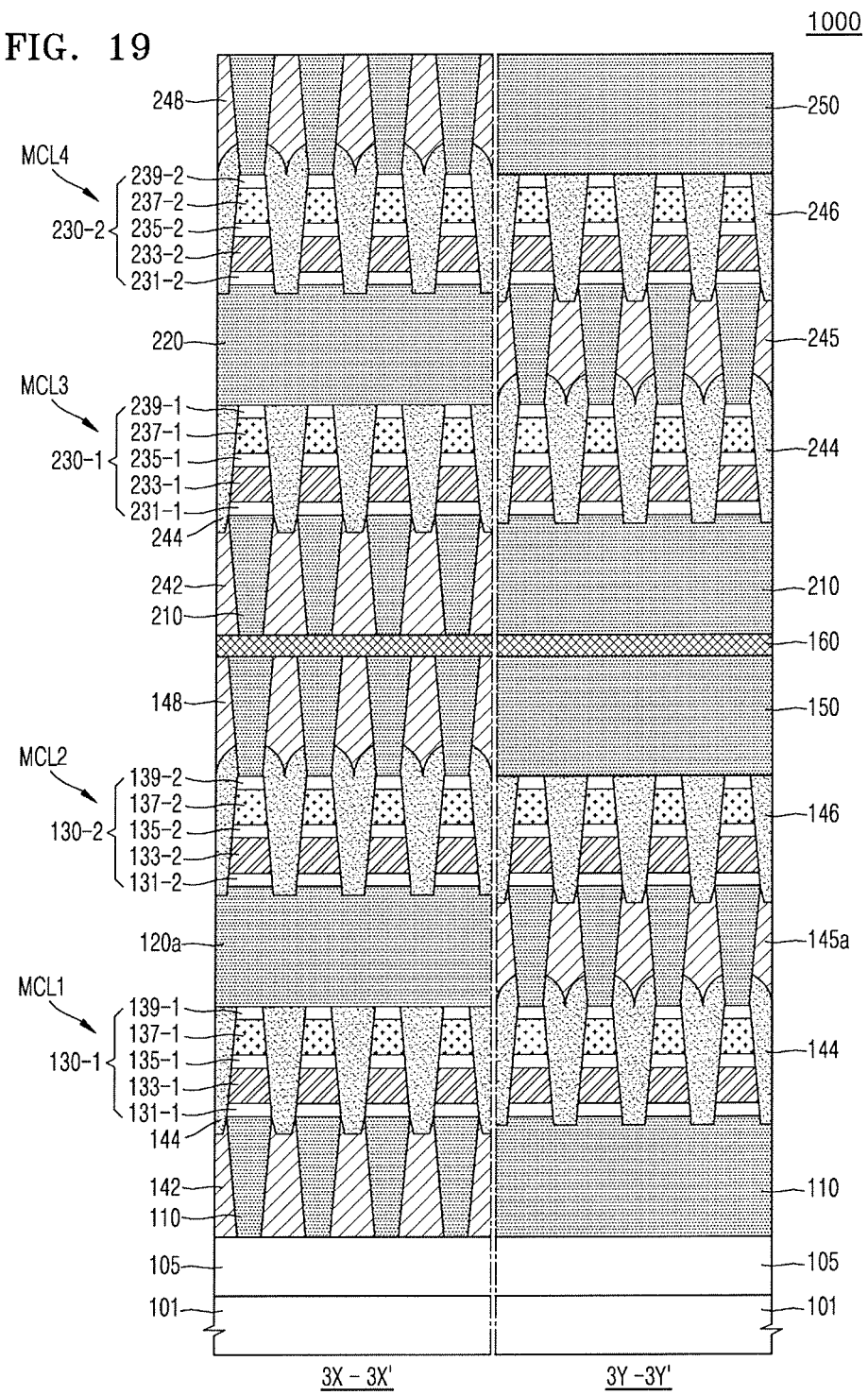
FIG. 19 is a cross-sectional view taken along line 3X-3X' and line 3Y-3Y' of FIG. 18.

FIG. 18 is a perspective view of a memory device according to an exemplary embodiment of the inventive concept, and FIG. 19 is a cross-sectional view taken along line 3X-3X' and line 3Y-3Y' of FIG. 18. FIG. 19 illustrates insulation layers which are slightly enlarged in the X direction and the Y direction and shown in an outer portion. The details described above with reference to FIGS. 2, 3, 15 and 16 will be briefly described or are omitted hereinafter.

Referring to FIGS. 18 and 19, the memory device 1000 according to the present embodiment may have a four-layer structure including four memory cell layers MCL1 to MCL4 which are stacked. In detail, a first memory cell layer MCL1 may be disposed between a first electrode line layer 110L and a second electrode line layer 120L, and a second memory cell layer MCL2 may be disposed between the second electrode line layer 120L and a third electrode line layer 150L. A second interlayer insulation layer 160 may be formed on the third electrode line layer 150L, and a first top electrode line layer 210L, a second top electrode line layer 220L, and a third top electrode line layer 250L may be disposed on the second interlayer insulation layer 160. The first top electrode line layer 210L may include a plurality of first top electrode lines 210 having a structure which is the same as that of the first electrode lines 110, the second top electrode line layer 220L may include a plurality of second top electrode lines 220 having a structure which is the same as that of the second electrode lines 120, and the third top electrode line layer 250L may include a plurality of third top electrode lines 250 having a structure which is the same as that of the third electrode lines 150 or the first electrode lines 110. A first top memory cell layer MCL3 may be disposed between a first top electrode line layer 210L and a second top electrode line layer 220L, and a second top memory cell layer MCL4 may be disposed between the second top electrode line layer 220L and a third top electrode line layer 250L.

The first electrode line layer 110L to the third electrode line layer 150L, the first memory cell MCL1, and the second memory cell layer MCL2 are as described above with reference to FIGS. 15 and 16. Except for being disposed on the second interlayer insulation layer 160 instead of the interlayer insulation layer 105, the first top electrode line layer 210L to the third top electrode line layer 250L, the first top memory cell layer MCL3, and the second top memory cell layer MCL4 may also be substantially the same as the first electrode line layer 110L to the third electrode line layer 150L, the first memory cell layer MCL1, and the second memory cell layer MCL2. Thus, detailed descriptions of the elements are omitted.

The memory device 1000 according to the present embodiment may generally have a structure in which the memory device 200 having a two-layer structure illustrated in FIGS. 15 and 16 is repeatedly stacked with the second interlayer insulation layer 160 interposed therebetween. However, a structure of the memory device 1000 according to the present embodiment is not limited thereto. For example, the memory device 1000 according to the present embodiment may have a structure in which the memory devices 200*a* and 200*b* having a two-layer structure respectively illustrated in FIGS. 17A and 17B are repeatedly stacked with the second interlayer insulation layer 160 interposed therebetween. Also, the memory device 1000 according to the present embodiment may have a structure, in which the memory cells 130*a* to 130*c* of the memory devices 100*a* to 100*d* respectively illustrated in FIGS. 5 to 8 are stacked in two layers, is repeatedly stacked with the second interlayer insulation layer 160 interposed therebetween, or may have a structure, in which the memory cells 130*f* to 130*i* of the memory devices 100*g* to 100*k* respectively illustrated in FIGS. 11 to 14B are stacked in two layers, is repeatedly stacked with the second interlayer insulation layer 160 interposed therebetween.

The memory device 1000 according to the present embodiment may have a four-layer structure including four memory cell layers MCL1 to MCL4, but the technical spirit of the inventive concept is not limited thereto. For example, the technical spirit of the inventive concept may be applied to all kinds of memory devices including: a 3D cross-point stacked structure and a structure in which at least three memory devices having a two-layer structure are stacked with an interlayer insulation layer interposed between adjacent memory devices, memory cells are patterned separately from electrode lines, electrode lines disposed on the memory cells are formed in a damascene structure, and an insulation layer between adjacent memory cells surrounds lower portions of both side surfaces of the electrode lines.

FIGS. 20A to 20D are perspective views schematically illustrating a process of manufacturing the memory device of FIG. 2, according to an exemplary embodiment of the inventive concept.

Figure 20A:
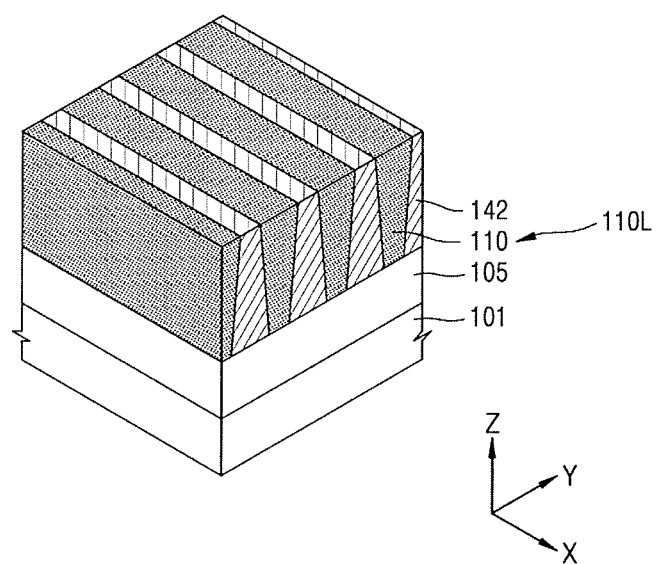
FIGS. 20A to 20D are perspective views schematically illustrating a process of manufacturing the memory device of FIG. 2, according to an exemplary embodiment of the inventive concept.

Referring to FIG. 20A, first, a first electrode line layer 110L including a plurality of first electrode lines 110 which extend in the first direction (the X direction) and are spaced apart from each other may be formed on an interlayer insulation layer 105 of a substrate 101. The first electrode lines 110 may be formed through a damascene process. Therefore, the first electrode lines 110 may have a structure which is narrowed progressively from an upper portion to a lower portion. Materials of the first electrode lines 110 are as described above with reference to FIGS. 2 and 3. A first insulation layer 142 extending in the first direction may be disposed between the first electrode lines 110.

The first electrode lines 110 may be formed through an etching process. When the first electrode lines 110 are formed through the etching process, the first electrode lines 110 may have a structure which is widened progressively from the upper portion to the lower portion.

Figure 20B:
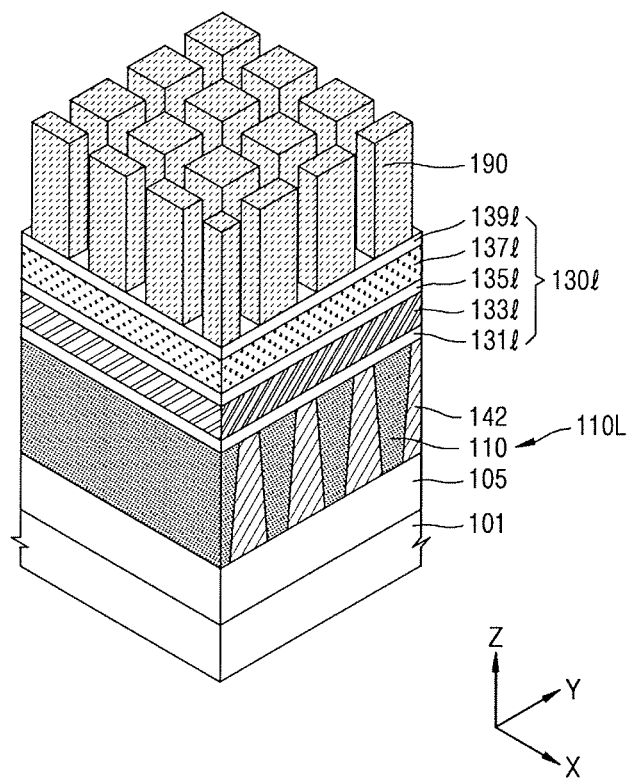

Referring to FIG. 20B, a stacked structure 1301 may be formed by sequentially stacking a bottom electrode material layer 131*l*, a selection device material layer 133*l*, a middle electrode material layer 135*l*, a variable resistance material layer 137*l*, and a top electrode material layer 139*l* on the first electrode line layer 110L and the first insulation layer 142.

A material or a function of each of the material layers configured in the stacked structure 1301 is as described above with reference to FIGS. 2 and 3.

An island-type mask pattern 190 including island type mask features which are spaced apart from each other in the first direction (the X direction) and the second direction (the Y direction) may be formed on the top electrode material layer 139l. Depending on the case, a line-type mask pattern including line type mask features which extend in the first direction or the second direction may be formed on the top electrode material layer 139l. The island-type mask pattern 190 or the line-type mask pattern may be a photoresist pattern, and may be formed through a lithographic process.

Figure 20C:
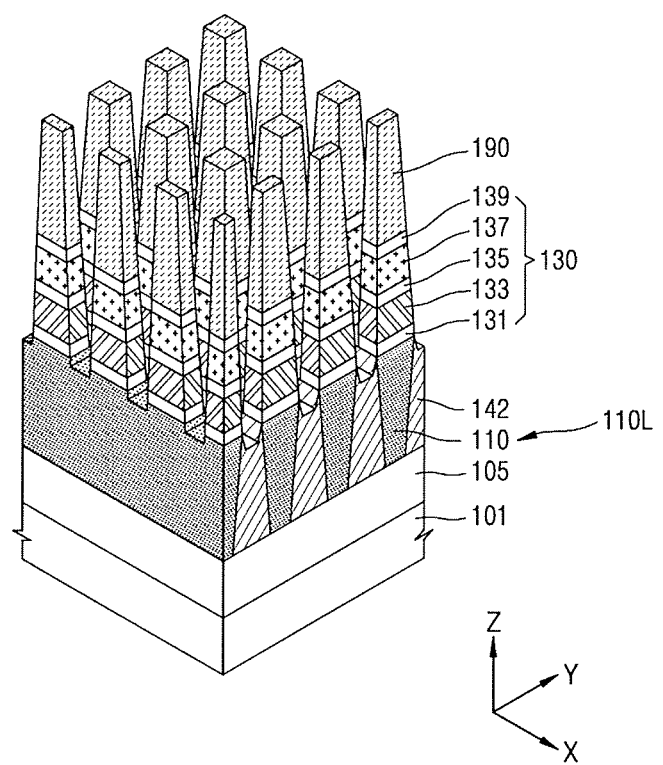

Referring to FIG. 20C, a plurality of memory cells 130 may be formed by etching the stacked structure 1301 with the mask pattern 190 to expose a portion of a top of each of the first insulation layer 142 and the first electrode lines 110. The memory cells 130 may be spaced apart from each other in the first direction and the second direction based on a structure of the mask pattern 190 and may be electrically connected to the first electrode lines 110 disposed in a lower portion. The memory cells 130 may each include a bottom electrode layer 131, a selection device layer 133, a middle electrode layer 135, a variable resistance layer 137, and a top electrode layer 139.

After the memory cells 130 are formed, the remaining mask pattern 190 may be removed through an ashing and/or strip process.

Figure 20D:
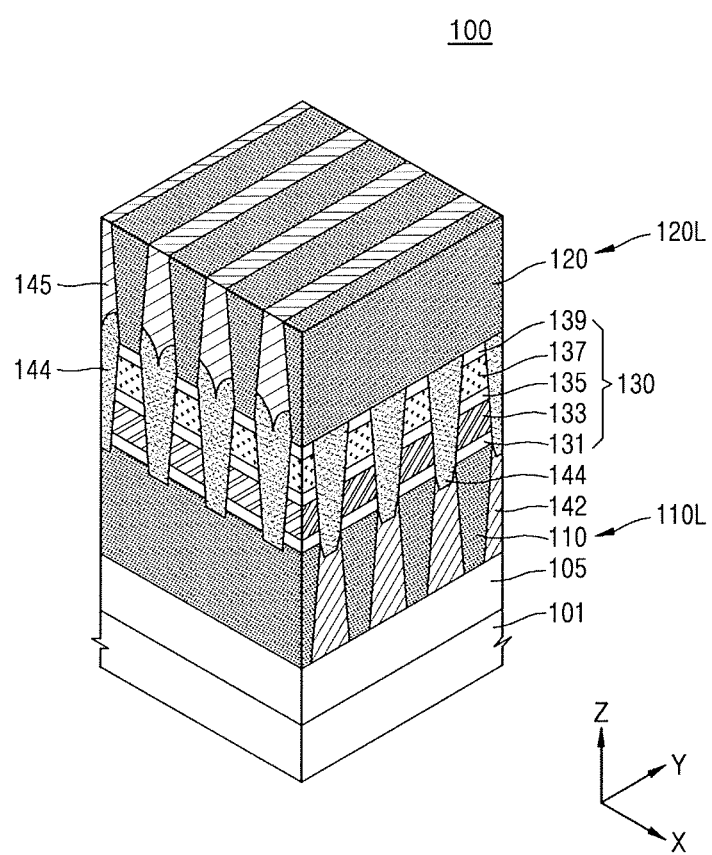

Referring to FIG. 20D, a second electrode line layer 120L including a plurality of second electrode lines 120 which extend in the second direction (the Y direction) and are spaced apart from each other in the first direction may be formed on the memory cells 130. The second electrode lines 120 may be formed through a damascene process. Since the second electrode lines 120 are formed through the damascene process, a structure of the second insulation layer 144 may be formed. For example, lower portions of both side surfaces of the second electrode lines 120 may be covered by the second insulation layer 144. Also, a recessed portion (A of FIG. 3) may be formed in a top of the second insulation layer 144. A detailed process of forming the second electrode lines 120 will be described in detail with reference to FIGS. 23A to 23K.

In a process of manufacturing the memory device 100 according to the present embodiment, the memory cells 130 are formed separately from the first electrode lines 110 and the second electrode lines 120, thereby solving problems which occur when the memory cells 130 may be formed along with the first electrode lines 110 and/or the second electrode lines 120. Also, the second electrode lines 120 may be formed through the damascene process, which does not include applying a CMP process on the insulation layer disposed on the memory cells 130, thereby avoiding complications with CMP excessively or insufficiently applied.

For reference, unlike a process of manufacturing the memory device 100 according to the present embodiment, the memory cells 130 may be patterned along with the first electrode lines 110 and the second electrode lines 120. For example, the memory cells 130 may be patterned simultaneously with patterning the first electrode line 110 by using a line-type first mask, and thus, the memory cells 130 may be formed in a structure in which the memory cells 130 extend in the first direction (the X direction) and are spaced apart from each other in the second direction (the Y direction). Subsequently, gaps between the first electrode lines 110 and the memory cells 130 may be filled with the insulation layer and may be planarized through CMP. A conductive layer for the second electrode lines may be formed on the memory cells 130 and the insulation layer, and the conductive layer and the memory cells 130 may be etched to form a structure, in which the conductive layer and the memory cells 130 extend in the second direction (the Y direction) and are spaced apart from each other in the first direction (the X direction), by using a line-type second mask.

The manufacturing process described above has the following problems. First, after etching in the first direction (the X direction) and gap-filling are performed, different layers are etched in performing etching in the second direction (the Y direction), and for this reason, an etch stringer occurs, causing a bridge defect at places where adjacent memory cells are connected to each other. Second, a side surface of each of a variable resistance layer and a selection device layer is exposed when etching first electrode lines (e.g., word lines) or second electrode lines (e.g., bit lines), and for this reason, the variable resistance layer and the selection device layer are etch-damaged and contaminated. Third, metal is re-deposited on a side surface of each of a variable resistance layer and a selection device layer when patterning a metal layer such as first electrode lines or second electrode lines, causing metallic short between the variable resistance layer and the selection device layer. Fourth, a margin of a CMP process performed on an insulation layer is not sufficient when forming second electrode lines (e.g., bit lines) after memory cells are etched. For this reason, when CMP is excessively performed, a defect may occur at the place where a top electrode layer is removed, and when the CMP is insufficiently performed, a contact defect may occur between the top electrode layer and the second electrode lines. Fifth, since first electrode lines or second electrode lines and memory cells are etched together, it is difficult to adjust a critical dimension (CD) or a height for enhancing a W/L resistance and a B/L resistance.

In the process of manufacturing the memory device 100 according to the present embodiment, the first electrode lines 110 and the second electrode lines 120 may be formed through a process which differs from a process of forming the memory cells 130, and the second electrode lines 120 may be formed in the damascene structure, thereby solving the problems. In other words, since the memory cells 130 are etched simultaneously in the first direction (the X direction) and the second direction (the Y direction) when patterning the memory cells 130, a stringer defect cannot occur. Also, since an etching process is performed on the memory cells 130 separately from electrode lines which are metal layers, a defect such as metal contamination or re-deposition cannot occur. In addition, since the electrode lines are formed separately from the memory cells 130, the desired resistance characteristic of the electrode lines is easily adjusted by controlling a height or a CD. Also, since both of a damascene process and an etching process can be performed, a material having a desired resistivity may be variously selected and used as a metal material.

FIGS. 21A to 21K are cross-sectional views schematically illustrating a process of manufacturing the memory device of FIG. 2 or 15, according to an exemplary embodiment of the inventive concept and correspond to the cross-sectional view of FIG. 3 or 16.

Figure 21A:
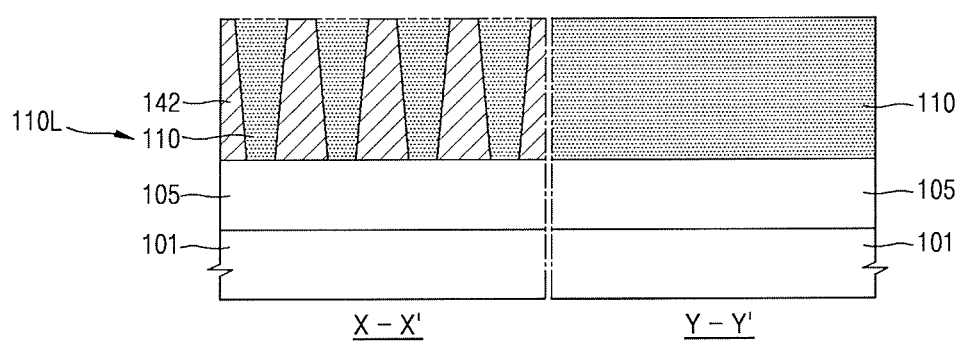
FIGS. 21A to 21K are cross-sectional views schematically illustrating a process of manufacturing the memory device of FIG. 2 or 15, according to an exemplary embodiment of the inventive concept and correspond to the cross-sectional view of FIG. 3 or 16.

Referring to FIG. 21A, first, a first electrode line layer 110L including a plurality of first electrode lines 110 which extend in the first direction (the X direction) and are spaced apart from each other in the second direction (the Y direction) may be formed on an interlayer insulation layer 105 of a substrate 101. The first electrode lines 110 may be formed through a damascene process. Therefore, the first electrode lines 110 may have a structure which is narrowed progressively from an upper portion to a lower portion. Materials of the first electrode lines 110 are as described above with reference to FIGS. 2 and 3. A first insulation layer 142 extending in the first direction may be disposed between the first electrode lines 110.

The first electrode lines 110 may be formed through an etching process. When the first electrode lines 110 are formed through the etching process, the first electrode lines 110 may have a structure which is widened progressively from the upper portion to the lower portion.

Figure 21B:
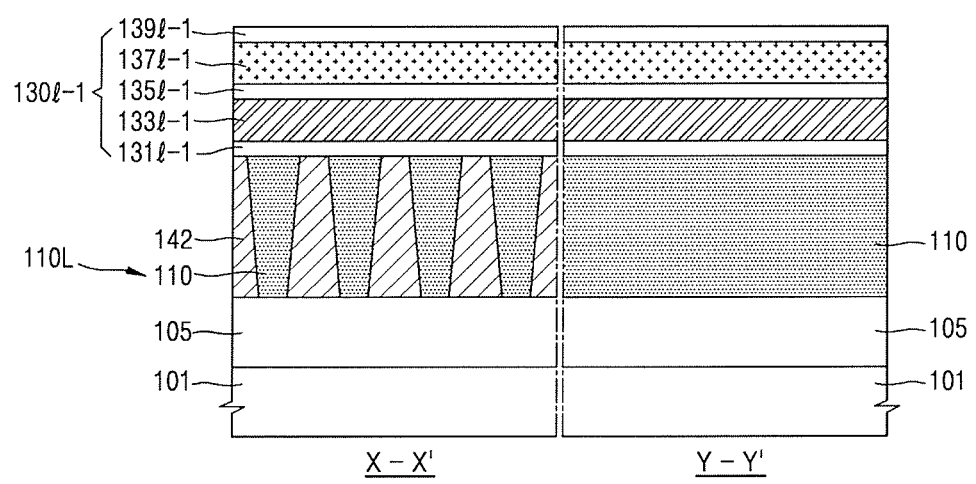

Referring to FIG. 21B, a first stacked structure 1301-1 may be formed by sequentially stacking a bottom electrode material layer 131*l*-1, a selection device material layer 133*l*-1, a middle electrode material layer 135*l*-1, a variable resistance material layer 137*l*-1, and a top electrode material layer 139*l*-1 on the first electrode line layer 110L and the first insulation layer 142. A material or a function of each of the material layers configured in the first stacked structure 1301-1 is as described above with reference to FIGS. 2 and 3.

Figure 21C:
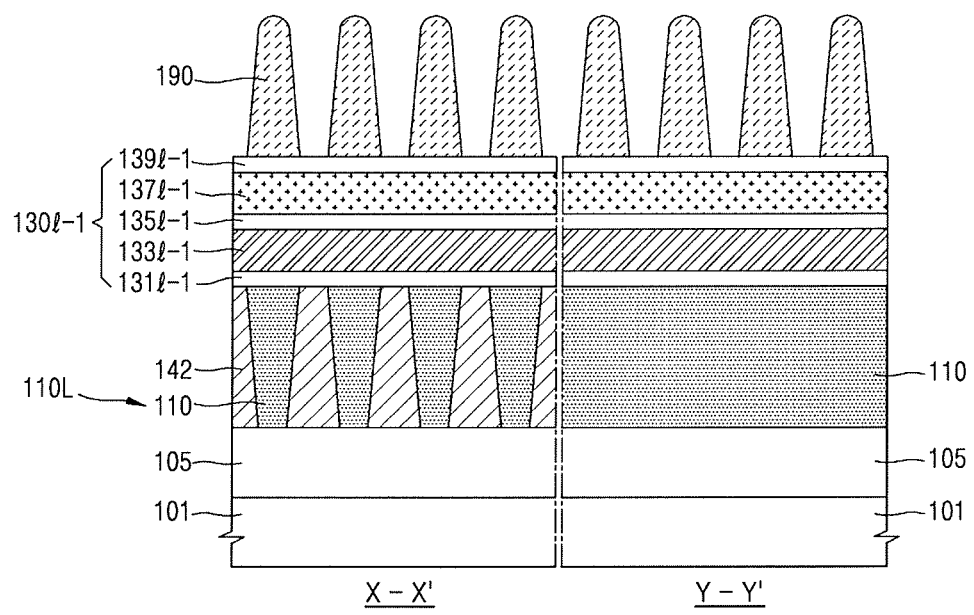

Referring to FIG. 21C, an island-type mask pattern 190 having island type mask features which are spaced apart from each other in the first direction (the X direction) and the second direction (the Y direction) may be formed on the top electrode material layer 139*l*-1.

Figure 21D:
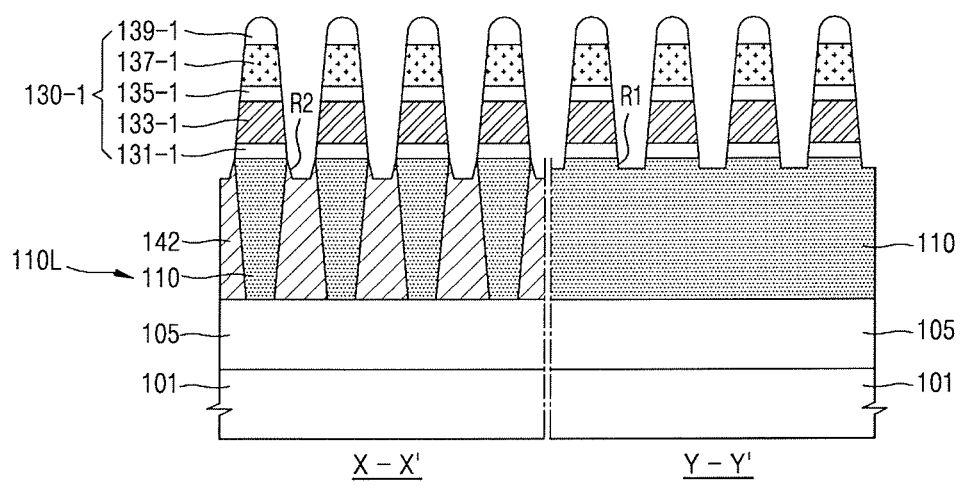

Referring to FIG. 21D, a plurality of first memory cells 130-1 may be formed by etching the first stacked structure 1301-1 with the mask pattern 190 to expose a portion of a top of each of the first insulation layer 142 and the first electrode lines 110. The first memory cells 130-1 may be spaced apart from each other in the first direction and the second direction based on a structure of the mask pattern 190, and may be electrically connected to the first electrode lines 110 disposed in a lower portion. The first memory cells 130-1 may each include a bottom electrode layer 131-1, a selection device layer 133-1, a middle electrode layer 135-1, a variable resistance layer 137-1, and a top electrode layer 139-1.

A first recess R1 may be formed in a top of each of the first electrode lines 110 between two adjacent first memory cells 130-1. Also, a second recess R2 may be formed in a top of each of the first insulation layer 142 between two adjacent first memory cells 130-1. A portion of a top of each of the first electrode lines 110 and the first insulation layer 142 may be etched when etching the first stacked structure 1301-1, and thus, the first recess R1 and the second recess R2 may be formed.

After the first memory cells 130-1 are formed, the remaining mask pattern 190 may be removed through an ashing and/or strip process.

Figure 21E:
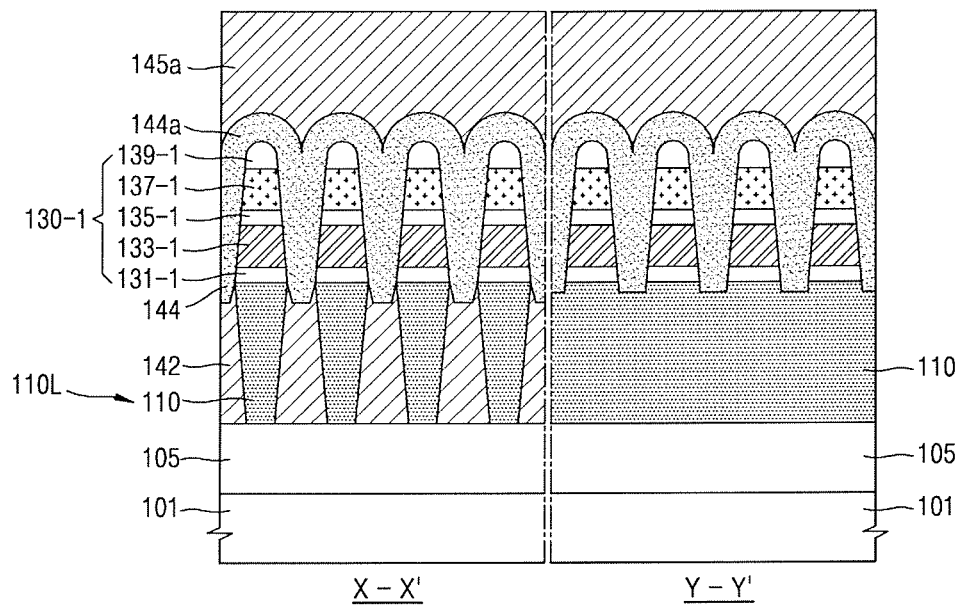

Referring to FIG. 21E, after the mask pattern 190 is removed, a second insulation material layer 144*a* filling gaps between the first memory cells 130-1 and covering the top of each of the first memory cells 130-1 may be formed. Due to the deposition process, the top of the second insulation material layer 144*a* may have a structure which is embossed over (bulged out) the tops of the plurality of first memory cells 130-1, and is recessed over the gaps between adjacent first memory cells 130-1. A third insulation material layer 145*a* may be formed on the second insulation material layer 144*a*, and then, a top of the third insulation material layer 145*a* may be planarized through a planarization process such as CMP.

Figure 21F:
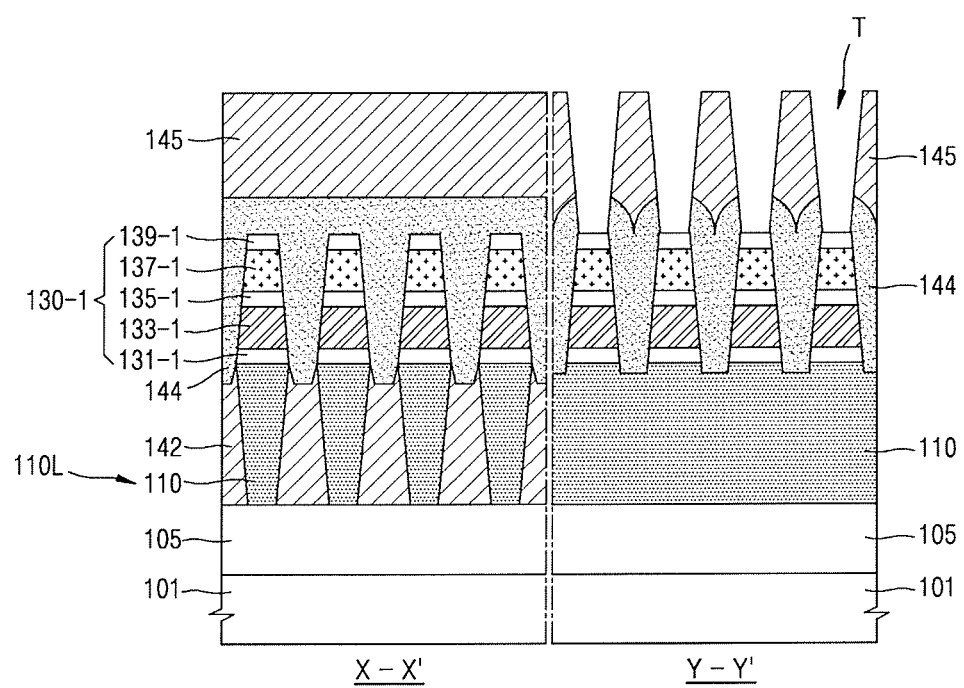

Referring to FIG. 21F, after the third insulation material layer 145*a* is planarized, a plurality of line-type trenches T may be formed in the third insulation material layer 145*a* by using a line-type mask pattern including line type mask features which extend in the second direction (the Y direction). By forming the trenches T, a second insulation layer 144 and a third insulation layer 145 may be formed.

A top of the top electrode layer 139-1 and a top of the second insulation layer 144 may be exposed to a bottom of each of the trenches T. Also, the second insulation layer 144 may be exposed to a lower portion of each of both side walls of the trenches T, and the third insulation layer 145 may be exposed to an upper portion of each of the both side walls.

Figure 21G:
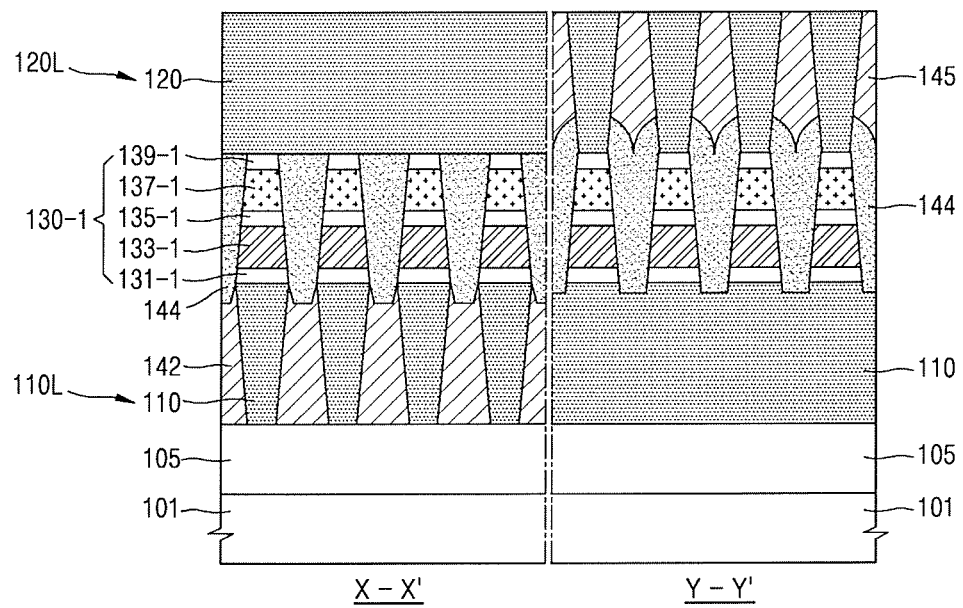

Referring to FIG. 21G, a second electrode line layer 120L including a plurality of second electrode lines 120 may be formed by filling a conductive material layer into the trenches T. In detail, the conductive material layer may be thickly formed to fully fill the trenches T, and then, the second electrode lines may be formed by planarizing the conductive material layer through CMP and/or the like in order for a top of the third insulation layer 145 to be exposed. A structure of the memory device 100 of FIG. 2 may be finished by forming the second electrode line layer 120L.

Figure 21H:
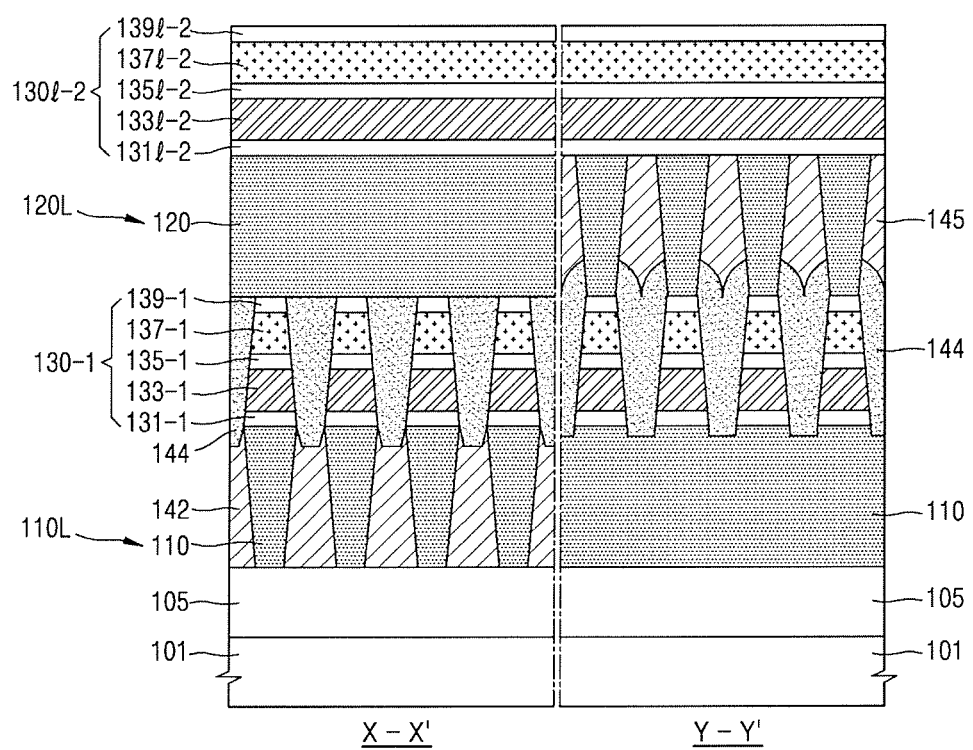

Referring to FIG. 21H, after the second electrode line layer 120L is formed, a second stacked structure 1301-2 may be formed by sequentially stacking a bottom electrode material layer 131*l*-2, a selection device material layer 133*l*-2, a middle electrode material layer 135*l*-2, a variable resistance material layer 137*l*-2, and a top electrode material layer 139*l*-2 on the second electrode line layer 120L and the third insulation layer 145. A material or a function of each of the material layers configured in the second stacked structure 1301-2 is as described above with reference to FIGS. 2 and 3.

Figure 21I:
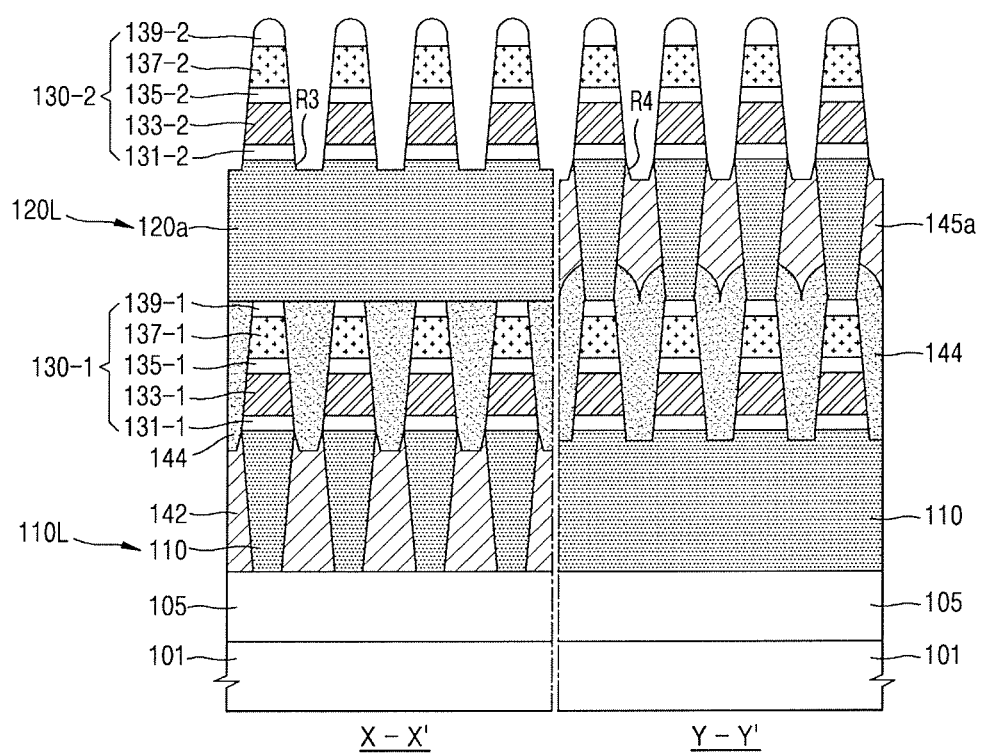

Referring to FIG. 21I, as described above with reference to FIG. 21C, an island-type mask pattern having island type mask features which are spaced apart from each other in the first direction (the X direction) and the second direction (the Y direction) may be formed on the top electrode material layer 139*l*-2, and a plurality of second memory cells 130-2 may be formed by etching the second stacked structure 1301-2 with the mask pattern. The second memory cells 130-2 may be spaced apart from each other in the first direction and the second direction and may be electrically connected to the second electrode lines 120*a* disposed in a lower portion. The second memory cells 130-2 may each include a bottom electrode layer 131-2, a selection device layer 133-2, a middle electrode layer 135-2, a variable resistance layer 137-2, and a top electrode layer 139-2.

A third recess R3 may be formed in a top of each of the second electrode lines 120*a* between the second memory cells 130-2. Also, a fourth recess R4 may be formed in a top of each of the third insulation layer 145*a* between the second memory cells 130-2. A portion of a top of each of the second electrode lines 120 and the third insulation layer 145*a* may be etched when etching the second stacked structure 1301-2, and thus, the third recess R3 and the fourth recess R4 may be formed.

After the second memory cells 130-2 are formed, the remaining mask pattern may be removed through an ashing and/or strip process.

Figure 21J:
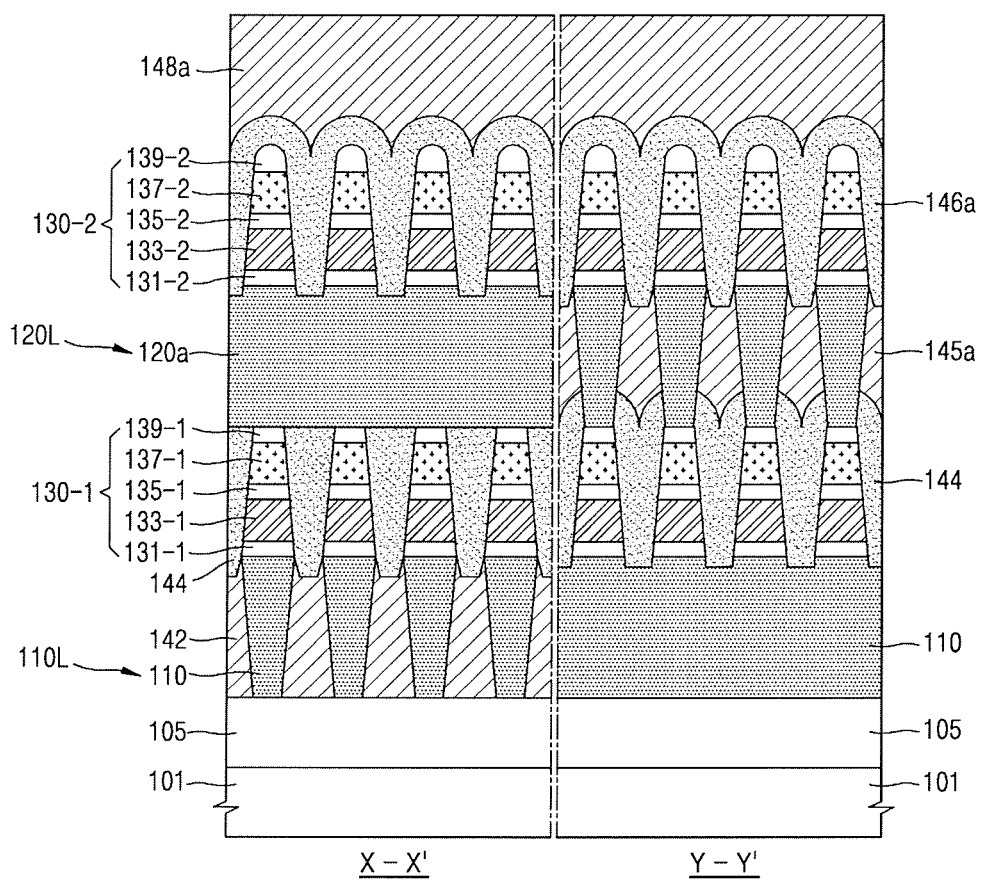

Referring to FIG. 21J, after the mask pattern is removed, a fourth insulation material layer 146*a* filling gaps between the second memory cells 130-2 and covering the top of each of the second memory cells 130-2 may be formed. A fifth insulation material layer 148*a* may be formed on the fourth insulation material layer 146*a*, and then, a top of the fifth insulation material layer 148a may be planarized through a planarization process such as CMP.

Figure 21K:
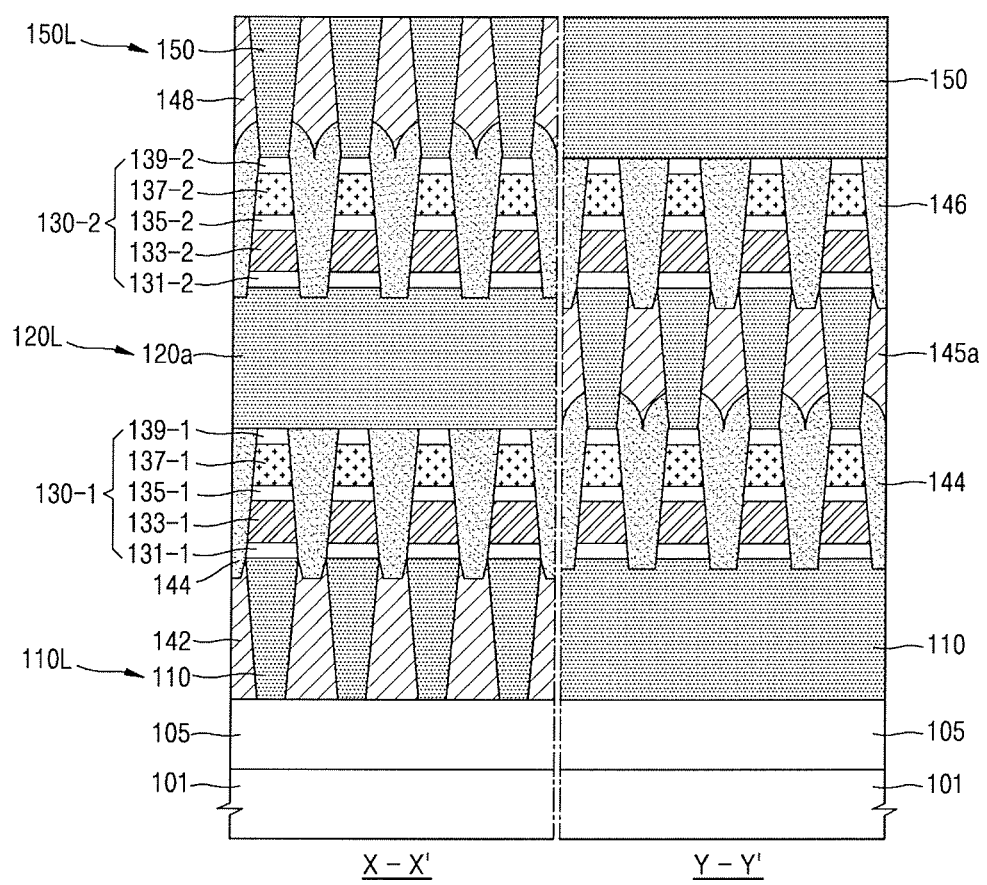

Referring to FIG. 21K, after the fifth insulation material layer 148a is planarized, a plurality of line-type trenches may be formed in the fifth insulation material layer 148a by using a line-type mask pattern having line type mask features which extend in the first direction (the X direction), and a third electrode line layer 150L including a plurality of third electrode lines 150 may be formed by filling a conductive material layer into the trenches. By forming the trenches, a fourth insulation layer 146 and a fifth insulation layer 148 may be formed.

A structure of the memory device 200 of FIG. 15 may be finished by forming the third electrode line layer 150L. A second interlayer insulation layer (160 of FIG. 18) may be formed on the third electrode line layer 150L and the fifth insulation layer 148, and by repeatedly performing the processes of FIGS. 21A to 21K on the second interlayer insulation layer, a memory device having a four-layer structure including four memory cell layers may be obtained. Also, a plurality of interlayer insulation layers may be provided, and by repeatedly performing the processes, a memory device having a structure including six or more layers may be obtained.

FIGS. 22A to 22D are cross-sectional views schematically illustrating a process of manufacturing the memory device of FIG. 2 or 15 according to an exemplary embodiment of the inventive concept, correspond to the cross-sectional views of FIG. 3 or 16, and shows another method of forming the first memory cells 130-1 of FIG. 21D. The details described above with reference to FIGS. 21A to 21K will be briefly described or are omitted hereinafter.

Figure 22A:
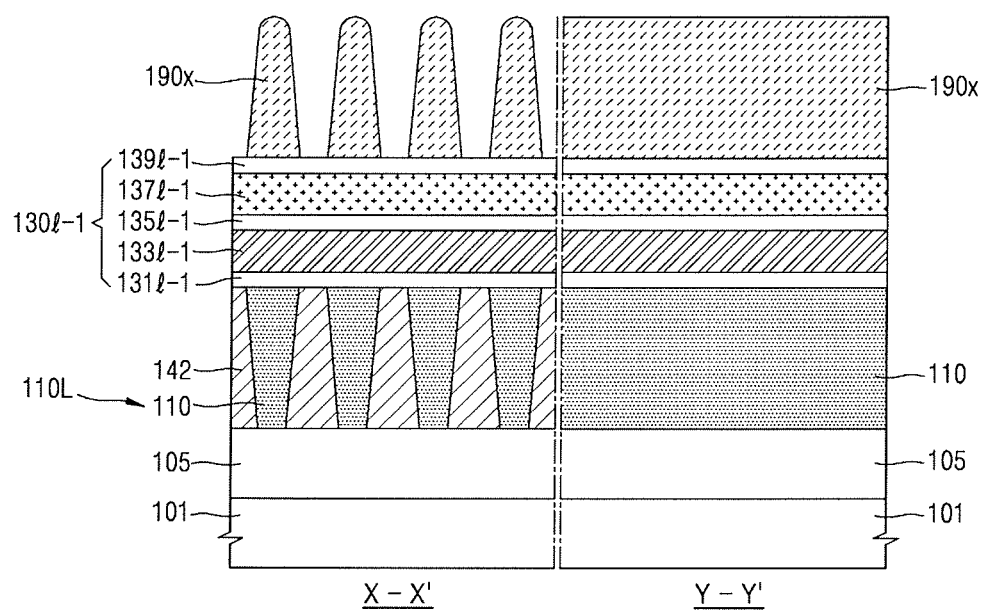
FIGS. 22A to 22D are cross-sectional views schematically illustrating a process of manufacturing the memory device of FIG. 2 or 15, according to an exemplary embodiment of the inventive concept.

Referring to FIG. 22A, as in FIG. 21B, a first stacked structure 130l-1 may be formed on a first electrode line layer 110L and a first insulation layer 142, and then, a line-type first mask pattern 190x having line type mask features which extend in the first direction (the X direction) and are spaced apart from each other in the second direction (the Y direction) may be formed on a top electrode material layer 139l-1.

Figure 22B:
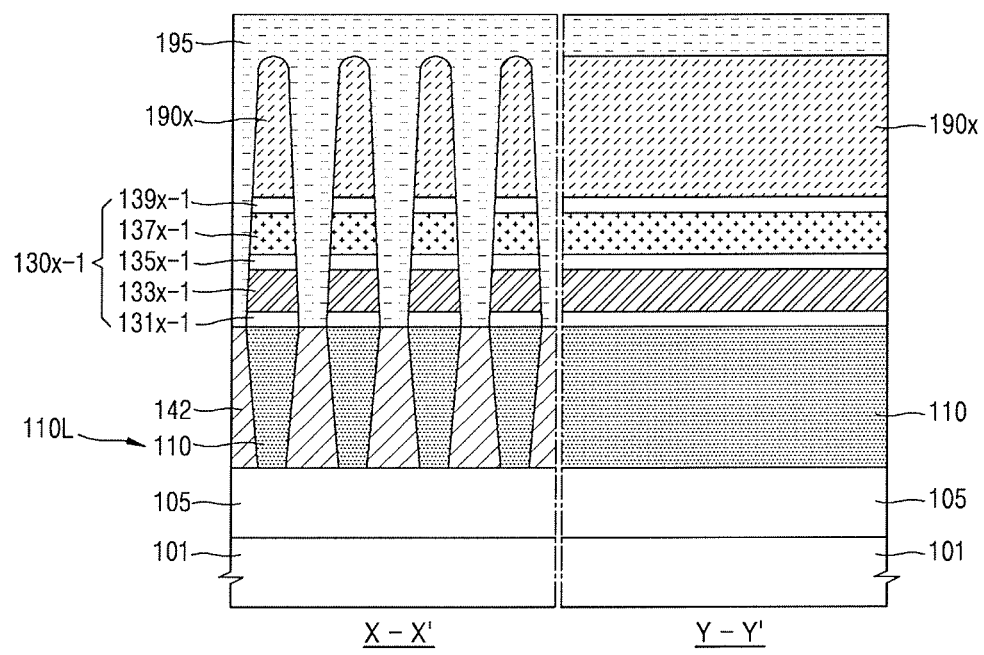

Referring to FIG. 22B, a plurality of first line stacked structures 130x-1 may be formed by etching the first stacked structure 130l-1 with the first mask pattern 190x to expose a portion of a top of each of the first insulation layer 142 and a plurality of first electrode lines 110. The first line stacked structures 130x-1 may extend in the first direction, may be spaced apart from each other in the second direction based on a structure of the first mask pattern 190x, and may be electrically connected to the first electrode lines 110 disposed in a lower portion. Subsequently, a gap-fill material layer 195 filling gaps between the first line stacked structures 130x-1 and the first mask pattern 190x and covering a top of the first mask pattern 190x may be formed.

Figure 22C:
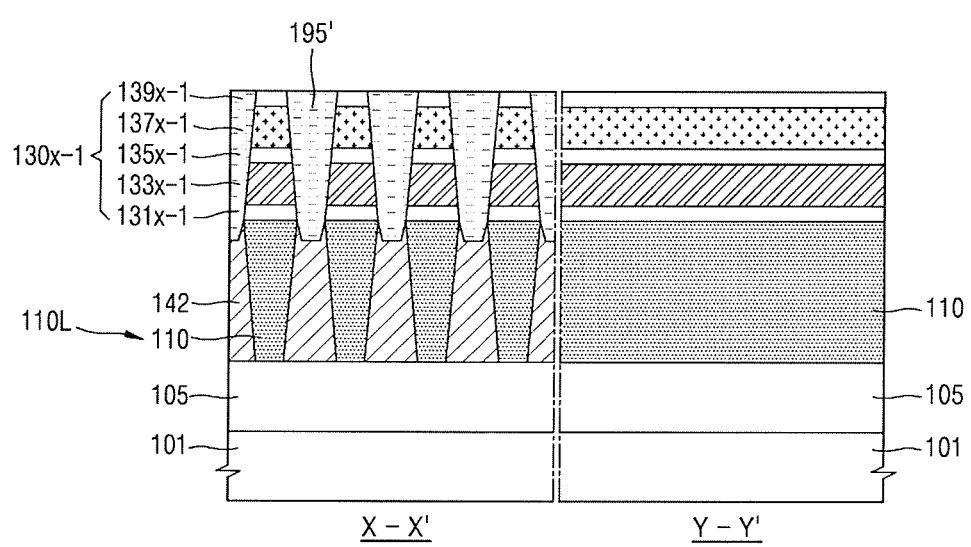

Referring to FIG. 22C, an upper portion of the gap-fill material layer 195 and the first mask pattern 190x may be removed through a planarization process such as CMP. A top of a top electrode material layer 139x-1 may be exposed through the planarization process.

Figure 22D:
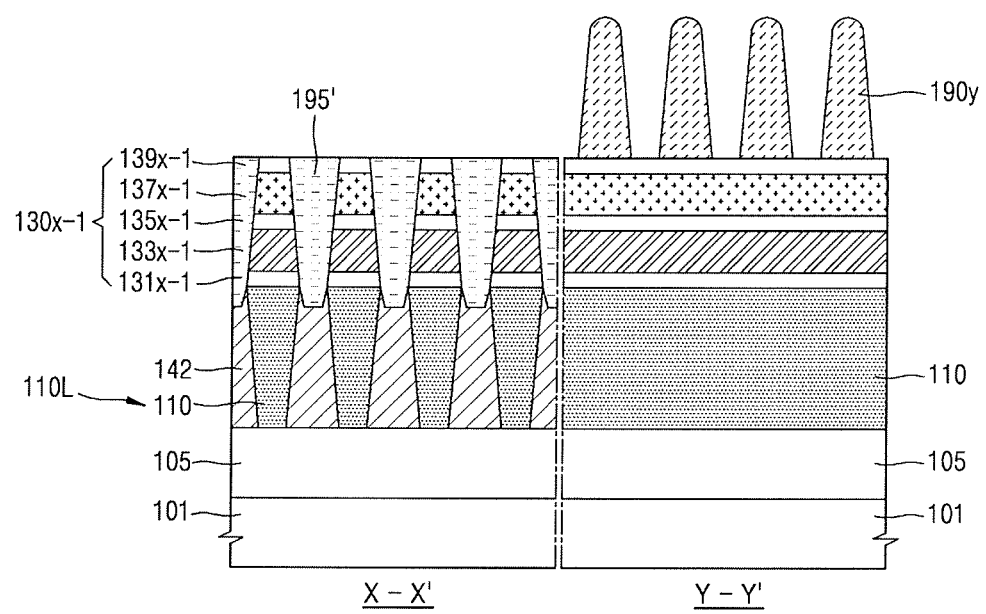

Referring to FIG. 22D, a line-type second mask pattern 190y having line type mask features which extend in the second direction (the Y direction) and are spaced apart from each other in the first direction (the X direction) may be formed on the top of the top electrode material layer 139x-1 and a top of the remaining gap-fill material layer 195'. Subsequently, the remaining gap-fill material layer 195' and the first line stacked structures 130x-1 may be etched by using the second mask pattern 190y to expose a portion of the top of each of the first insulation layer 142 and the first electrode lines 110. Subsequently, by removing the remaining gap-fill material layer 195' and the remaining mask pattern 190y, a plurality of first memory cells (130-1 of FIG. 21D) may be formed. The first memory cells 130-1 may have a structure which is substantially the same as that of the memory cells 130-1 of FIG. 21D.

FIGS. 23A to 23F are cross-sectional views schematically illustrating a process of manufacturing the memory device of FIG. 9, according to an exemplary embodiment of the inventive concept and correspond to the cross-sectional view of FIG. 3. The details described above with reference to FIGS. 21A to 21K will be briefly described or are omitted hereinafter.

Figure 23A:
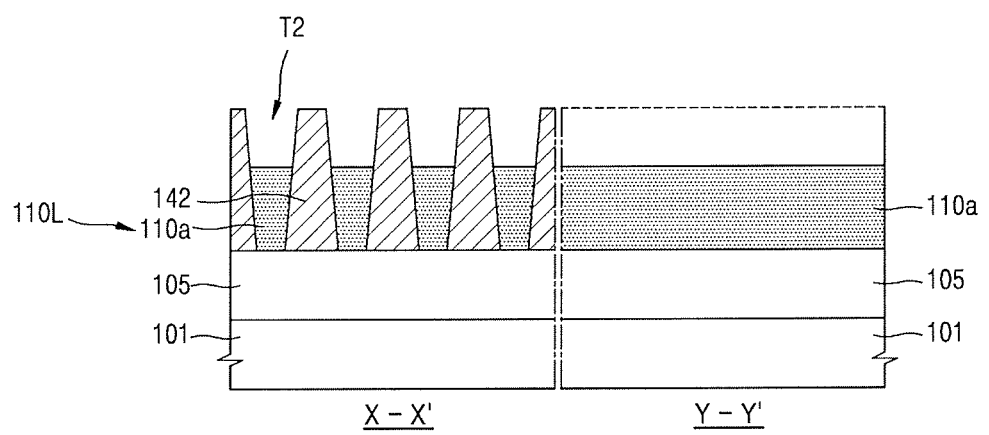
FIGS. 23A to 23F are cross-sectional views schematically illustrating a process of manufacturing the memory device of FIG. 9, according to an exemplary embodiment of the inventive concept and correspond to the cross-sectional view of FIG. 3.

Referring to FIG. 23A, as in FIG. 21A, a first electrode line layer 110L including a plurality of initial first electrode lines 110 which extend in the first direction (the X direction) and are spaced apart from each other may be formed on an interlayer insulation layer 105 of a substrate 101. Subsequently, a plurality of bottom trenches T2 which extend in the first direction may be formed by removing upper portions of the initial first electrode lines 110. The upper portions of the initial first electrode lines 110 may be removed through dry or wet etch-back. A plurality of electrode lines 110a, as illustrated, may be formed by forming the bottom trenches T2. The first electrode lines 110a may be lower in height than the initial first electrode lines 110 by a depth of each of the bottom trenches T2.

Figure 23B:
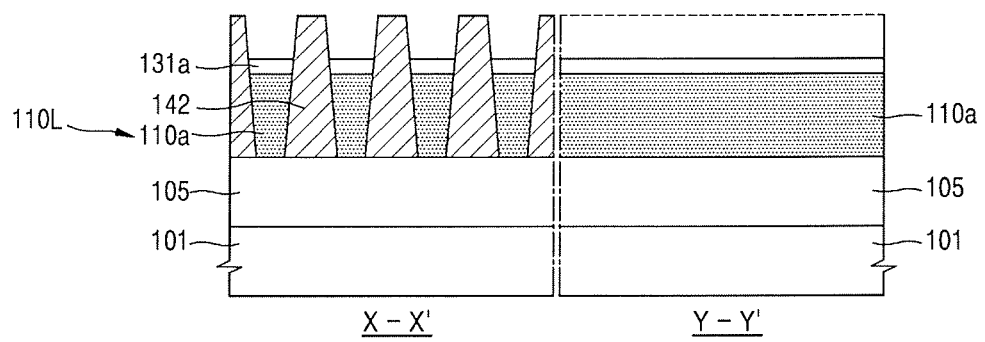

Referring to FIG. 23B, a bottom electrode layer 131a may be formed in each of the bottom trenches T2. In detail, a bottom electrode material layer fully fills the bottom trenches T2 first, and then, the bottom electrode material layer may be left to a certain thickness in only a lower portion of each of the bottom trenches T2 through etch-back, thereby forming the bottom electrode layer 131a.

Figure 23C:
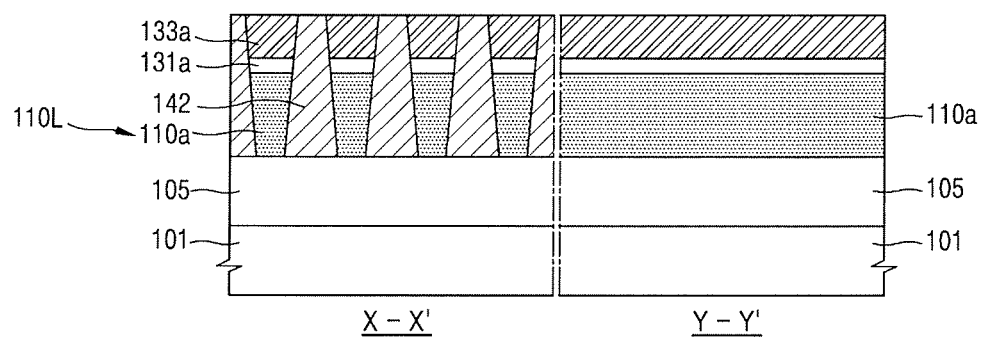

Referring to FIG. 23C, a selection device layer 133a may be formed on the bottom electrode layer 131a in each of the bottom trenches T2. In detail, a selection device material layer may be formed to fully fill each of the bottom trenches T2 in which the bottom electrode layer 131a is formed, and then, by planarizing the selection device material layer through etch-back and/or CMP for a top of the first insulation layer 142 to be exposed, thus the selection device layer 133a may be formed.

Figure 23D:
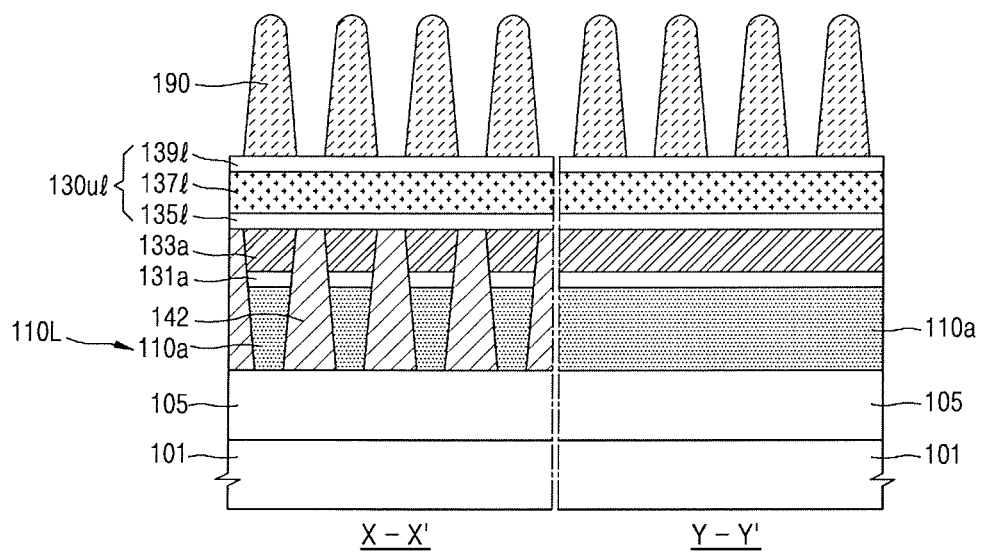

Referring to FIG. 23D, a top stacked structure 130ul including a middle electrode material layer 135l, a variable resistance material layer 137l, and a top electrode material layer 139l which are sequentially stacked may be formed on the selection device layer 133a and the first insulation layer 142. Subsequently, an island-type mask pattern 190 having island type mask features which are spaced apart from each other in the first direction (the X direction) and the second direction (the Y direction) may be formed on the top electrode material layer 139l.

Figure 23E:
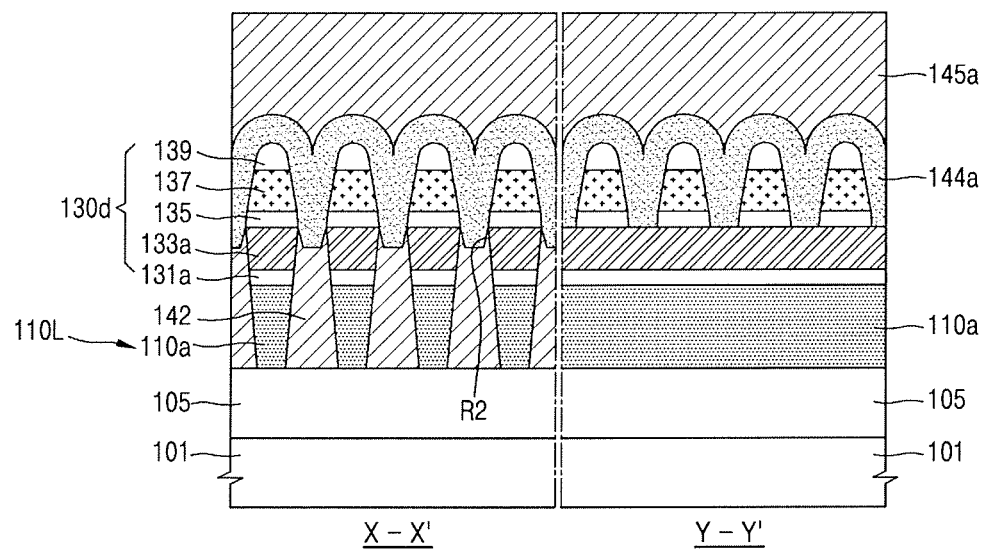

Referring to FIG. 23E, a plurality of memory cells 130d may be formed by etching the top stacked structure 130ul with the mask pattern 190 to expose a portion of a top of each of the first insulation layer 142 and the selection device layer 133a. The memory cells 130 may be spaced apart from each other in the first direction and the second direction based on a structure of the mask pattern 190 and may be electrically connected to the first electrode lines 110 disposed in a lower portion. The memory cells 130d may each include a bottom electrode layer 131a, a selection device layer 133a, a middle electrode layer 135, a variable resistance layer 137, and a top electrode layer 139. A second recess R2 may be formed in the top of the first insulation layer 142. Subsequently, the remaining mask pattern 190 may be removed, a second insulation material layer 144a filling gaps between the memory cells 130d and covering a top of each of the memory cells 130d may be formed, a third insulation material layer 145a may be formed on the second insulation material layer 144a, and a top of the third insulation material layer 145a may be planarized through a planarization process.

Figure 23F:
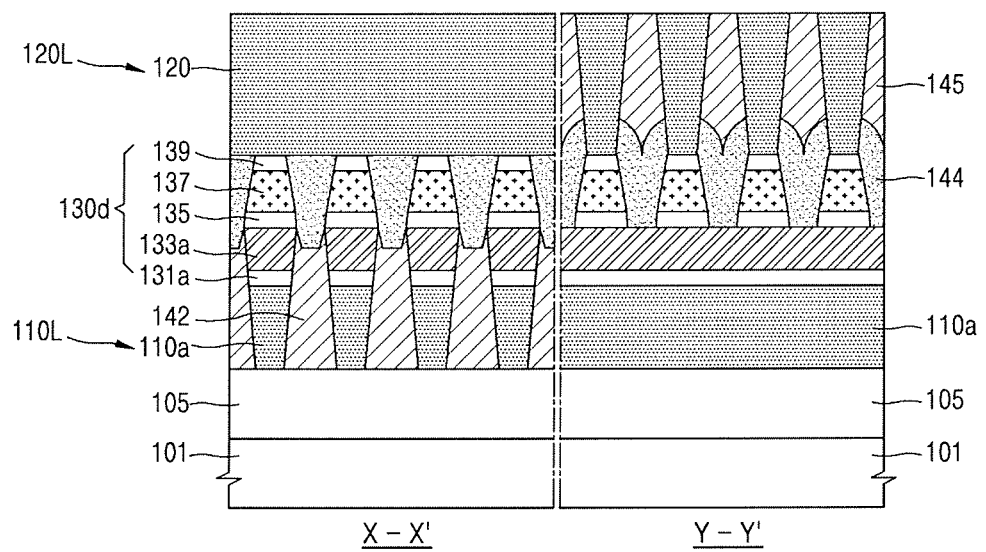

Referring to FIG. 23F, as described above with reference to FIGS. 21F and 21G, a second electrode line layer 120L including a plurality of second electrode lines 120 may be formed through a damascene process. A structure of the memory device 100e of FIG. 9 may be finished by forming the second electrode line layer 120L. Also, by repeating the processes of FIGS. 23A to 23F, a structure of the memory device 200a of FIG. 17A may be finished on the second electrode line layer 120L and a third insulation layer 145.

In the method of manufacturing the memory device 100e according to the present embodiment, since a process of forming the selection device layer 133a and a process of forming the variable resistance layer 137 are separately performed, the selection device layer 133a and the variable resistance layer 137 are prevented from being contaminated or damaged. Also, since memory cells which are etched by using an island-shape mask are lowered in height, a level of difficulty of an etching process is lowered. Also, since the variable resistance layer 137 is formed separately from the selection device layer 133a, a dimension (CD, height) of the variable resistance layer 137 is easily adjusted.

Figure 24A:
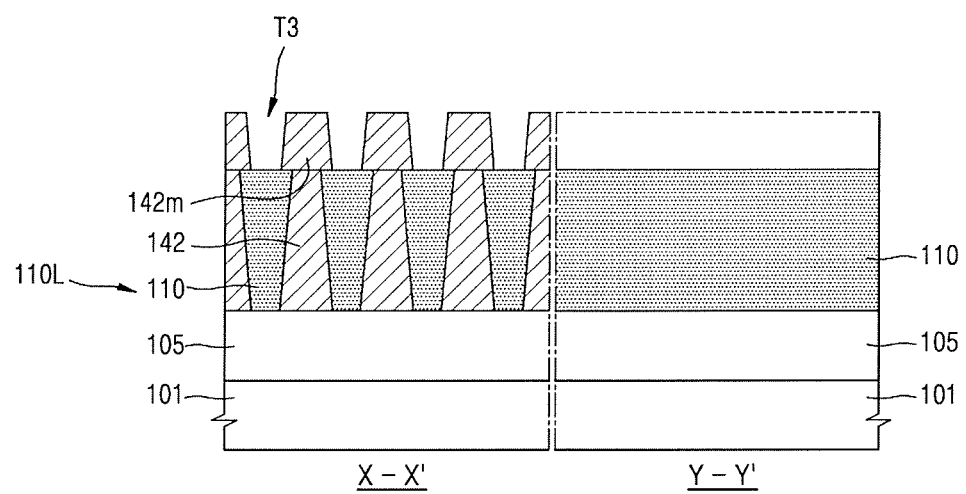
FIGS. 24A to 24C are cross-sectional views schematically illustrating a process of manufacturing the memory device of FIG. 10, according to an exemplary embodiment of the inventive concept and correspond to the cross-sectional view of FIG. 3.
Figure 24B:
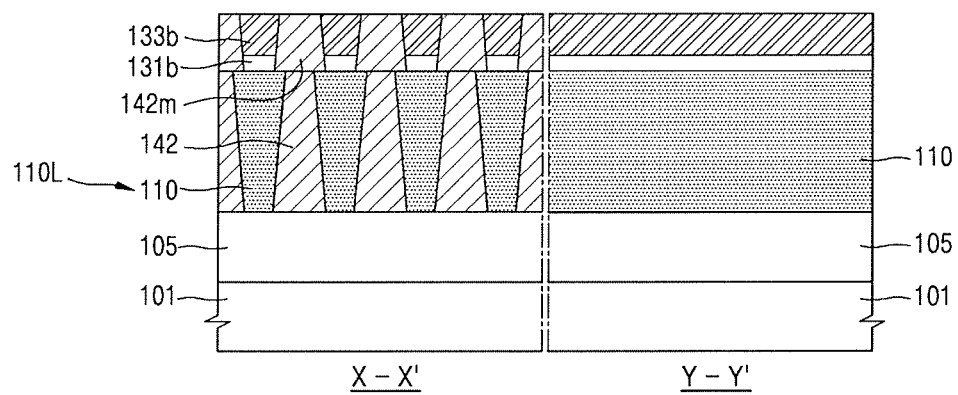
Figure 24C:
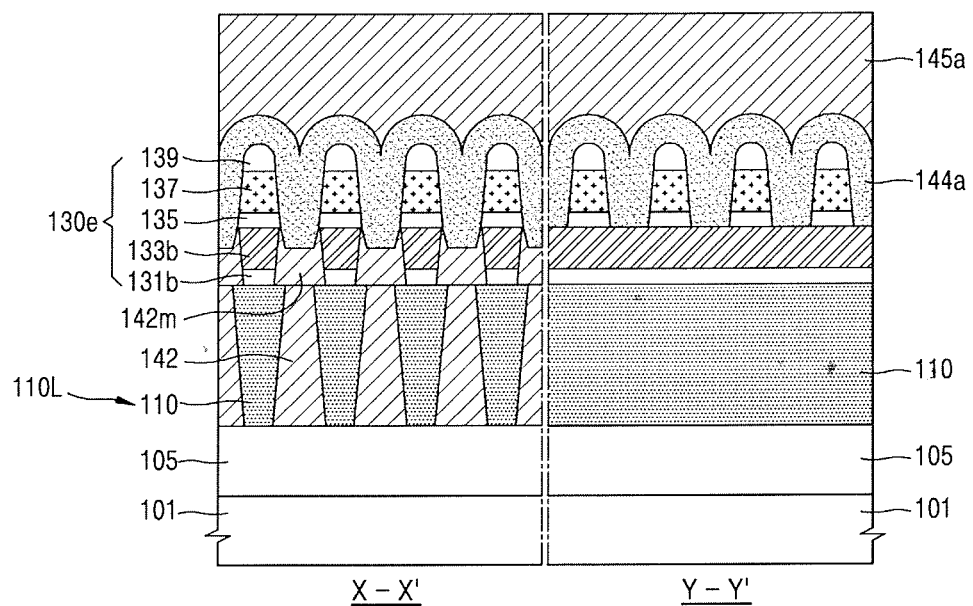

FIGS. 24A to 24C are cross-sectional views schematically illustrating a process of manufacturing the memory device of FIG. 10, according to an exemplary embodiment of the inventive concept and correspond to the cross-sectional view of FIG. 3. The details described above with reference to FIGS. 21A to 21K will be briefly described or are omitted hereinafter.

Referring to FIG. 24A, as in FIG. 21A, a first electrode line layer 110L including a plurality of first electrode lines 110 which extend in the first direction (the X direction) and are spaced apart from each other in the second direction (the Y direction) may be formed on an interlayer insulation layer 105 of a substrate 101. Subsequently, a mold layer may be formed on a first insulation layer 142 and the first electrode line layer 110L, and by etching the mold layer with a line-type mask pattern, a mold insulation layer 142m including a plurality of bottom trenches T3 may be formed. The bottom trenches T3 may extend in the first direction and may be spaced apart from each other in the second direction like the first electrode lines 110 which also extend in the first direction and are spaced apart from each other in the second direction. The bottom trenches T3 may expose tops of the first electrode lines 110.

Referring to FIG. 24B, a bottom electrode layer 131b and a selection device layer 133b may be formed in each of the bottom trenches T3. In detail, first, a bottom electrode material layer fully fills the bottom trenches T3, and then, the bottom electrode material layer may be left to a certain thickness in only a lower portion of each of the bottom trenches T3 through etch-back, thereby forming the bottom electrode layer 131b. Subsequently, a selection device material layer may be formed to fully fill each of the bottom trenches T3 in which the bottom electrode layer 131b is formed, and then, by planarizing the selection device material layer through etch-back and/or CMP for a top of the first insulation layer 142 to be exposed, thus the selection device layer 133b may be formed.

Referring to FIG. 24C, a plurality of memory cells 130e, a second insulation layer 144a, and a third insulation material layer 145a may be formed through the processes of FIGS. 23D to 23E. In detail, a top stacked structure 130ul including a middle electrode material layer 135l, a variable resistance material layer 137l, and a top electrode material layer 139l which are sequentially stacked may be formed on the selection device layer 133b and the first insulation layer 142, and then, an island-type mask pattern 190 may be formed on the top stacked structure 130u1. Subsequently, as illustrated, the plurality of memory cells 130e may be formed by etching the top stacked structure 130ul with the mask pattern 190.

After the memory cells 130e are formed, the remaining mask pattern 190 may be removed, a second insulation material layer 144a filling gaps between the memory cells 130e and covering a top of each of the memory cells 130e may be formed, a third insulation material layer 145a may be formed on the second insulation material layer 144a, and a top of the third insulation material layer 145a may be planarized through a planarization process, thereby forming a structure as illustrated.

As described above with reference to FIG. 23F, a second electrode line layer 120L may be formed through a damascene process, thereby finishing a structure of the memory device 100f of FIG. 10. Also, by repeating the processes of FIGS. 24A to 24C and 23F, a structure of the memory device 200b of FIG. 17B may be finished on the second electrode line layer 120L and a third insulation layer 145. Furthermore, the method manufacturing the memory device 100f according to the present embodiment provides effects which are approximately the same as those of the method of manufacturing the memory device 100f illustrated in FIG. 10.

Figure 25:
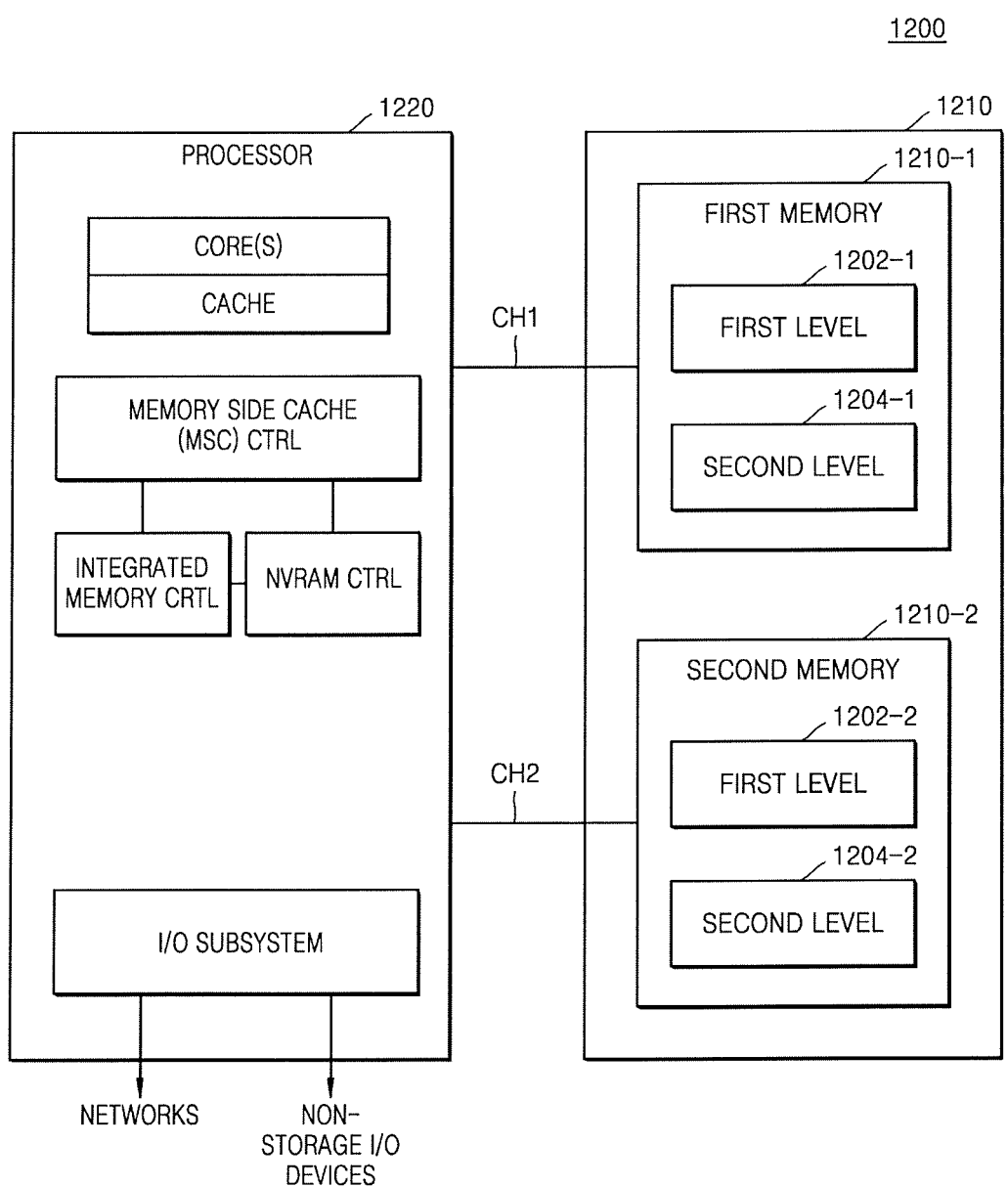
FIG. 25 is block diagram of a computer system according to an exemplary embodiment of the inventive concept.

FIG. 25 is block diagram of a computer system according to an exemplary embodiment of the inventive concept.

Referring to FIG. 25, a computer system 1200 may include a processor 1220 and a memory system 1210. The processor 1220 may include a plurality of cores, which execute commands and process data, and one or more processor caches for storing the commands and the data. Also, the processor 1220 may include a memory controller for controlling memories of the memory system 1210 and a cache. For example, the processor 1220 may include a memory side cache (MSC) controller, a nonvolatile RAM controller, and an integrated memory controller. Also, the processor 1220 may include an I/O subsystem, and in this case, the processor 1220 may communicate with an external network and/or non-storage I/O devices through the I/O subsystem.

The memory system 1210 may include a first memory device 1210-1 and a second memory device 1210-2. The first memory device 1210-1 and the second memory device 1210-2 may be distinguished depending on which channels are used to connect them to the processor 1220. The first memory device 1210-1 may be connected to the processor 1220 through a first channel CH1. The first memory device 1210-1 may internally include two kinds of memories. For example, the first memory device 1210-1 may include a first level memory 1202-1 and a second level memory 1204-1. The first level memory 1202-1 may have a first operation speed, for example, a first read access speed and a first write access speed. The second level memory 1204-1 may have a second operation speed, for example, a second read access speed and a second write access speed. Here, the first operation speed may be faster than the second operation speed. The first level memory 1202-1 which is relatively faster in operation may be used as a cache for temporarily storing commands or data to be stored in the second level memory 1204-1.

The second memory device 1210-2 may be connected to the processor 1220 through a second channel CH2. Also, the second memory device 1210-2 may internally include two kinds of memories. For example, the second memory device 1210-2 may include a first level memory 1202-2 and a second level memory 1204-2. The first level memory 1202-2 may have the first operation speed, and the second level memory 1204-2 may have the second operation speed. Even in the second memory device 1210-2, the first level memory 1202-2 which is relatively faster in operation may be used as a cache for temporarily storing commands or data to be stored in the second level memory 1204-2.

The first level memories 1202-1 and 1202-2 may each include, for example, a DRAM. Also, the second level memories 1204-1 and 1204-2 may each include, for example, a nonvolatile RAM. Here, examples of the nonvolatile RAM may include a phase-change random access memory (PRAM), a resistive random access memory (ReRAM), a magnetoresistive random access memory (MRAM), etc. Also, the nonvolatile RAM may include at least one of the memory device 100 illustrated in FIGS. 1 to 3, the memory devices 100a to 100k illustrated in FIGS. 5 to 14B, the memory devices 200, 200a and 200b illustrated in FIGS. 15 to 17B, and the memory device 1000 illustrated in FIGS. 18 and 19.

As described above, in the memory device and the method of manufacturing the same according to the exemplary embodiments of the inventive concept, since memory cells are formed separately from first electrode lines and second electrode lines, problems which occur when the memory cells are formed along with the first electrode lines and the second electrode lines are solved. Also, since the second electrode lines are formed by a damascene process, which does not include applying a CMP process on the insulation layer disposed on the memory cells, a problem which occurs when CMP is excessively performed or insufficiently performed on the insulation layer over the memory cells is solved.

While the inventive concept has been particularly shown and described with reference to the exemplary embodiments of the inventive concept thereof, it will be understood that various changes in form and details may be made therein without departing from the spirit and scope of the following claims.

What is claimed is:

1. A semiconductor device comprising:
 a first electrode line layer disposed over a substrate, the first electrode line layer including a plurality of first electrode lines that extend in a first direction and are spaced apart from each other;
 a second electrode line layer disposed over the first electrode line layer, the second electrode line layer including a plurality of second electrode lines that extend in a second direction different from the first direction and are spaced apart from each other; and
 a first memory cell layer including a plurality of first memory cells respectively disposed in portions located between the first electrode line layer and the second electrode line layer, and where the plurality of first electrode lines and the plurality of second electrode lines intersect, wherein the plurality of first memory cells each comprises a selection device layer, a middle electrode layer, and a variable resistance layer which are stacked in an up or down direction,
 a first insulation layer extending in the first direction is disposed between adjacent first electrode lines, a second insulation layer is disposed between adjacent first memory cells, and a third insulation layer extending in the second direction is disposed between adjacent second electrode lines,
 a top of the second insulation layer comprises a recessed portion between adjacent second electrode lines, and
 each of the plurality of second electrode lines is widened progressively from a lower portion to an upper portion, and
 the second insulation layer covers lower portions of both side surfaces of each of the plurality of second electrode lines.

2. The semiconductor device of claim 1, wherein
 a top of each of the plurality of first electrode lines comprises a first recess between each two adjacent first memory cells of the plurality of first memory cells disposed along the first direction,
 a top of the first insulation layer comprises a second recess between each two adjacent first memory cells of the plurality of first memory cells disposed along the second direction, and
 the second insulation layer fills the first recess and the second recess.

3. The semiconductor device of claim 1, wherein
 the plurality of memory cells each comprises a second electrode layer contacting a corresponding second electrode line,
 at least one of the middle electrode layer and the second electrode layer comprises a heating unit contacting the variable resistance layer, and
 the heating unit comprises a carbon-based conductive material.

4. The semiconductor device of claim 1, further comprising:
 a third electrode line layer disposed over the second electrode line layer, the third electrode line layer including a plurality of third electrode lines; and
 a second memory cell layer including a plurality of second memory cells respectively disposed in portions located between the second electrode line layer and the third electrode line layer, and where the plurality of second electrode lines and the plurality of third electrode lines intersect,
 wherein each of the plurality of third electrode lines is widened progressively from a lower portion to an upper portion.

5. The semiconductor device of claim 4, further comprising:
 at least one first top electrode line layer disposed over the third electrode line layer, the at least one first top electrode line layer including a plurality of first top electrode lines;
 at least one second top electrode line layer disposed over the first top electrode line layer corresponding thereto, the at least one second top electrode line layer including a plurality of second top electrode lines; and
 at least two top memory cell layers each including a plurality of memory cells respectively disposed in portions located between one of the at least one first top electrode line layer and an immediately adjacent one of the at least one second top electrode line layer, and where the plurality of first top electrode lines and the plurality of second top electrode lines intersect.

6. The semiconductor device of claim 1, wherein the variable resistance layer comprises at least one of GeSbTe, InSbTe, and BiSbTe, or comprises a super-lattice structure including GeTe and SbTe which are alternately stacked.

7. The semiconductor device of claim 1, wherein the selection device layer comprises one of an ovonic threshold switching (OTS) device, a diode, and a transistor.

8. The semiconductor device of claim 1, wherein
the selection device layer comprises an ovonic threshold switching (OTS) device, and
the OTS device comprises at least two of silicon (Si), germanium (Ge), antimony (Sb), selenium (Se), arsenic (As), indium (In), and tin (Sn), and is based on tellurium (Te) as major component,
the OTS device comprises at least two of silicon (Si), germanium (Ge), antimony (Sb), tellurium (Te), selenium (Se), indium (In), and tin (Sn), and is based on arsenic (As) as major component, or
the OTS device comprises at least two of silicon (Si), germanium (Ge), antimony (Sb), tellurium (Te), arsenic (As), indium (In), and tin (Sn), and is based on selenium (Se) as major component.

9. The semiconductor device of claim 1, further comprising: an integrated circuit layer over the substrate and under the first electrode line layer.

10. A semiconductor device comprising:
a first electrode line layer disposed over a substrate, the first electrode line layer including a plurality of first electrode lines that extend in a first direction and are spaced apart from each other;
a second electrode line layer disposed over the first electrode line layer, the second electrode line layer including a plurality of second electrode lines that extend in a second direction different from the first direction and are spaced apart from each other; and
a first memory cell layer including a plurality of first memory cells respectively disposed in portions located between the first electrode line layer and the second electrode line layer, and where the plurality of first electrode lines and the plurality of second electrode lines intersect,
wherein the plurality of first memory cells each comprises a selection device layer, a middle electrode layer, and a variable resistance layer which are stacked in an up or down direction, one of the selection device layer and the variable resistance layer is widened progressively from a lower portion to an upper portion,
a cell insulation layer dividing unit memory cells is disposed between adjacent first memory cells, and a top insulation layer extending in the second direction is disposed between adjacent second electrode lines,
a top of the cell insulation layer comprises a recessed portion between the adjacent second electrode lines, and
each of the plurality of second electrode lines is widened progressively from a lower portion to an upper portion, and
the cell insulation layer covers lower portions of both side surfaces of each of the plurality of second electrode lines.

11. The semiconductor device of claim 10, wherein
a bottom insulation layer extending in the first direction is disposed between adjacent first electrode lines, each of the plurality of first electrode lines has a structure which is recessed with respect to a top of the bottom insulation layer, and
the selection device layer is widened progressively from a lower portion to an upper portion, and is disposed between adjacent bottom insulation layers.

12. The semiconductor device of claim 10, wherein
a bottom insulation layer extending in the first direction is disposed between adjacent first electrode lines,
a mold insulation layer is disposed over the bottom insulation layer, and
one of the selection device layer and the variable resistance layer is disposed between adjacent mold insulation layers.

13. The semiconductor device of claim 12, wherein the selection device layer is widened progressively from a lower portion to an upper portion, and has a structure extending in the first direction or a structure divided for each of a plurality of unit memory cells.

14. The semiconductor device of claim 12, wherein the variable resistance layer is widened progressively from a lower portion to an upper portion, and has a structure divided for each of a plurality of unit memory cells.

15. The semiconductor device of claim 10, wherein
the plurality of first memory cells each comprise a first electrode layer contacting a corresponding first electrode line, and
the first electrode layer has a structure extending in the first direction or a structure divided for each of a plurality of unit memory cells.

16. The semiconductor device of claim 10, further comprising:
at least one first top electrode line layer disposed over the second electrode line layer, the at least one first top electrode line layer including a plurality of first top electrode lines;
at least one second top electrode line layer disposed over the first top electrode line layer corresponding thereto, the at least one second top electrode line layer including a plurality of second top electrode lines; and
at least two top memory cell layers each including a plurality of memory cells respectively disposed in portions located between one of the at least one first top electrode line layer and an immediately adjacent one of the at least one second top electrode line layer, and where the plurality of first top electrode lines and the plurality of second top electrode lines intersect.

17. A semiconductor device comprising:
a first electrode line layer provided on a substrate, the first electrode line layer comprising a plurality of first electrode lines which extend in a first direction and are spaced apart from each other;
a second electrode line layer provided on the first electrode line layer, the second electrode line layer comprising a plurality of second electrode lines which extend in a second direction different from the first direction and are spaced apart from each other;
a third electrode line layer provided on the second electrode line layer, the third electrode line layer comprising a plurality of third electrode lines which extend in the first direction and are spaced apart from each other;
a first memory cell layer including a plurality of first memory cells respectively disposed in portions located between the first electrode line layer and the second electrode line layer, and where the plurality of first electrode lines and the plurality of second electrode lines intersect; and a second memory cell layer including a plurality of second memory cells respectively disposed in portions located between the second electrode line layer and the third electrode line layer, and where the plurality of second electrode lines and the plurality of third electrode lines intersect, wherein a width of an upper portion is larger than a width of a lower portion for each of the plurality of second electrode lines and each of the plurality of third electrode lines, respectively.

18. The semiconductor device of claim 17, further comprising:

a first insulation layer extending in the first direction and disposed between adjacent first electrode lines;

a second insulation layer disposed between adjacent first memory cells;

a third insulation layer extending in the second direction and disposed between adjacent second electrode lines;

a fourth insulation layer disposed between adjacent second memory cells; and a fifth insulation layer extending in the first direction and disposed between adjacent third electrode lines, wherein the second insulation layer covers lower portions of both side surfaces of each of the plurality of second electrode lines, and the fourth insulation layer covers lower portions of both side surfaces of each of the plurality of third electrode lines.

19. The semiconductor device of claim 17, wherein each of the plurality of first and second memory cells comprises a selection device layer, a middle electrode layer, and a variable resistance layer stacked in an upward or downward direction, and wherein at least one of the selection device layer and the variable resistance layer is narrowed progressively from a lower portion to an upper portion.

* * * * *